US010681301B2

(12) United States Patent
Kodama

(10) Patent No.: US 10,681,301 B2
(45) Date of Patent: Jun. 9, 2020

(54) DISPLAY DEVICE

(71) Applicant: Funai Electric Co., Ltd., Daito, Osaka (JP)

(72) Inventor: Shinichi Kodama, Osaka (JP)

(73) Assignee: FUNAI ELECTRIC CO., LTD., Osaka (JP)

(*) Notice: Subject to any disclaimer, the term of this patent is extended or adjusted under 35 U.S.C. 154(b) by 0 days.

(21) Appl. No.: 16/239,987

(22) Filed: Jan. 4, 2019

(65) Prior Publication Data

US 2019/0141277 A1 May 9, 2019

Related U.S. Application Data

(63) Continuation of application No. 15/690,981, filed on Aug. 30, 2017, now Pat. No. 10,389,966.

(30) Foreign Application Priority Data

Sep. 2, 2016 (JP) ................... 2016-171954
Sep. 2, 2016 (JP) ................... 2016-171958

(51) Int. Cl.
*H04N 5/50* (2006.01)
*H04B 15/06* (2006.01)
(Continued)

(52) U.S. Cl.
CPC ............... *H04N 5/50* (2013.01); *H04B 15/06* (2013.01); *H04N 5/655* (2013.01); *H05K 9/006* (2013.01); *H03L 7/099* (2013.01)

(58) Field of Classification Search
CPC .......... H04N 5/50; H04N 5/655; H04B 15/06; H05K 9/006; H03L 7/099
(Continued)

(56) References Cited

U.S. PATENT DOCUMENTS 4,152,671 A  5/1979 Tuma et al.
9,985,353 B1  5/2018 Pajona et al.

FOREIGN PATENT DOCUMENTS

CN  102696285 A  9/2012
EP  2521271 A1  11/2012
(Continued)

OTHER PUBLICATIONS

The European search report of the European application No. 19150819. 1, dated Apr. 30, 2019.
(Continued)

*Primary Examiner* — Robert J Pascal
*Assistant Examiner* — Kimberly E Glenn
(74) *Attorney, Agent, or Firm* — Global IP Counselors, LLP

(57) ABSTRACT

A display device includes a signal processor, a display component, a substrate, and a conductive housing. The signal processor includes an oscillator that outputs oscillation signal, the signal processor processing signal whose frequency is higher than a specific threshold. The display component displays video. The substrate has a ground component, the signal processor being disposed on the substrate. The conductive housing is connected to a first site of the ground component and to a second site that is different from the first site. The first site and the second site are disposed at positions where a first area of the housing that is an odd-numbered multiple of ¼ wavelength of the oscillation signal away from the first site overlaps at least part of a second area of the housing that is a multiple of ¼ wavelength of the oscillation signal away from the second site.

19 Claims, 42 Drawing Sheets

(51) Int. Cl.
   *H05K 9/00* (2006.01)
   *H04N 5/655* (2006.01)
   *H03L 7/099* (2006.01)

(58) Field of Classification Search
   USPC .......................................................... 333/12
   See application file for complete search history.

(56) References Cited

FOREIGN PATENT DOCUMENTS

| JP | 2007-299099 A | 11/2007 |
|----|---------------|---------|
| JP | 2015-109551 A | 6/2015 |
| WO | 2015/105593 A1 | 7/2015 |
| WO | 2015/119151 A1 | 8/2015 |

OTHER PUBLICATIONS

Extended European Search Report of the corresponding European Application No. 17188908.2, dated Nov. 20, 2017.

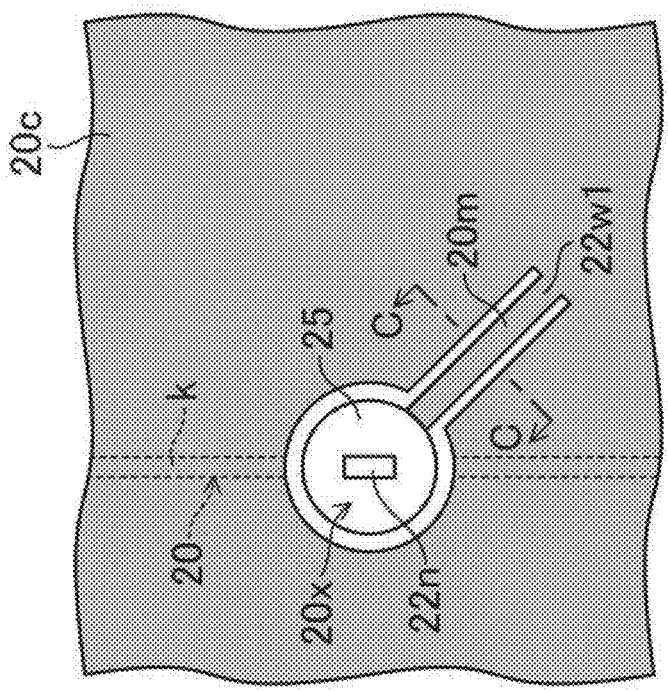
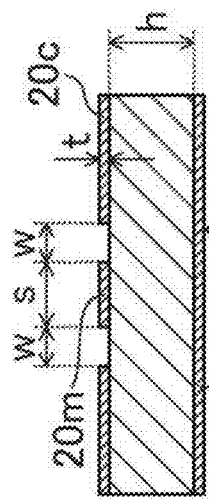
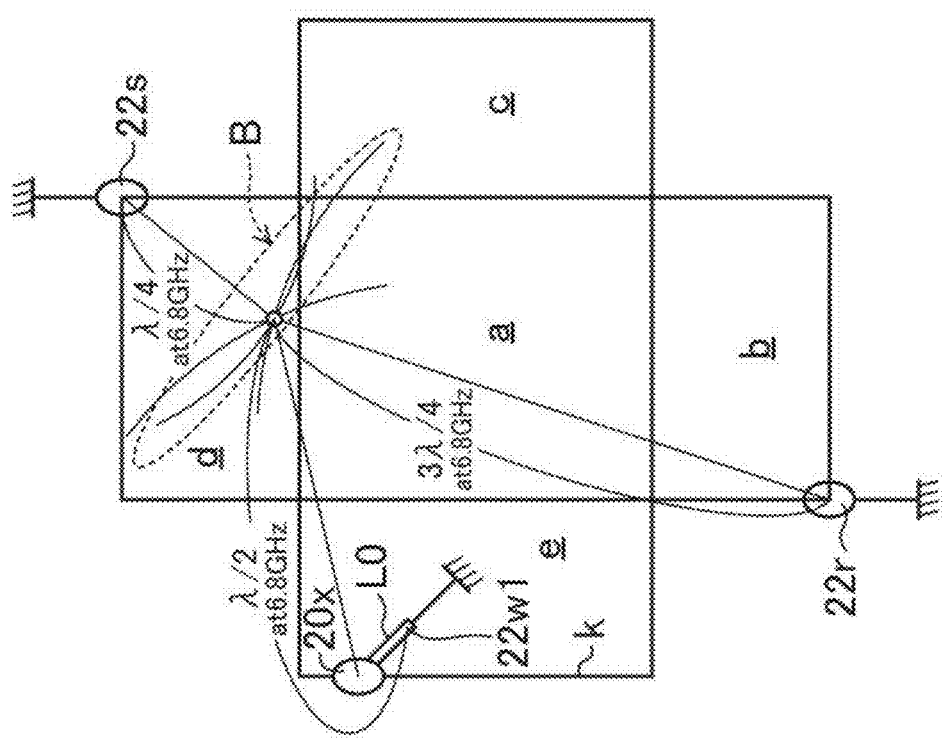
FIG. 20A
FIG. 20B
FIG. 20C

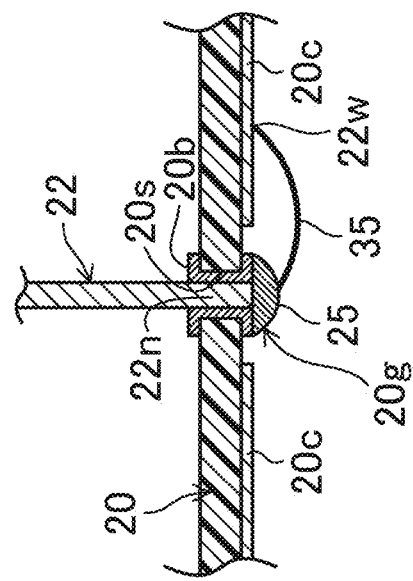
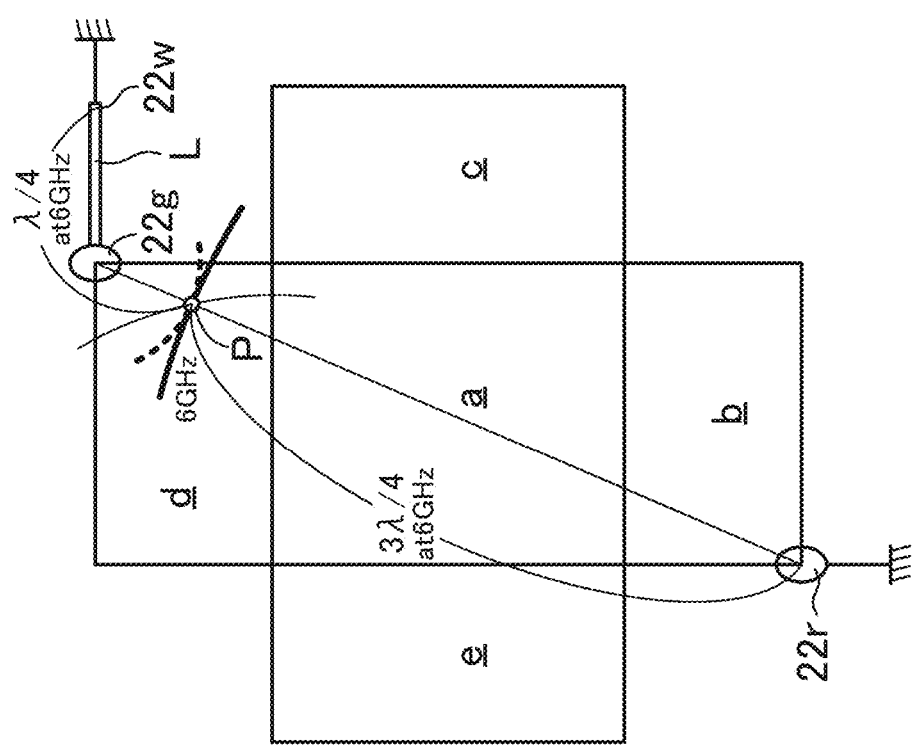
FIG. 31A
FIG. 31B

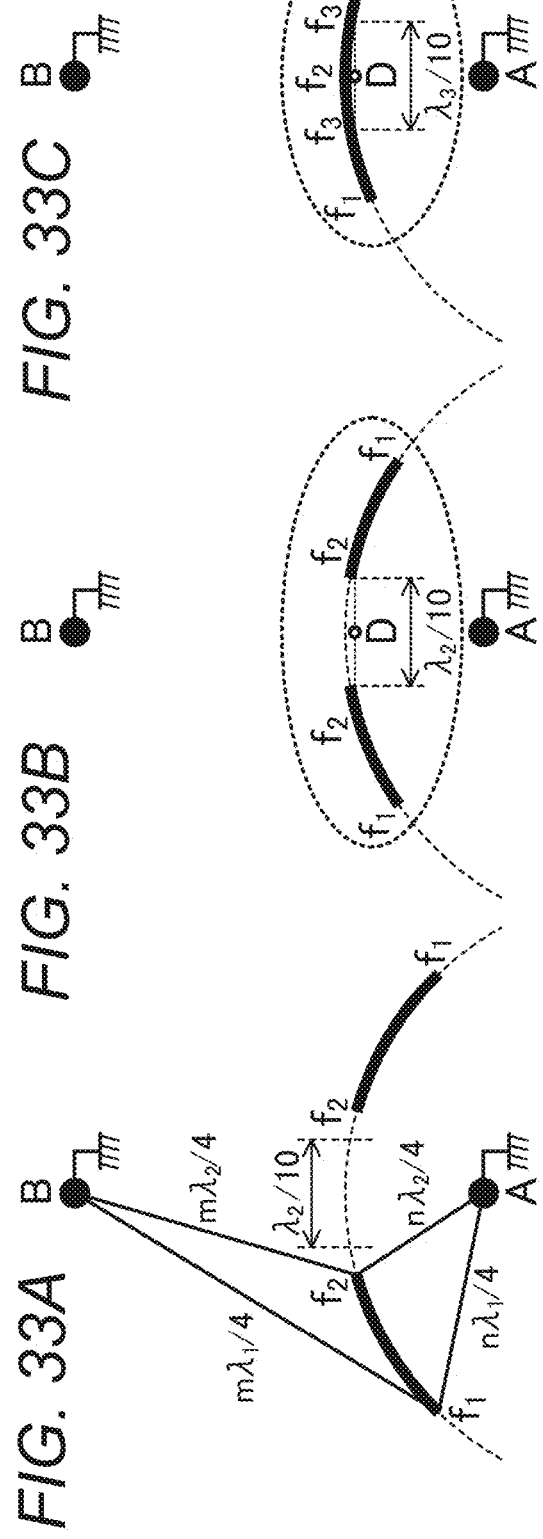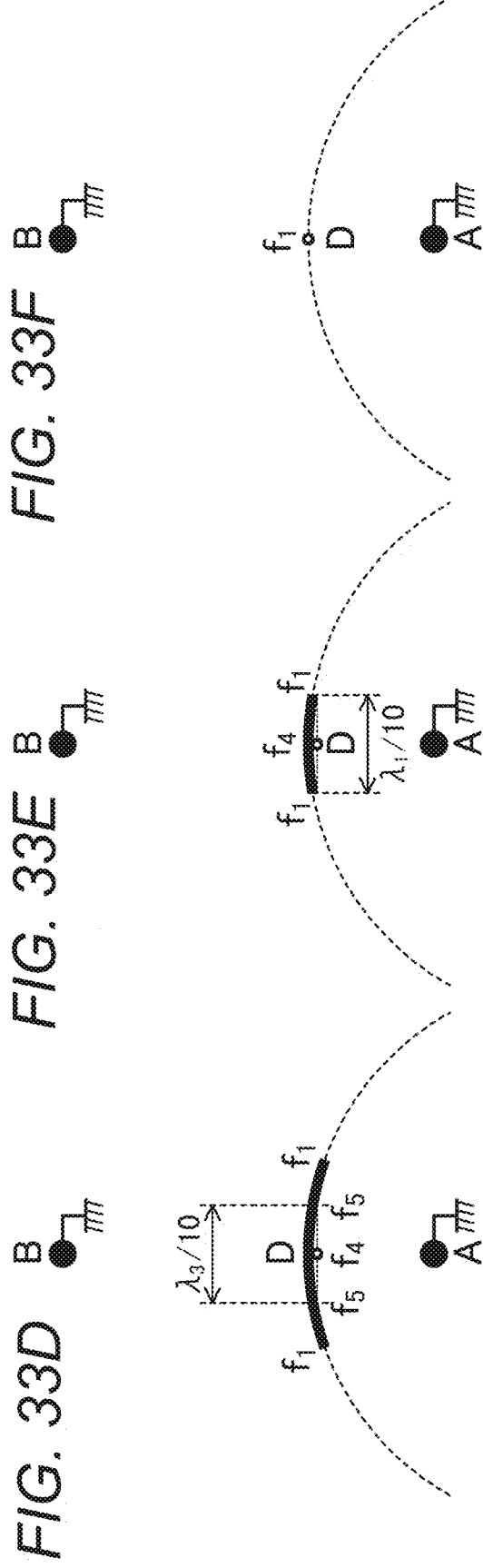

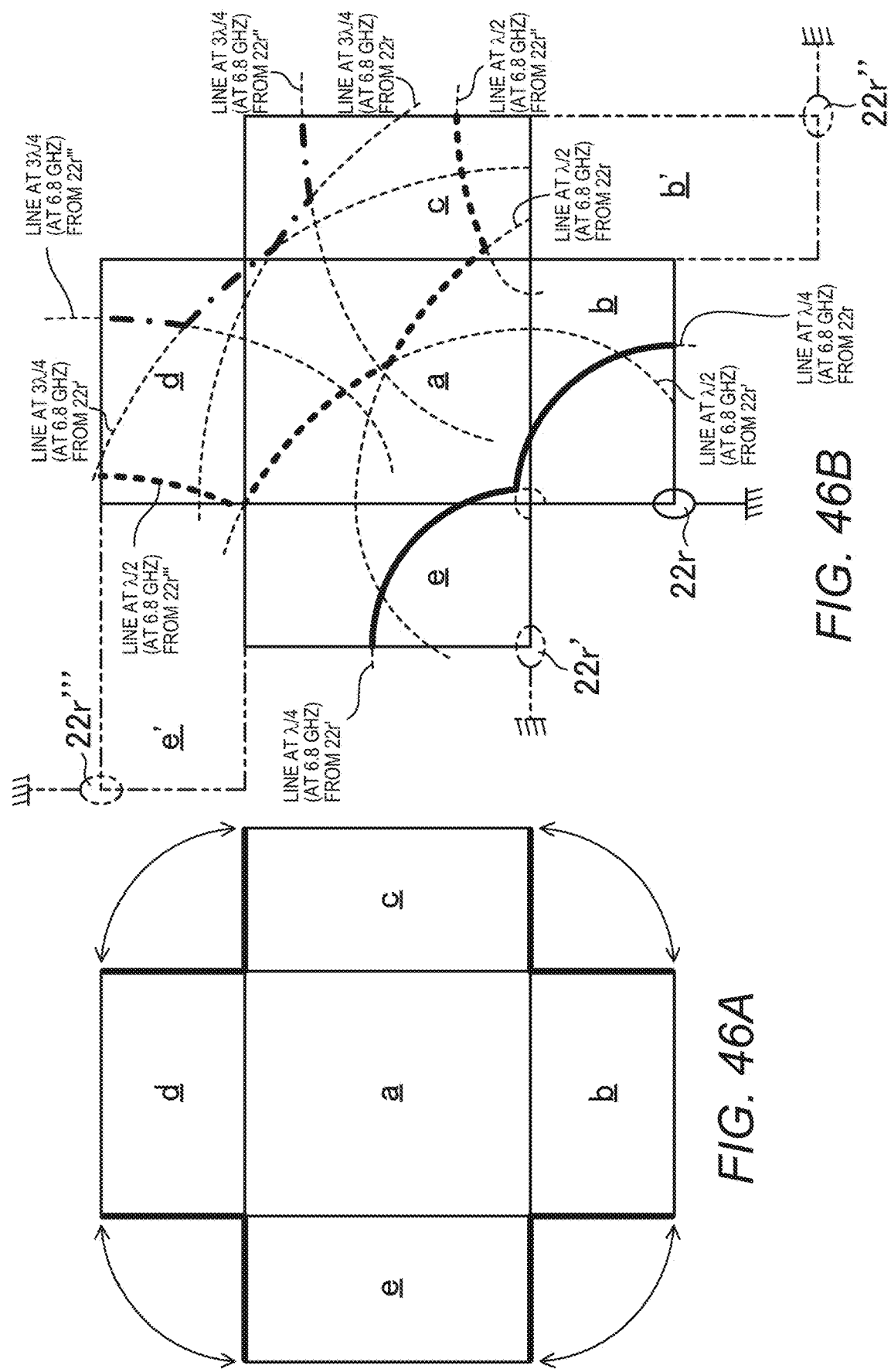

DISPLAY DEVICE

CROSS-REFERENCE TO RELATED APPLICATIONS

This is a continuation application of U.S. patent application Ser. No. 15/690,981 filed on Aug. 30, 2017, which claims priority to Japanese Patent Application Nos. 2016-171954 filed on Sep. 2, 2016 and 2016-171958 filed on Sep. 2, 2016. The entire disclosures of U.S. patent application Ser. No. 15/690,981 and Japanese Patent Application Nos. 2016-171954 and 2016-171958 are hereby incorporated herein by reference.

BACKGROUND

Field of the Invention

The present invention relates to a display device comprising a tuner device that receives television broadcasts, etc., and more particularly relates to a technique for reducing unnecessary radiation (EMI: electromagnetic interference) from a metal housing of the tuner device.

Background Information

Japanese Laid-Open Patent Application Publication No. 2015-109551 (Patent Literature 1) discloses a conventional tuner in a display device that reduces unnecessary radiation, which employs a configuration in which the length, width, depth, and diagonal (the linear distance between two vertices that are the farthest apart) dimensions of a shield case (metal housing) that houses a tuner IC are all set to be shorter than the half wavelength of the highest frequency out of the source oscillation frequencies of the oscillator of the housed tuner IC.

International Publication No. WO 2015/119151 A1 (Patent Literature 2) discloses a configuration in which the ground of a circuit board is connected by a plurality of conductor posts to the center part of the upper face of a conductor shield (housing) in which electronic parts are sealed and the distance between the conductor posts is equal to or smaller than ¼ the wavelength of the highest frequency used, so as to reduce unnecessary radiation attributable to resonance of the conductor shield.

Japanese Laid-Open Patent Application Publication No. 2007-299099 (Patent Literature 3) discloses a configuration in which conductive posts (grounding posts) that connect a metal housing to a printed board are disposed evenly in the interior of the housing, or as evenly as possible along the ends of the housing, and the spacing of these grounding posts is set to be no more than one-fourth the wavelength of electromagnetic waves corresponding to a frequency that is not apt to generate EMI.

SUMMARY

However, although the tuner ICs installed in tuner devices today have become smaller and more integrated, there is a limit to how small the capacitors and inductors housed in a metal housing can be made, so there is also a limit to the size of the metal housing in the length, width, depth, diagonal, and other such dimensions. Meanwhile, as the capacitors and so forth built into an IC become smaller, a high oscillation frequency, such as from a few gigahertz to a few dozen gigahertz, is used for the voltage control oscillator (VCO) housed in the metal housing, and because of this, the half value of the wavelength $\lambda$ ($\lambda/2$) of the signal with the highest oscillation frequency is extremely low. Accordingly, even though the technique in the above-mentioned Patent Literature 1 is to set the length, width, depth, and diagonal dimensions of the metal housing to be no more than half the wavelength of the signal with the highest oscillation frequency ($\lambda/2$), in actual practice this is quite difficult, and as a result, a range or site occurs in which the impedance is high in the metal housing, and a large amount of unnecessary radiation is produced from this range or site.

Furthermore, with the technique in Patent Literature 1, even if we assume that the diagonal size of the housing (the linear distance between two vertices that are the farthest apart), such as the linear distance between the upper-left corner of the front face of a tetragonal housing and the upper-right corner of the rear face that is opposite this front face, can be set to no more than half the wavelength ($\lambda/2$) of the signal with the highest oscillation frequency of the VCO, if the lower-left corner of the front face of the housing and the lower-right corner of the rear face are grounded, the conductor shield will resonate in a size that is the total of the diagonal length of the upper face of the tetragonal housing and two times the height of this housing, so this total size greatly exceeds half the wavelength of the signal with the highest oscillation frequency ($\lambda/2$), and once again a large amount of unnecessary radiation ends up being produced.

Also, with the technique in the above-mentioned Patent Literature 2 and the technique in the above-mentioned Patent Literature 3, since grounding posts are disposed as evenly as possible along the end or in the interior of the housing, the large number of grounding posts is a drawback in that the configuration is more complicated and the cost is higher.

One object of the present disclosure is to reduce the number of grounding sites while being able to achieve low impedance everywhere on a housing, and effectively reduce unnecessary radiation, even if the length, width, and other such dimensions of the housing are greater than the half wavelength of the highest oscillation frequency of the oscillator ($\lambda/2$), in a tuner device of a display device in which a housing that houses an oscillator in its interior is disposed on a substrate.

To achieve the stated object, with the present disclosure, since unnecessary radiation naturally occurs at places of high impedance on the housing, using the grounded sites of the housing as the reference impedance, unnecessary radiation is reduced by providing grounding sites that forcibly lower the impedance at these housing sites where the impedance is high.

In view of the state of the known technology and in accordance with an aspect of the present invention, a display device includes a signal processor, a display component, a substrate, and a conductive housing. The signal processor includes an oscillator that outputs oscillation signal, the signal processor processing signal whose frequency is higher than a specific threshold. The display component displays video. The substrate has a ground component, the signal processor being disposed on the substrate. The conductive housing is connected to a first site of the ground component and to a second site that is different from the first site. The first site and the second site are disposed at positions where a first area of the housing that is an odd-numbered multiple of ¼ wavelength of the oscillation signal away from the first site overlaps at least part of a second area of the housing that is a multiple of ¼ wavelength of the oscillation signal away from the second site.

BRIEF DESCRIPTION OF THE DRAWINGS

Referring now to the attached drawings which form a part of this original disclosure:

FIGS. 20A, 20B and 20C show a modification example of the third embodiment, with FIG. 20A being a diagram in which a second grounding site provided to the housing is disposed in a region of the main board located under the housing, FIG. 20B a diagram of the configuration around the second grounding site, and FIG. 20C a cross section along the C-C line of the wiring pattern in FIG. 20B;

FIG. 31A shows a configuration in which the left corner of the front face of the housing is grounded, the right corner of the rear face is grounded with a line at a distance, and the high impedance range that occurs in the housing is narrowed to a single point, and FIG. 31B shows a specific example of a configuration in which the right corner of the rear face is grounded to a grounding pattern on the main board via an extension line;

FIGS. 33A, 33B, 33C, 33D, 33E and 33F show the variation in the distribution of the high impedance range that occurs when the oscillation frequency is in a range of f1≤f≤f2, with FIG. 33A showing the situation when the spacing between two high impedance points at the highest frequency f2 is greater than 1/10 the wavelength at that frequency, FIG. 33B when the spacing between these two high impedance points is no more than 1/10 the wavelength at that frequency, FIG. 33C when the points of high impedance at the highest frequency f2 overlap in a single point, FIG. 33D when the points of high impedance at a frequency f4 that is lower than the highest frequency f2 overlap in a single point, FIG. 33E when the spacing between two high impedance points at the lowest frequency f1 is no more than 1/10 the wavelength at that frequency, and FIG. 33F when only one point remains at which the impedance is high at the lowest frequency f1;

FIG. 46A is a developed view of the housing when there is a strong electrical connection between the side faces of the housing, and FIG. 46B illustrates when signal propagation between the side faces of the housing is also considered, when there is a strong electrical connection between the side faces of the housing.

DETAILED DESCRIPTION OF EMBODIMENTS

Selected embodiments will now be explained with reference to the drawings. It will be apparent to those skilled in the art from this disclosure that the following descriptions of the embodiments are provided for illustration only and not for the purpose of limiting the invention as defined by the appended claims and their equivalents.

First Embodiment

Figure 1:
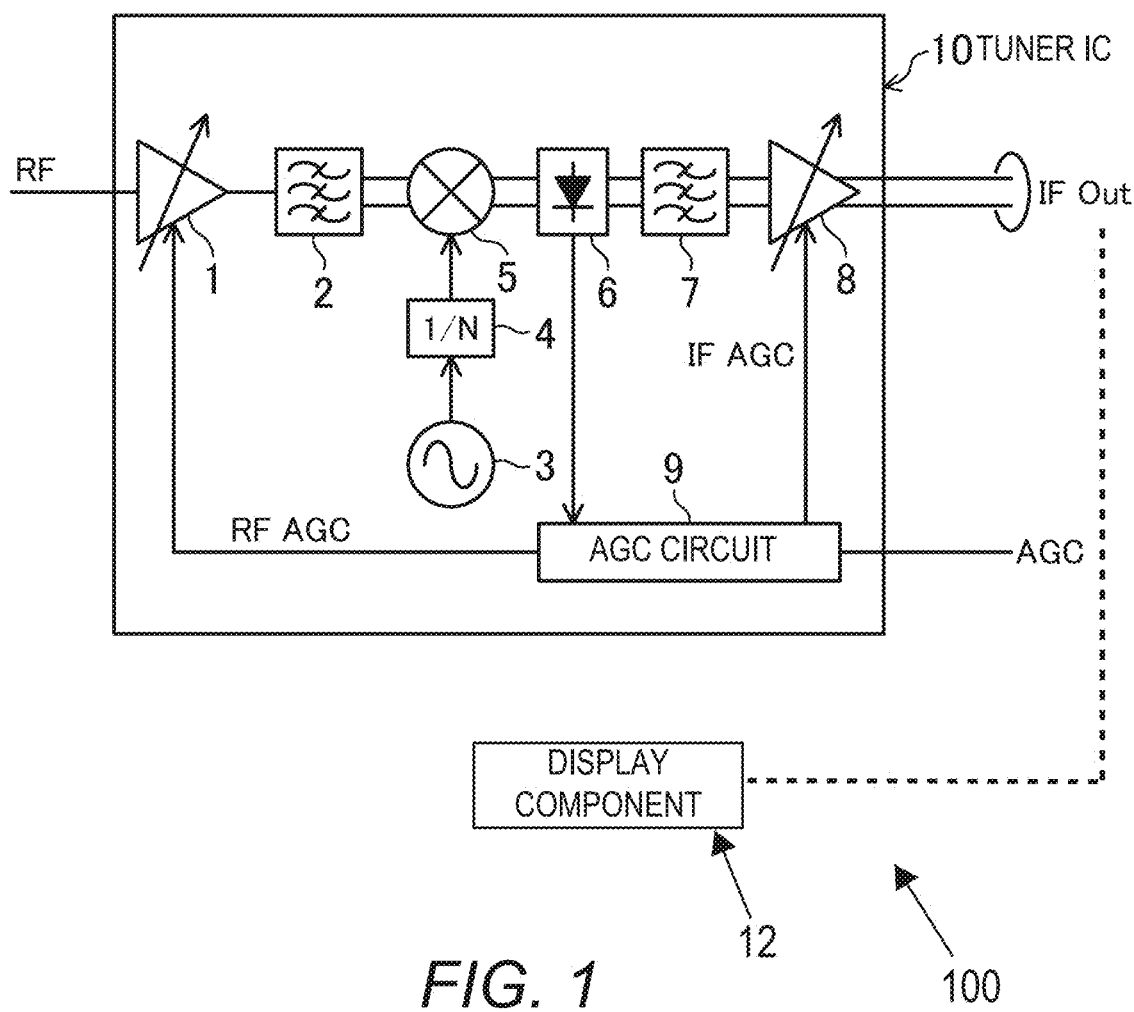
FIG. 1 is a block diagram of the circuit configuration of a tuner IC provided to the tuner device of the display device pertaining to a first embodiment.

FIG. 1 is a circuit diagram of a tuner IC provided to a tuner device of a display device 100 pertaining to a first embodiment of the present disclosure. This tuner IC (tuner component) is used for television broadcasts, for example, and its output broadcast signal is outputted to a display component (display) 12, and video corresponding to the broadcast signal is displayed on this display component 12.

In the tuner IC 10 in FIG. 1, 1 is an RF amplifier (gain control amplifier), 2 is an interstage filter, 3 is a VCO/PLL circuit, 4 is a 1/N circuit, 5 is a mixer, 6 is a detector, 7 is an interstage filter, 8 is an IF amplifier (gain control amplifier), and 9 is an AGC (auto gain control) circuit.

The RF amplifier 1 amplifies a received signal having an RF frequency of 90 to 767 MHz, which is the frequency of ground wave television broadcasts in Japan, for example, and the interstage filter 2 limits the band of the amplified signal. The VCO/PLL circuit (oscillator) 3 changes the oscillation frequency of the oscillation signal outputted by a built-in local oscillator depending on the tuning voltage of the PLL circuit, thereby generating a frequency range of at least 2 GHz, such as an oscillation frequency of 6 to 8 GHz. The 1/N circuit 4 converts the oscillation frequency generated by the VCO/PLL circuit 3 to a 1/N multiple (such as 6 to 133), and thereby gives a local oscillation frequency of 96.5 to 770.5 MHz, for example. The mixer 5 converts the frequency of the received signal by mixing the received signal with an RF frequency from the interstage filter 2 with the local oscillation frequency from the 1/N circuit 4. The detector 6 outputs the differential voltage of the differential outputs from the mixer 5. The interstage filter 7 limits the band of the differential output signal of the mixer 5 that has gone through the detector 6. The IF amplifier 8 amplifies the received signal that has undergone frequency conversion and band limitation, and outputs a signal with an IF frequency of 3.5 MHz, for example. The AGC circuit 9 generates gain control signals RF AGC and IF AGC that control the degree of amplification of the RF amplifier 1 and the IF amplifier 8 on the basis of the differential voltage between the differential outputs of the mixer 5 detected by the detector 6.

Figure 2:
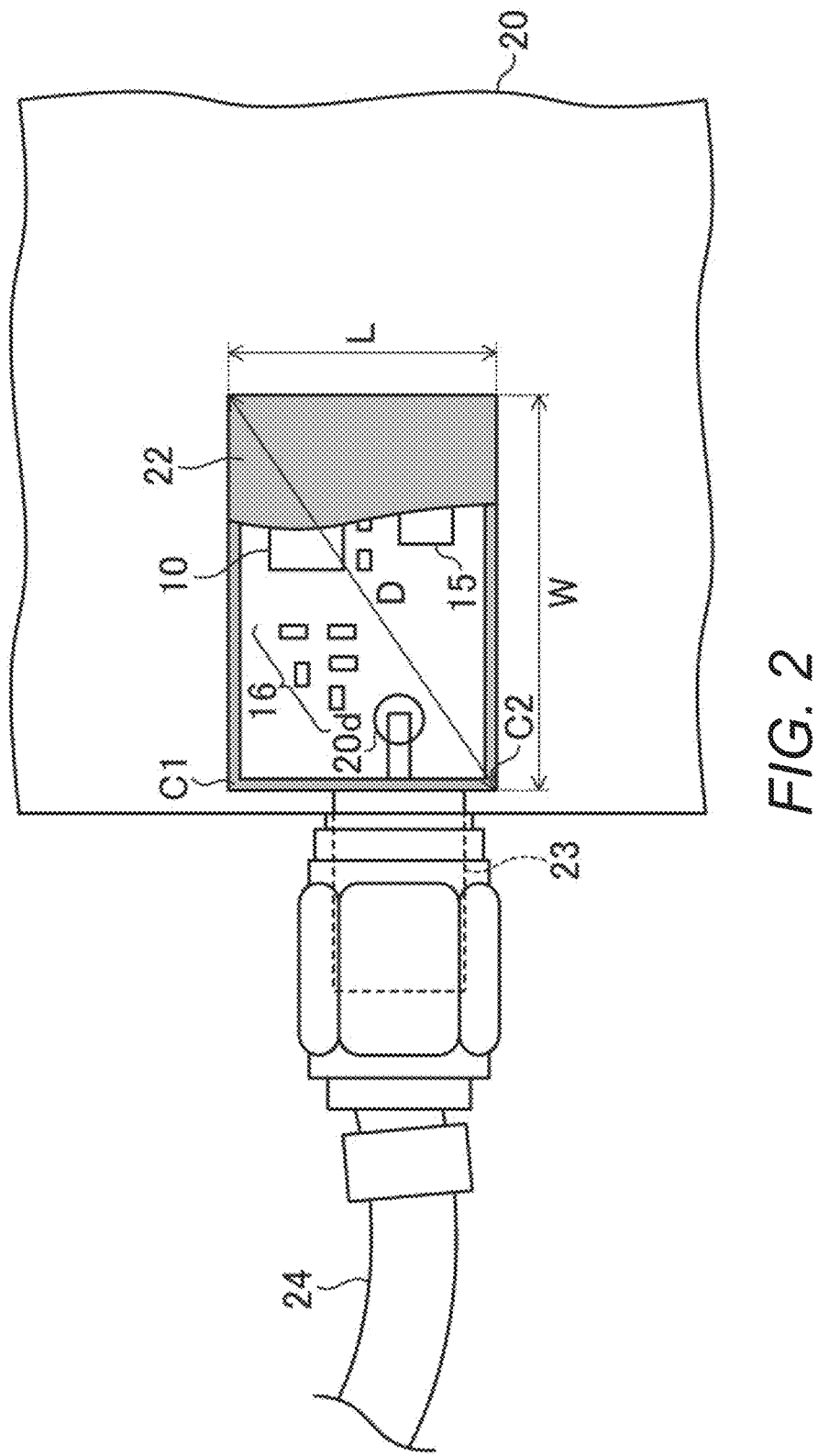
FIG. 2 is a plan view of the configuration of the main parts of this tuner device when part of the housing has been cut away.

As shown in FIG. 2, the tuner IC 10 with the above configuration is disposed on a main board 20 (substrate) along with a quartz oscillator 15, a capacitor, an inductor, and other chip parts 16. The tuner IC 10, the quartz oscillator 15, and the chip parts 16 are all shielded by a tetragonal, conductive housing 22 that covers them. This housing 22 is made up of a conductive frame or cover that has been plated with a metal or a non-metal. Therefore, the housing 22 is configured so as to make it less likely that external noise will be mixed into a tuner circuit, such as the mixer 5 in the tuner IC 10, and to reduce radiation and leakage to the outside of the signals generated in the tuner circuit.

The tuner IC 10 forms a signal processor that processes signals of a frequency higher than a specific threshold. In this embodiment, a signal processor is formed by the tuner IC 10, so when the bandwidth of the RF signal that is received is from 50 MHz to 3.2 GHz, the above-mentioned specific threshold is 50 MHz.

Also, while the signal processor is formed by the tuner IC 10 in this embodiment, the present invention is not limited to or by this, and the signal processor may instead be formed by WiFi, Bluetooth (registered trademark), or another such wireless communication component that sends and receives information signals. In this case, the bandwidth of the RF signal of the WiFi, Bluetooth (registered trademark), or other such wireless communication component is from 2.4 to 2.5 GHz or 5 to 6 GHz, so the above-mentioned specific threshold is approximately 2.4 GHz, and since the frequency is the same as that of the oscillation signal of the tuner in the case of an oscillation signal in wireless communication, the specific threshold is approximately 2 GHz.

As shown in FIG. 2, an F-type connector 23 is attached to the housing 22, an RF cable (signal cable) 24 that transmits signals (RF signals) of the television broadcast frequency is connected to the F-type connector 23, and an RF signal is inputted to the RF amplifier 1 in FIG. 1.

Figure 3:
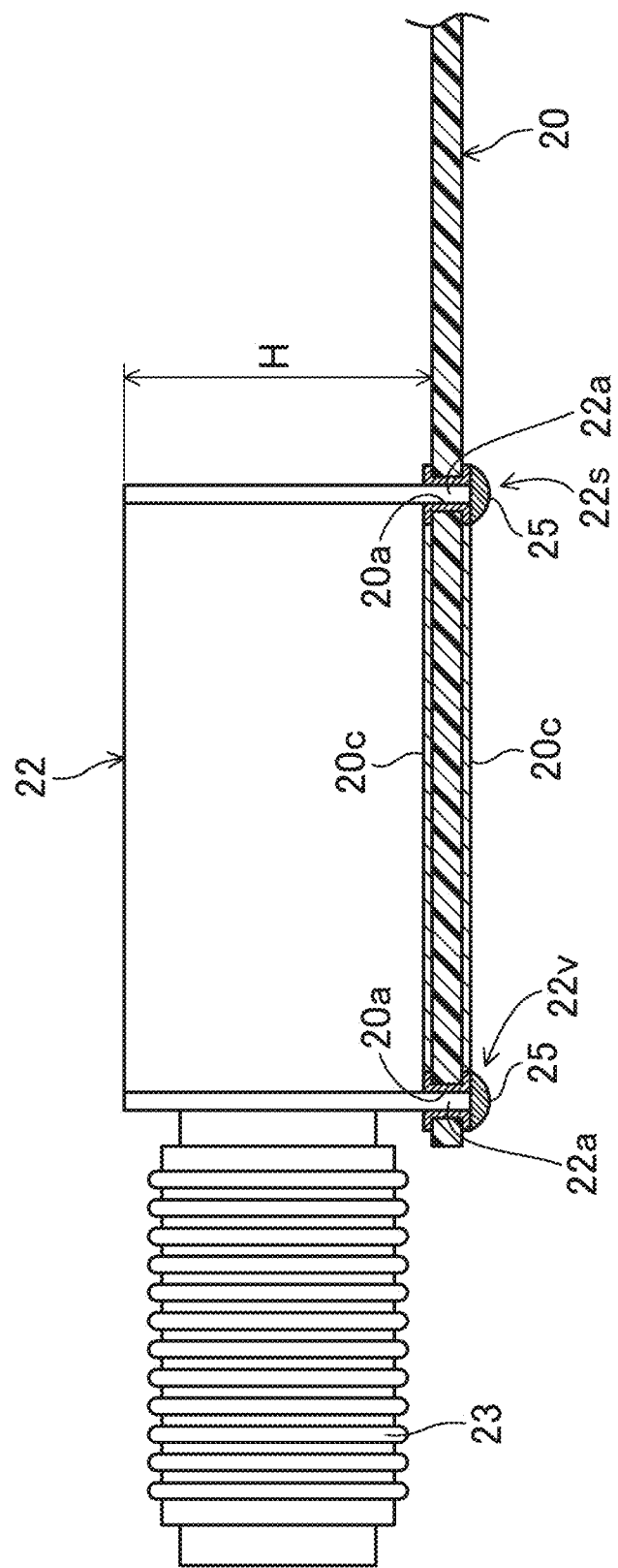
FIG. 3 is a side view of the main parts of this tuner device.

As shown in FIG. 3, the housing 22 has legs 22a disposed at the two corners 22v and 22s, for example. These legs 22a are inserted into through-holes 20a formed in the main board 20 and attached with solder 25, and the legs 22a are grounded to a conductive pattern (grounding pattern=ground component) (ground potential) 20c of the ground potential formed on the upper and lower faces of the main board 20 via the through-holes 20a in the main board 20.

The housing 22 that houses the tuner IC 10, etc., and the main board 20 on which this housing 22 is disposed form a tuner device in the television broadcast reception circuit of this embodiment.

With the above television broadcast reception circuit, the housing 22 is disposed on the main board 20, but also disposed are a microcomputer for performing processing to demodulate television broadcast waves, etc., a memory, power supply parts, noise suppression parts for preventing the admixture of noise into the numerous signal patterns formed on the main board 20, an external interface for connecting television cables and the like, and so on.

Dimensions of Housing

An example of the dimensions of the housing 22, taking into account the size of the quartz oscillator 15 or the tuner IC 10 housed therein, or the capacitor, inductor, and other such chip parts 16, is a length L of 17 mm, a width W of 20 mm, a height H of 10 mm, and a diagonal length D of 26.24 mm, at the very smallest. Since the frequency of the oscillation signal generated by the VCO/PLL circuit 3 of the tuner IC 10 is 6 to 8 GHz, the shortest length at which the effect of shielding against unnecessary radiation in the housing 22 will completely disappear, that is, the half value ($\lambda/2$) of the wavelength $\lambda$ at the highest oscillation frequency of the oscillation signal (8 GHz), is 18.75 mm. Therefore, in the dimensions of the housing 22, since the width W of 20 mm and the diagonal length D of 26.24 mm exceed the above-mentioned half wavelength ($\lambda/2$), something needs to be done to reduce unnecessary radiation. Furthermore, given that the diameter of the F-type connector 23 is established by standard, when the housing 22 is grounded to the main board 20 at the two corners C1 and C2 shown in FIG. 2, for example, the distance between those two corners C1 and C2 will be the width W+2×the height H=37 mm, and even if the width W (20 mm) and the diagonal length D (26.24 mm) can be reduced to the half wavelength ($\lambda/2$=18.75 mm), in actual practice it is difficult to reduce unnecessary radiation in the housing 22.

Figure 4A:
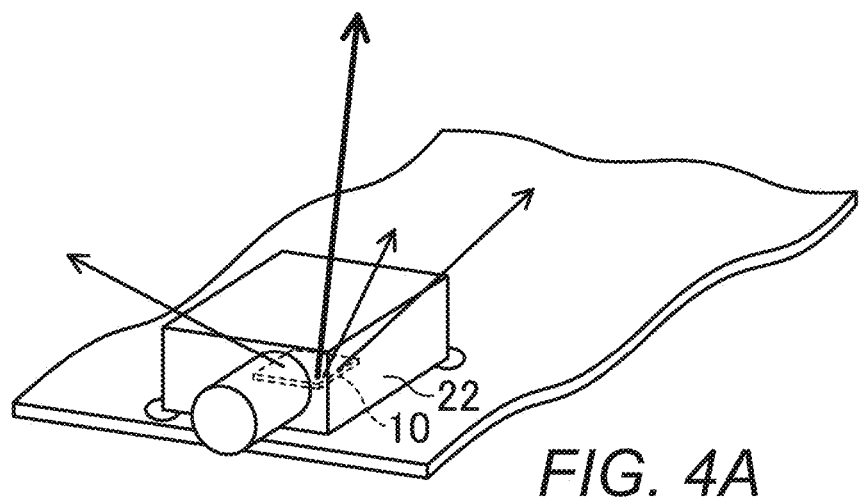
FIGS. 4A, 4B and 4C show how unnecessary radiation is generated from a housing that houses a tuner IC, with FIG. 4A being an example of when there are two grounds, FIG. 4B when there are three grounds, and FIG. 4C when there are four grounds.
Figure 4B:
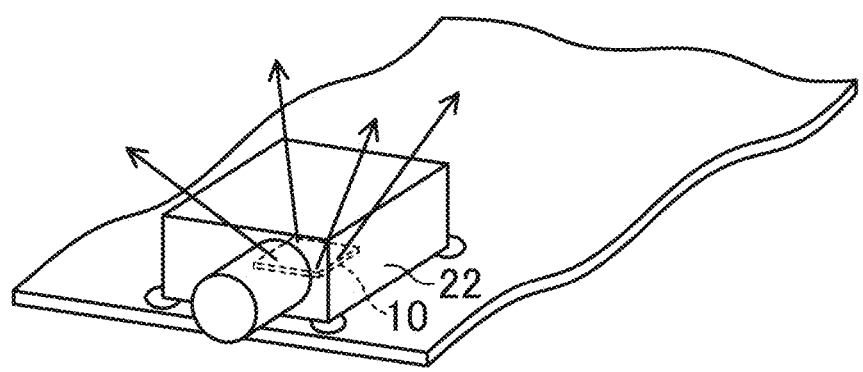
Figure 4C:
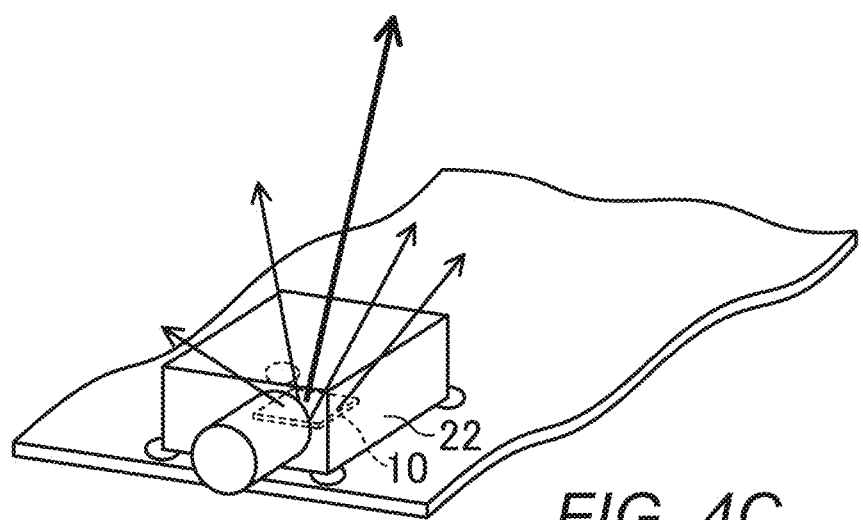

FIGS. 4A to 4C show the results of when the inventors measured how unnecessary radiation is generated in the above-mentioned housing 22. The term "unnecessary radiation" here refers to high-frequency noise that is a source of electromagnetic interference, as opposed to the signals (broadcast signals, communication signals, etc.) that are outputted to the outside from a device that processes high-frequency signals, etc., and are supposed to be used in an external device. This is the meaning of "unnecessary radiation" as used in this Specification. FIGS. 4A to 4C show the dispersion, emission direction, and peak intensity of the unnecessary radiation in the housing 22 when the oscillation frequency at the VCO/PLL circuit 3 is fixed at a specific value (6 GHz), and when the grounding sites of the housing 22 to the main board 20 are the corners, with the number of these grounding sites being two in FIG. 4A, three in FIG. 4B, and four in FIG. 4C. As can be seen from these drawings, the least amount of unnecessary radiation is when there are three grounding sites as in FIG. 4B, but some is still generated.

Figure 5A:
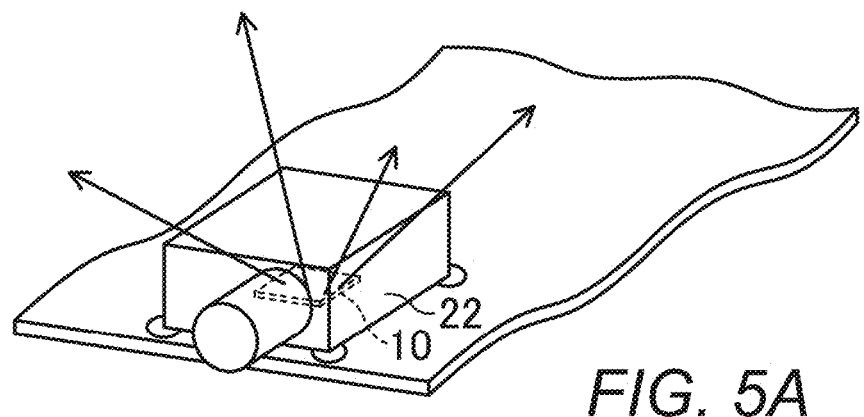
FIGS. 5A, 5B and 5C show how unnecessary radiation is generated when this housing is grounded at three places, with FIG. 5A being an example of when the oscillation frequency is 6 GHz, FIG. 5B when the oscillation frequency is 7 GHz, and FIG. 5C when the oscillation frequency is 8 GHz.
Figure 5B:
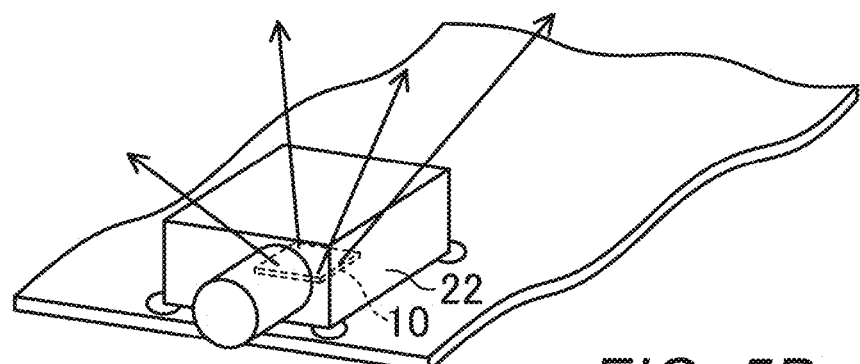
Figure 5C:
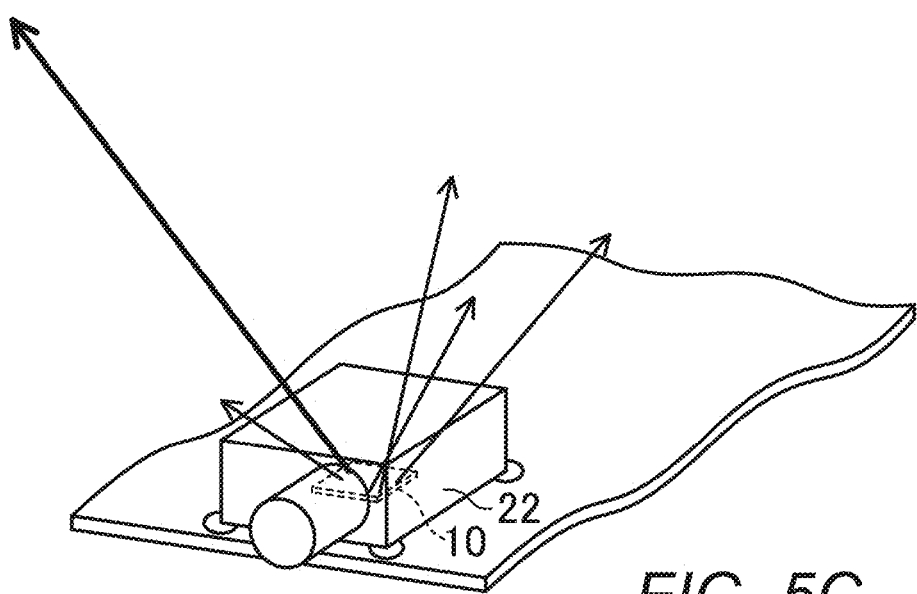

FIGS. 5A to 5C show how unnecessary radiation is generated when the oscillation frequency at the VCO/PLL circuit 3 is varied, with the three grounding sites in FIG. 4B that result in the least amount of unnecessary radiation. The oscillation frequency is set to 6 GHz in FIG. 5A, to 7 GHz in FIG. 5B, and to 8 GHz in FIG. 5C in these examples. As can be seen from these drawings, with the same three grounding sites, when the oscillation frequency is varied, the dispersion, emission direction, and peak intensity of the unnecessary radiation each change, and the peak intensity of unnecessary radiation is highest at the highest oscillation frequency (8 GHz).

Therefore, it is usually extremely difficult to specifically establish the grounding sites of the housing 22 so that unnecessary radiation can be reduced to below the standard over the entire variable range of the oscillation frequency at the VCO/PLL circuit 3.

Features of this Embodiment

This embodiment makes use of a configuration in which unnecessary radiation can be easily, effectively, and reliably reduced even when any of the various dimensions of the housing 22 cannot be made less than the half wavelength ($\lambda/2$) at the highest oscillation frequency (8 GHz), as discussed above. This will be described in detail below.

Specification of First Grounding Sites

First of all, first grounding sites are specified arbitrarily. These first grounding sites will be described by using an example of when the number of grounding sites shown in FIG. 4A is small, that is, when two first grounding sites are specified, which are the left-front corner and the right-rear corner in FIG. 4A. These first specified sites may be other corners, or there may be three sites, four sites, etc., as in FIGS. 4B and 4C.

Figure 6B:
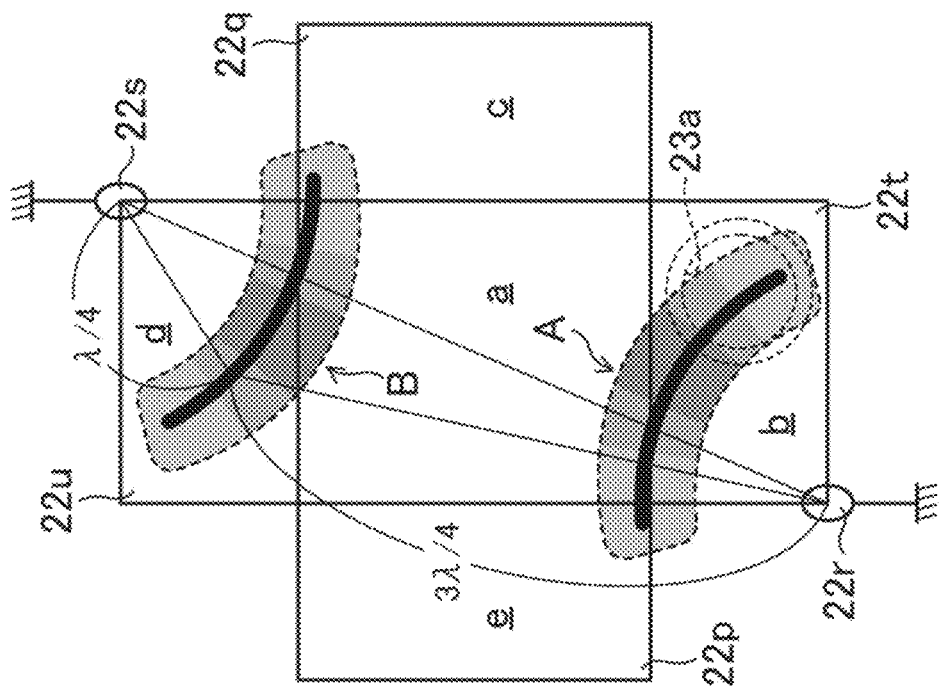
FIGS. 6A and 6B show the high impedance range produced in the housing when the housing is grounded at two places, with FIG. 6A showing the generation range in plan view, and FIG. 6B the generation range in a developed view of the housing.
Figure 6A:
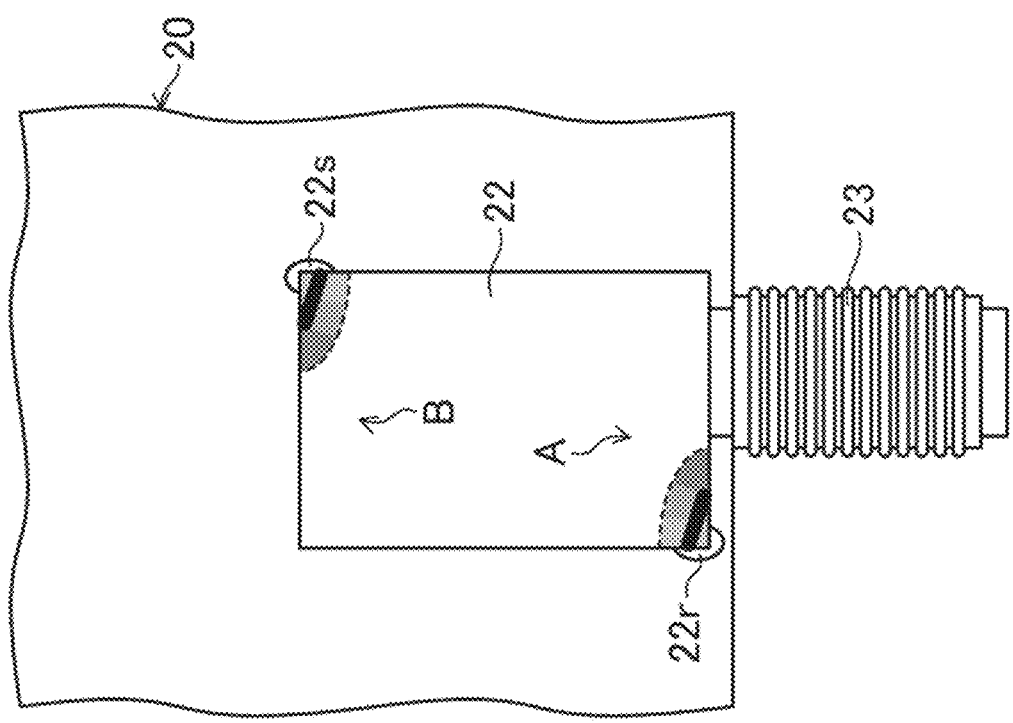

FIGS. 6A and 6B show the range where the impedance is higher than a specific impedance in the housing 22, when the grounding sites are at the left-front corner and the right-rear corner of the housing 22 (first grounding sites), as mentioned above.

Figure 7:
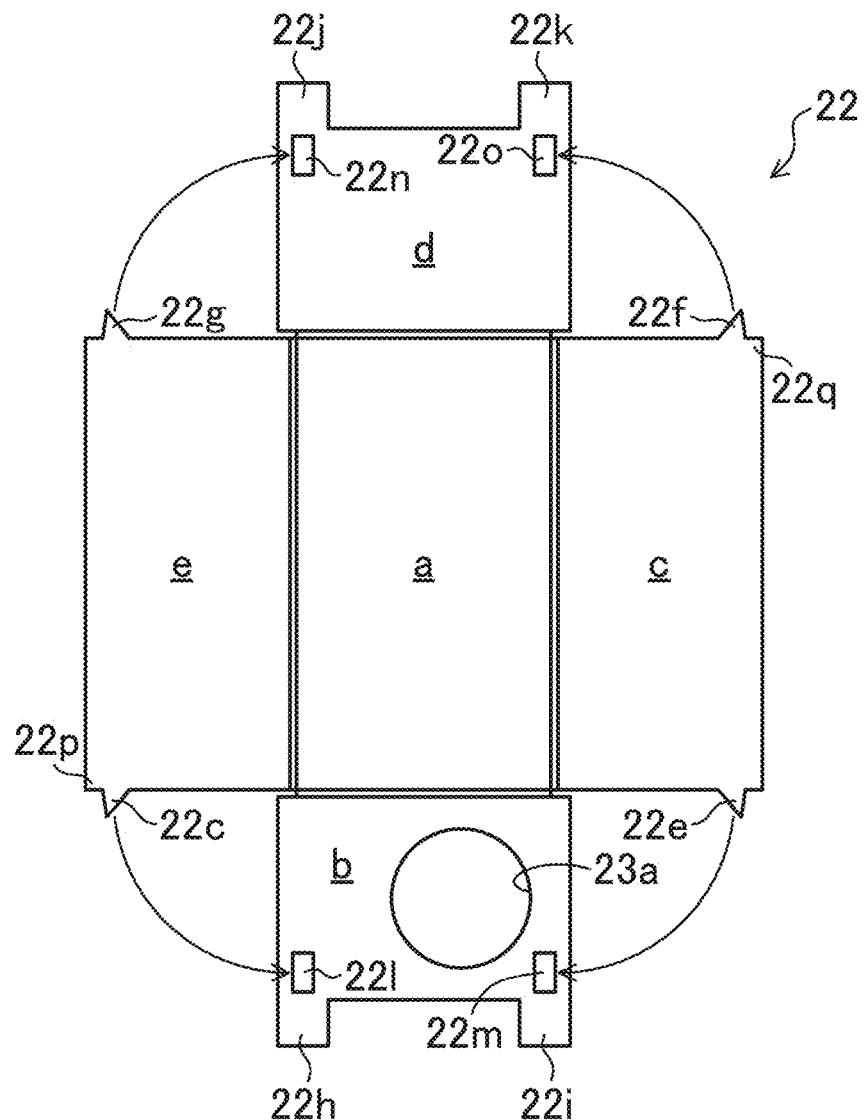
FIG. 7 is a developed view of the housing.

The housing 22 is formed in a tetragonal shape by working a single piece of sheet metal. FIG. 7 is a developed view of the housing 22, which has a rectangular upper part and four side parts that extend from the edges of the upper part and are perpendicular to the upper part. Here, the four-sided housing 22 is produced by bending the four side faces b to e with respect to the top face a in the developed view of the housing 22. Legs 22h, 22i, 22j, and 22k that extend downward for grounding to the main board 20 are formed at the both lower corners of the front face b, in which an attachment hole 23a for the F-type connector 23 is formed, and the rear face d, and four-sided holes 22l, 22m, 22n, and 22o are formed at positions above these legs 22h to 22k, respectively. Protrusions 22c, 22e, 22f, and 22g that fit into the holes 22l to 22o formed in the front face b and the rear face d are formed at both lower corners of the two side faces c and e that touch the front face b and the rear face d when folded. The housing 22 is then connected, in a state in which the single piece of sheet metal has been bent and its assembly completed, to the ground potential parts of the main board 20.

Figure 8A:
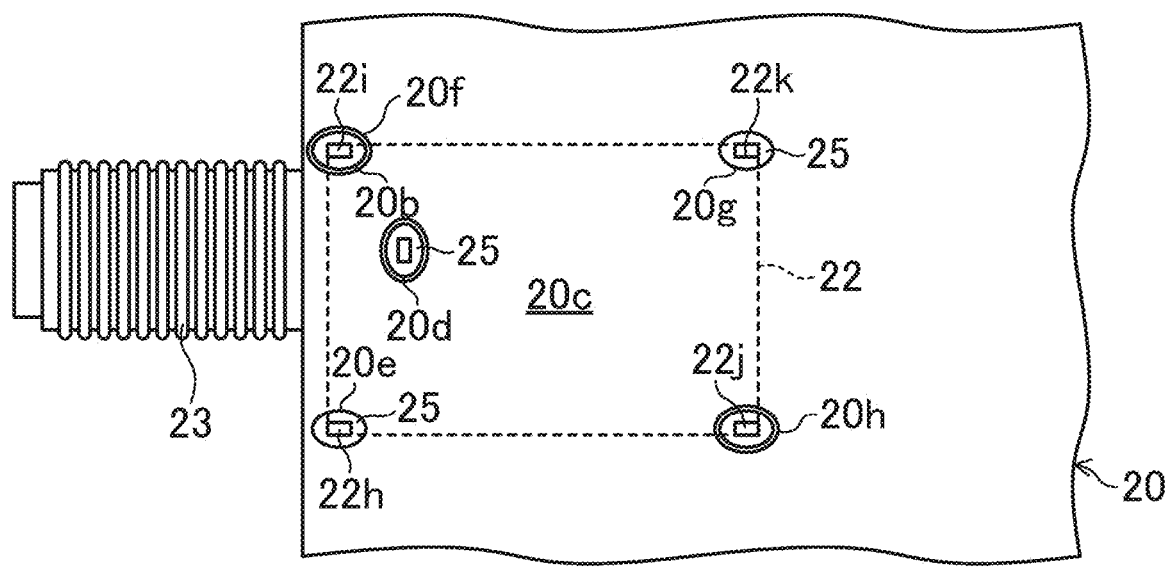
FIG. 8A is a view of a main board to which a housing has been attached, as seen from the rear.

The main board 20, meanwhile, is configured as follows. FIG. 8A shows the main board 20, on which the housing 22 is disposed, as seen from the rear face. The main board 20 shown in FIG. 8A has lands 20e to 20h formed at positions corresponding to the four corners of the housing 22. The lands 20e and 20g corresponding to the two corners 22r and 22s of the housing 22 serving as the first grounding sites are connected to the grounding pattern 20c disposed on the rear face of the main board 20, and the other two lands 20f and 20h are not connected to the grounding pattern 20c. In FIG. 8A, 20d is a land for connecting the F-type connector 23 to a signal pattern (not shown) on the main board 20.

Figure 8B:
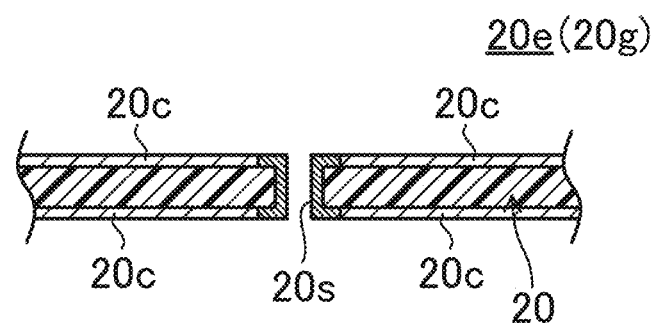
FIG. 8B is a cross section of the area around a grounded land provided to this main board.
Figure 8C:
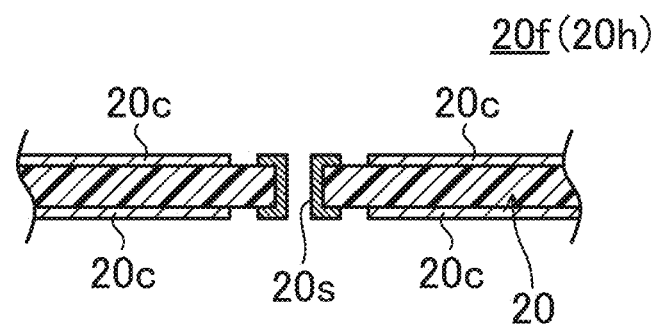
FIG. 8C is a cross section of the area around the land in an ungrounded state.

As shown in FIGS. 8B and 8C, the four lands 20e to 20h of the main board 20 have through-holes 20s formed at positions corresponding to the four corners of the housing 22. At the lands 20e and 20g corresponding to the two corners 22r and 22s serving as first grounding sites of the housing 22, as shown in FIG. 8B, the through-holes 20s are connected to the grounding pattern 20c disposed on the front face and/or rear face of the main board 20, and at the lands 20f and 20h corresponding to the other two corners 22t and 22u of the housing 22 that are not grounded, as shown in FIG. 8C, the through-holes 20s are not connected to the grounding pattern 20c.

As shown in FIG. 8A, of the legs 22h to 22k on the front face b and the rear face d of the housing 22, the leg 22h in the left corner 22r of the front face b and the leg 22k in the right corner 22s of the rear face d that are to be grounded are inserted into the through-holes 20s in the main board 20, and in this state the through-holes 20s and the legs 22h and 22k are attached with the solder 25, thus connecting these legs 22h and 22k to the grounding pattern 20c of the main board 20.

Meanwhile, at the two corners 22t and 22u of the housing 22 that are not grounded, just as with the corners 22r and 22s that are grounded, the legs 22i and 22j are inserted into the through-holes 20s of the main board 20, and in this state the through-holes 20s and the legs 22i and 22j are attached with the solder 25, thus fixing the two corners 22t and 22u of the housing 22 that are not grounded, to the lands 20f and 20h of the main board 20, but not connecting them to the grounding pattern 20c.

With the above configuration, in this embodiment, because of the configuration of the housing 22 shown in FIG. 7, in a state in which a single piece of sheet metal has been bent into the hollow, four-sided housing 22, the lower corner 22p of the left face e and the upper corner 22q of the right face c will have a low degree of grounding through mechanical engagement between the protrusions 22c and 22f and the holes 22l and 22o in FIG. 7, so as shown in FIG. 8A, when the front face lower-left corner 22r and the rear face lower-right corner 22s of the housing 22 are grounded, in the developed view of the housing 22 shown in FIG. 6, the left corner 22r of the front face b and the right corner 22s of the rear face d will be the grounding potentials, and the grounding effect at the two corners 22p and 22q with the abovementioned low degree of grounding can be ignored.

Establishing High Impedance Range in Housing

As discussed above, the highest frequency of the oscillation signal at the VCO/PLL circuit 3 is 8 GHz, and when the wavelength $\lambda$ shortens to about 40 mm, if the size of the housing 22 exceeds the half wavelength ($\lambda/2$), then impedance will be a distributed element (distributed constant) in the housing 22, which serves as the propagation path for the oscillation signal. With this distributed element circuit, a grounding site serves as the reference impedance, and a site that is an odd-numbered multiple of $\lambda/4$ away from this grounding site will be an open end, resulting in high impedance. When a plurality of grounding sites are provided, overlapping parts of sites that are an odd-numbered multiple of $\lambda/4$ away from these grounding sites will have the highest impedance.

More specifically, in the developed view of the housing 22 shown in FIG. 6B, as discussed above, two sites are ground potentials, namely, the left corner 22r of the front face b (the face of a side part extending from a short edge of the rectangular upper part) and the right corner 22s of the rear face d, so the highest impedance is at sites that are both an odd-numbered multiple of $\lambda/4$ away from these two grounding sites (first sites) 22r and 22s. In FIG. 6B, there are drawn an arc-shaped high impedance range A (first area) (this high impedance range is bounded by a broken line in the drawing) in which a high impedance portion that is $\lambda/4$ away from the left corner 22r of the front face b overlaps a high impedance portion that is three times $\lambda/4$ away from the right corner 22s of the rear face d, and an arc-shaped high impedance range B (first area) (this high impedance range is bounded by a broken line in the drawing) in which a high impedance portion that is λ/4 away from the right corner 22s of the rear face d overlaps a high impedance portion that is three times λ/4 away from the left corner 22r of the front face b. When the left corner 22r of the front face b and the right corner 22s of the rear face d thus serve as ground potentials in a developed view of the housing 22, the high impedance ranges A and B occur in the lower-left corner and the upper-right corner of the top face a, and the front face b and the rear face d. Also, in the above-mentioned arc-shaped high impedance ranges A and B, the arc-shaped lines indicated with a thick solid line are each an area of the highest impedance, and are both sites that are an odd-numbered multiple of λ/4 away from the grounding sites (first sites) 22r and 22s. Also, these impedance ranges A and B indicate a range that includes a distance that is a λ/20 multiple of the wavelength λ at the oscillation frequency f from the high impedance area of the arc-shaped line (indicated by the above-mentioned thick solid line). Also, there is one or two high impedance points corresponding to each frequency fin each of the high impedance ranges A and B, with the distance between these two points decreasing the higher is the frequency f. If the distance between these two points is long (if they are far apart), the radiation direction of the radio waves will be dispersed, and if the distance is short, there will be greater radiation directionality. The strength of radiation directionality is a gradation within the impedance ranges A and B, but in the drawing it is depicted simply as three steps, because of the difficulty in expressing it.

Therefore, in the developed view of FIG. 6B, a large amount of unnecessary radiation occurs in the above-mentioned two high impedance ranges A and B.

Figure 9:
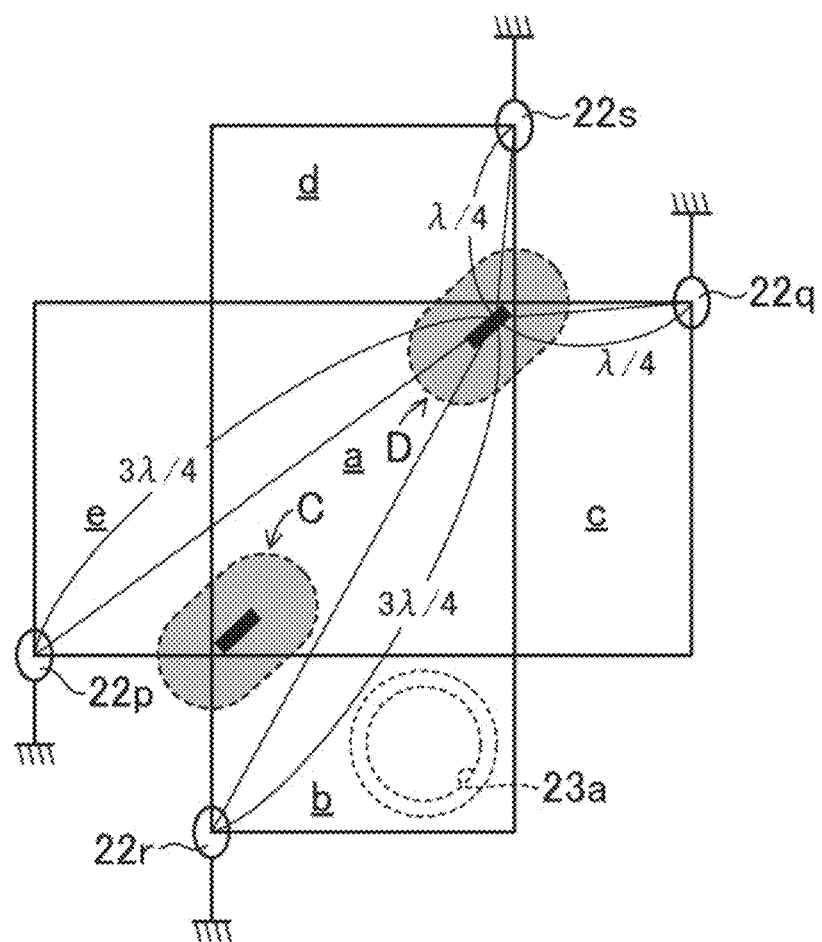
FIG. 9 shows the high impedance range in a state in which the housing has been developed, when two places on the housing, the left-front corner and the right-rear corner, have been grounded on the main board.

FIGS. 6A and 6B show the high impedance ranges A and B that occur when the sheet metal shown in FIG. 7 is bent into the housing 22, but if the degree of grounding is increased by securely joining the places where the front face b and the rear face d touch the right face c and the left face e by soldering, etc., after bending the sheet metal shown in FIG. 7, for example, then as shown in FIG. 9, the lower corner 22p of the left face e and the left corner 22r of the front face b will have the same potential, and the lower corner 22q of the right face c and the right corner 22s of the rear face d will have the same potential, these will serve as the ground potentials, and there will be four grounding sites in a developed view of the housing 22. In this case, the high impedance ranges C and D occur in the lower-left corner and the upper-right corner of the top face a, and a large amount of unnecessary radiation is generated from these ranges C and D. Furthermore, the high impedance ranges C and D are the same distance from the two grounding sites, namely, the lower corner 22p of the left face e and the left corner 22r of the front face b, and are the same distance from the other two grounding sites, namely, the lower corner 22q of the right face c and the right corner 22s of the rear face d, so their shape is rectilinear. Also, the straight lines indicated by the thick solid lines in these high impedance ranges C and D are sites that are an odd-numbered multiple of λ/4 away from the grounding sites (first sites) 22p, 22r, 22q, and 22s, and are areas where the impedance is highest. Also, these high impedance ranges C and D indicate a range that includes a distance that is a λ/20 multiple of the wavelength λ at the oscillation frequency f from the high impedance area of the straight lines indicated by the above-mentioned thick solid lines. In these high impedance ranges C and D, radiation directionality is weak, and there is no gradation.

Figure 10B:
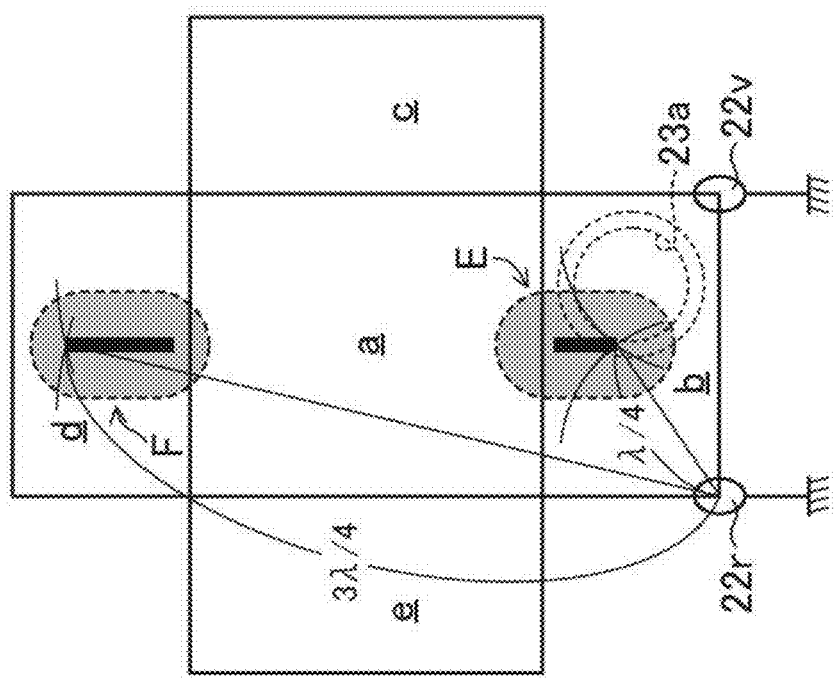
FIG. 10B shows the high impedance range in a state in which this housing has been developed.
Figure 10A:
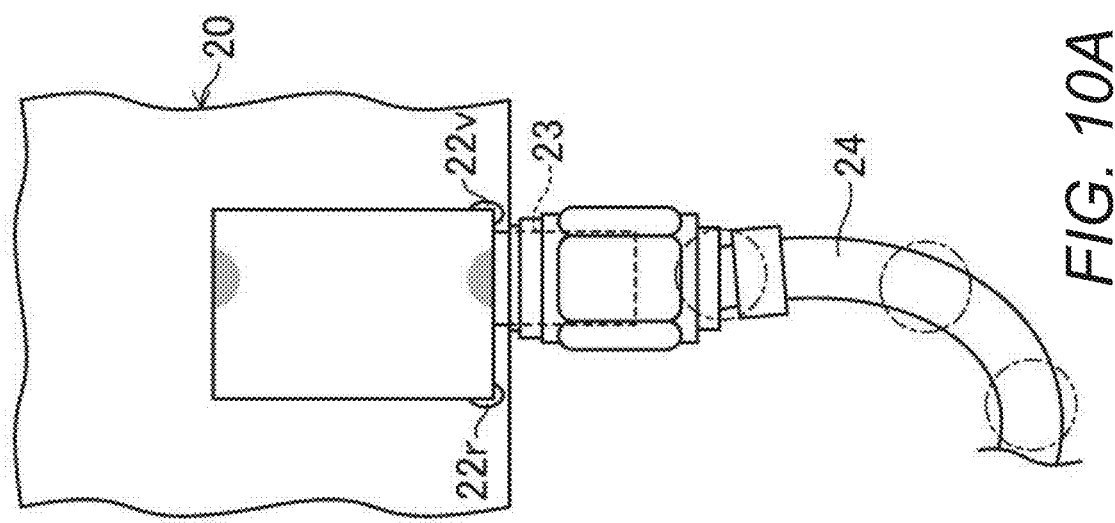
FIG. 10A shows the high impedance range produced in the housing when two places on the housing, the left-front corner and the right-front corner, have been grounded on the main board.

FIGS. 10A and 10B show the state when the housing 22 is produced using the sheet metal shown in FIG. 7, and the left corner 22r and the right corner 22v of the front face b (two sites) have been grounded. In these drawings, the high impedance ranges E and F occur in the middle upper part of the front face b and the middle upper part of the rear face d, and a large amount of unnecessary radiation is generated from these ranges E and F. With this grounding, the surface area of the high impedance ranges is smaller than with the grounding shown in FIGS. 6A and 6B or the grounding shown in FIG. 9, but some still occurs.

Reduction of Impedance in High Impedance Ranges of Housing

As discussed above, high impedance ranges occur in the housing 22, and the location and surface area of these high impedance ranges vary with the grounding sites of the housing 22. In this embodiment, a configuration is employed that reliably reduces the impedance of these high impedance ranges.

Figure 11:
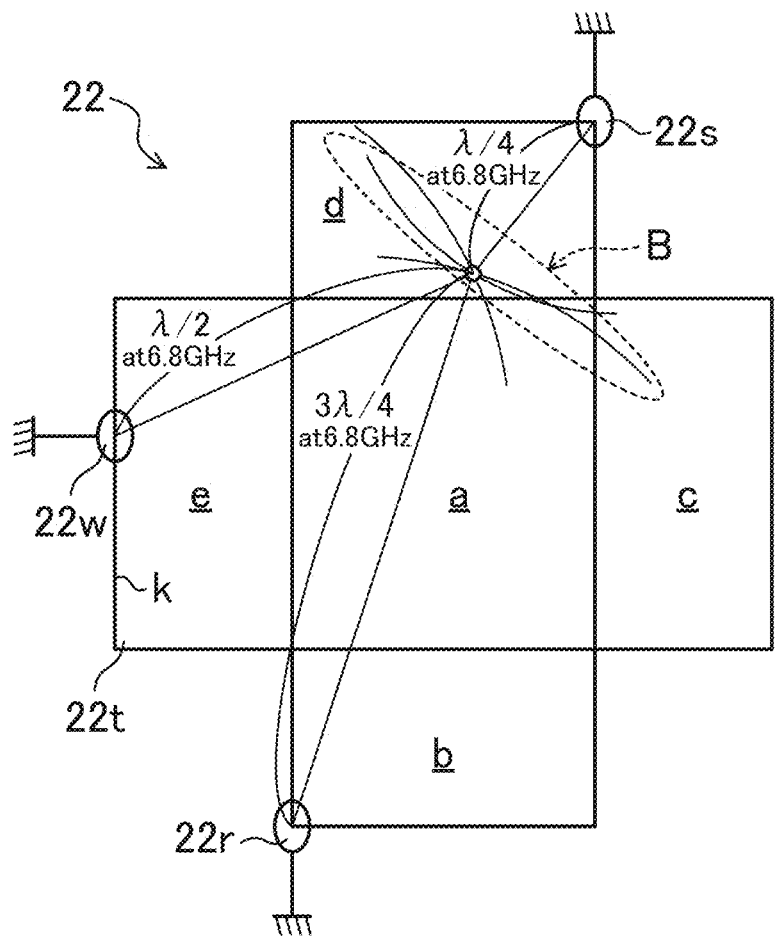
FIG. 11 shows how the high impedance range produced when the left corner on the front face of the housing and the right corner on the rear face are grounded at a first grounding site is changed to a lower impedance by a second grounding site disposed on the lower edge of the left-side face of the housing.

FIG. 11 shows the configuration for reducing the impedance of a high impedance range, using as an example a case of the grounding state shown in FIG. 6B, that is, when the left corner 22r of the front face b and the right corner 22s of the rear face d are first grounding sites in the developed view of the housing 22 in FIG. 6B, and are grounded to the grounding pattern 20c of the main board 20.

In FIG. 11, the impedance is lowered in the high impedance range B (see FIGS. 6A and 6B) that occurred in the developed view of the housing 22. As discussed above, with a housing 22 in which the oscillation frequency of the oscillator is high and impedance is a distributed element, when a grounding site is used as the reference impedance, at a position that is an odd-numbered multiple of λ/4 away from this grounding site, the impedance is higher than a specific impedance (first threshold), but in an area that is an even-numbered multiple of ¼ the wavelength λ of the oscillation signal away from this grounding site (second area), the impedance is lower than a specific impedance (second threshold). In the illustrated embodiment, the specific impedance (first threshold) and the specific impedance (second threshold) can be equal to each other, and be 150Ω, for example. Of course, the specific impedance (first threshold) and the specific impedance (second threshold) can be set different values as needed and/or desired. Therefore, in FIG. 11, in a developed view of the housing 22, a second grounding site (second site) 22w is disposed on the bottom edge k of the left face e of the housing 22 (a side face extending from a long edge of the rectangular upper part), with this position being separated from a point at an oscillation frequency of 6.8 GHz, at which the radiation directionality is particularly high in the high impedance range B, in a straight line distance of two times ¼ the wavelength λ (λ/2) of this oscillation frequency (6.8 GHz) in a developed view.

Therefore, in this embodiment, the range of particularly high impedance and/or the range of particularly high radiation directionality in the high impedance range B that occurred in a developed view of the housing 22 (see FIGS. 6A and 6B) can be made lower than a specific impedance by means of the second grounding site 22w. As a result, the second grounding site 22w can effectively reduce the generation of unnecessary radiation from the high impedance range B that occurred due to the two first grounding sites 22r and 22s in FIGS. 6A and 6B.

FIG. 11 illustrates a case of lowering the impedance over a wide range of the high impedance range B of the housing 22 with the second grounding site 22w, but as shown in FIG.

Figure 13:
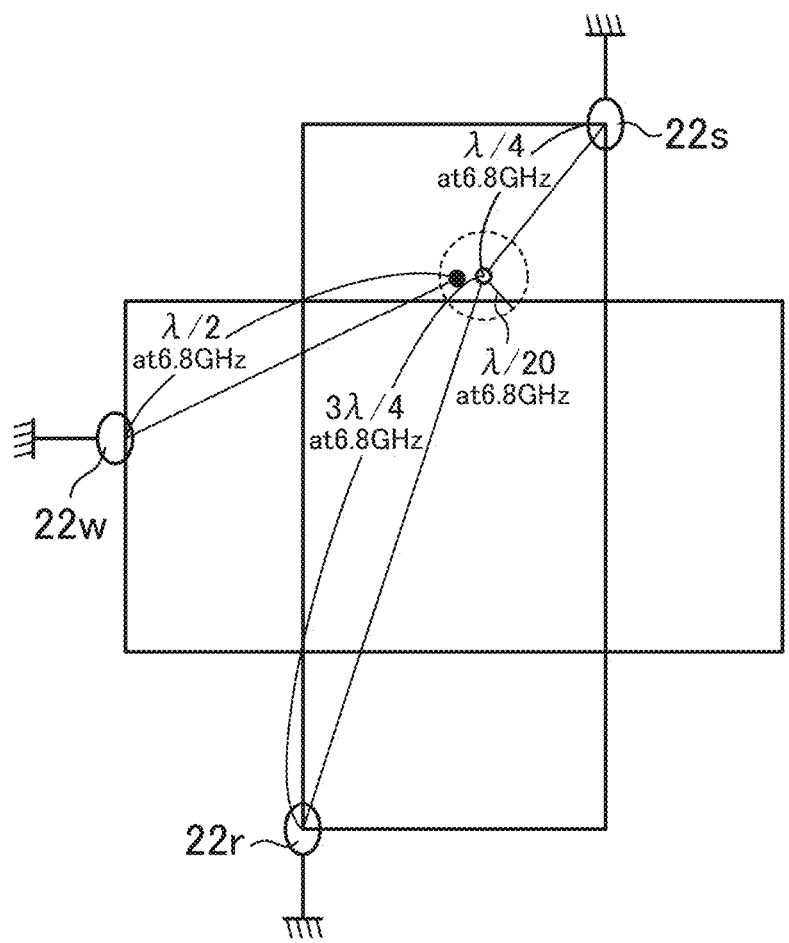
FIG. 13 shows a modification example of the position of the second grounding site in FIG. 12, with this position being disposed at a point within 1/20 of the wavelength λ from a distance that is an even-numbered multiple of ¼ the wavelength with respect to a high impedance point.

12, this second grounding site 22w corresponds to a position that is separated from a point near a portion of high impedance (a portion where the oscillation frequency is around 6.8 GHz) within the other high impedance range A that occurs in the housing 22 (see FIG. 6) (this point is depicted in FIG. 13 by a black circle), by a distance of half the wavelength (λ/2) at the oscillation frequency (6.8 GHz) in a developed view of the housing 22. Therefore, the second grounding site (second site) 22w makes it possible to lower the impedance even over the wide range of the high impedance range A of the housing 22. Therefore, the impedance can be lowered over a wide range in both of the high impedance ranges A and B of the housing 22, and unnecessary radiation from these ranges A and B can be effectively reduced, with just the one second grounding site 22w.

Therefore, in this embodiment, since it is possible for the impedance in both of the high impedance ranges A and B caused by the two first grounding sites 22r and 22s to be lowered by a single second grounding site 22w, it is also possible to keep the number of second grounding sites that lower the impedance of high impedance ranges lower than the number of first grounding sites that cause those high impedance ranges.

Therefore, with this embodiment, there is no need to dispose grounding posts (grounding sites) as evenly as possible along the ends or the inside of the housing 22 as in the past, so the configuration of the housing 22 can be simpler and it can be produced at lower cost.

With this embodiment, a second grounding site was disposed at a point that was exactly an even-numbered multiple of ¼ the wavelength λ of the oscillation frequency away from the point of high impedance in this frequency, but the present invention is not limited to this, and the second grounding site need not be disposed exactly an even-numbered multiple of ¼ the wavelength λ away, as long as it is sufficiently close.

Usually, impedance can be kept low within a range of λ/20 from a grounding site, so the grounding sites are often designed at a spacing of λ/10 (the center between grounding sites is exactly λ/20 from the grounding sites) in housings and substrates with which there are no particular restrictions on cost or shape.

Because of this, it may be concluded that the effect of the present disclosure can be sufficiently obtained as long as the second grounding site is disposed at a point within ¹⁄₂₀ the wavelength λ from a distance that is an even-numbered multiple of ¼ the wavelength λ of the oscillation frequency away from a point of high impedance at this frequency.

For instance, in FIG. 13, the second grounding site 22w is provided at a site that is an even-numbered multiple of ¼ the wavelength λ away from a dot in a circle with a radius of λ/20 of the oscillation frequency, centered at a point of high impedance, separated by an odd-numbered multiple of ¼ the wavelength λ of the oscillation frequency away from both the grounding sites 22r and 22s.

Doing this allows the effect of the present disclosure to be sufficiently obtained even if there are restrictions on where the second grounding site can be disposed, for example.

Figure 14:
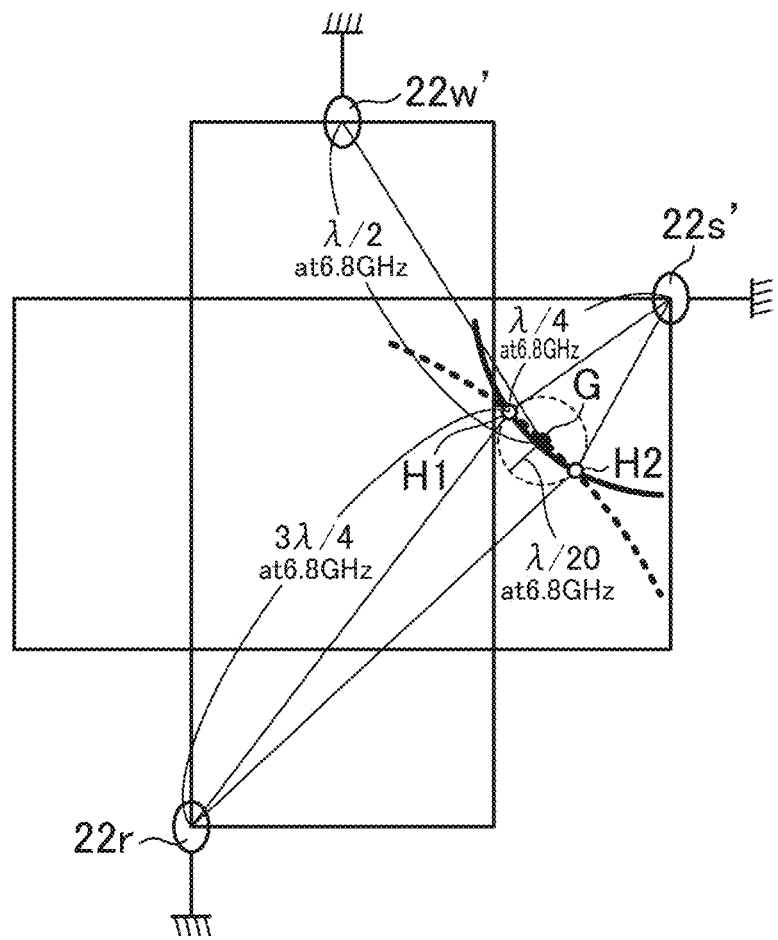
FIG. 14 shows another modification example of the position of the second grounding site shown in FIG. 12.

Also, in FIG. 14, unlike in FIGS. 11 and 13, the housing 22 is grounded at a grounding site (first site) 22r, and is also grounded at another grounding site (third site) 22s', resulting in the arc-shaped area indicated by the thick solid line in the drawing, at which the impedance is high and which is separated from the grounding site 22s' by an odd-numbered multiple (one times in the drawing) of ¼ the wavelength λ of the oscillation frequency, and also resulting in the arc-shaped area indicated by the thick broken line in the drawing, at which the impedance is high and which is separated from the grounding site 22r by an odd-numbered multiple (three times in the drawing) of ¼ the wavelength λ of the oscillation frequency. These two high impedance areas overlap at two points H1 and H2. If the distance between the two points H1 and H2 of high impedance is no more than ¹⁄₁₀ the wavelength λ of the oscillation frequency, the position of a second grounding site 22w' should be selected so that these two points H1 and H2 of high impedance will be included within a circle whose radius, centered on a site G that is an even-numbered multiple (two times in the drawing) of ¼ the wavelength λ of the oscillation frequency away from the second grounding site (second site) 22w', is ¹⁄₂₀ the wavelength of the oscillation frequency. Thus, in the illustrated embodiment, the two points H1 and H2 are located within the circle with the radius of λ/20, centered at the site G in an area (second area) of the housing 22 in which an impedance is lower than a second threshold due to the second grounding site (second site) 22w'.

First Modification Example

Figure 15:
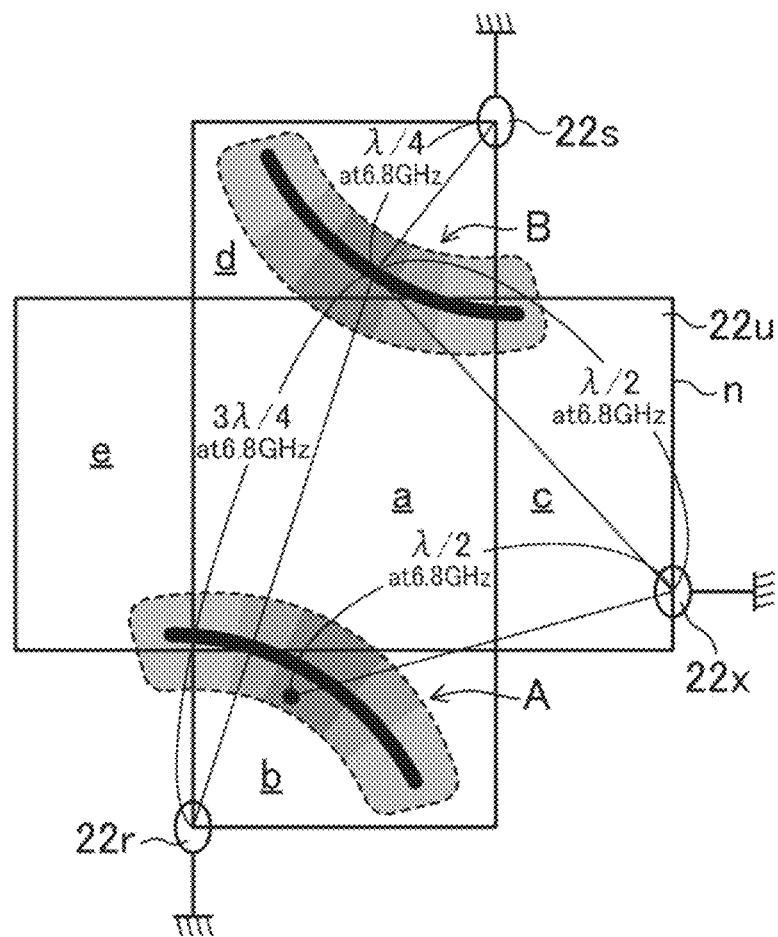
FIG. 15 shows how the two high impedance ranges produced in the housing shown in FIG. 7 are changed to a lower impedance by a second grounding site disposed on the lower edge of the right-side face of the housing.

FIG. 15 shows a first modification example of the second grounding site shown in FIG. 11.

In FIG. 11, because the two first grounding sites 22r and 22s are located in point symmetry in a developed view of the housing 22, in this modification example, in FIG. 15, the second grounding site 22w in FIG. 11 is replaced by a second grounding site (second site) 22x that is disposed in point symmetry to the second grounding site 22w, that is, on the bottom edge n of the right face c in a developed view of the housing 22.

Therefore, again in this modification example, it is possible to lower the impedance in both of the high impedance ranges A and B caused by the two first grounding sites 22r and 22s, with just a single second grounding site 22x.

Second Modification Example

Figure 16:
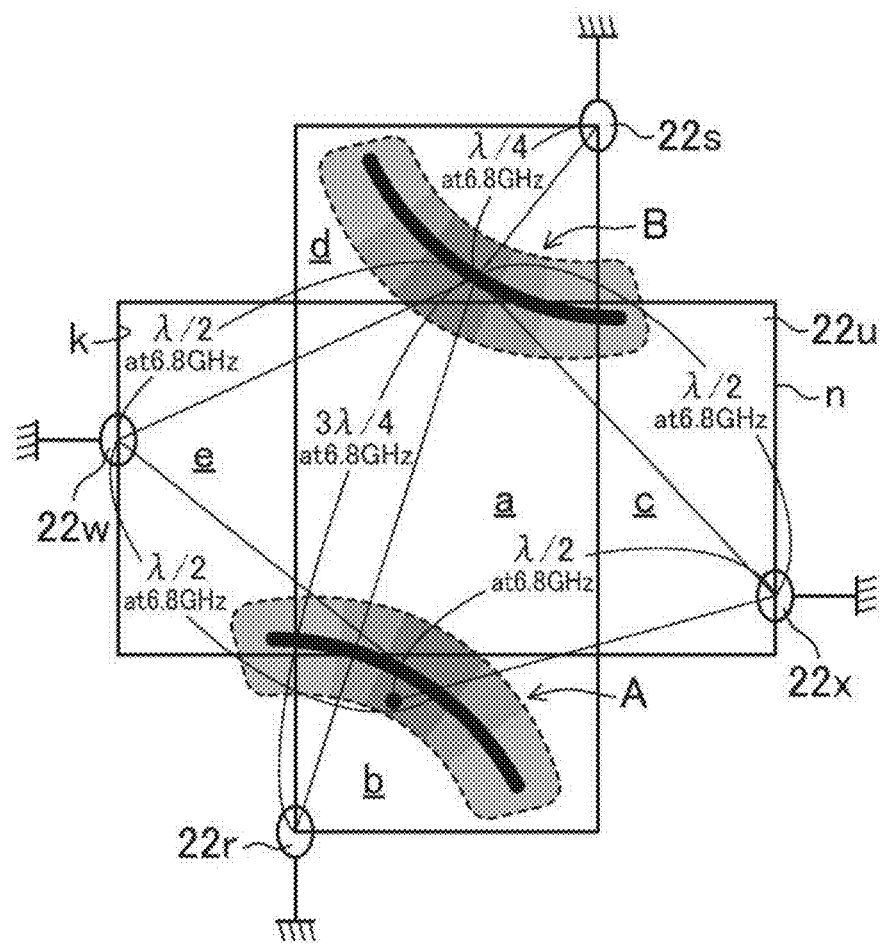
FIG. 16 shows how two high impedance ranges produced in the housing are changed to a lower impedance by a second grounding site provided to the lower edge of the left-side face of the housing and a second grounding site provided to the lower edge of the right-side face of the housing.

FIG. 16 shows a second modification example of the position of the second grounding site shown in FIG. 11.

Figure 12:
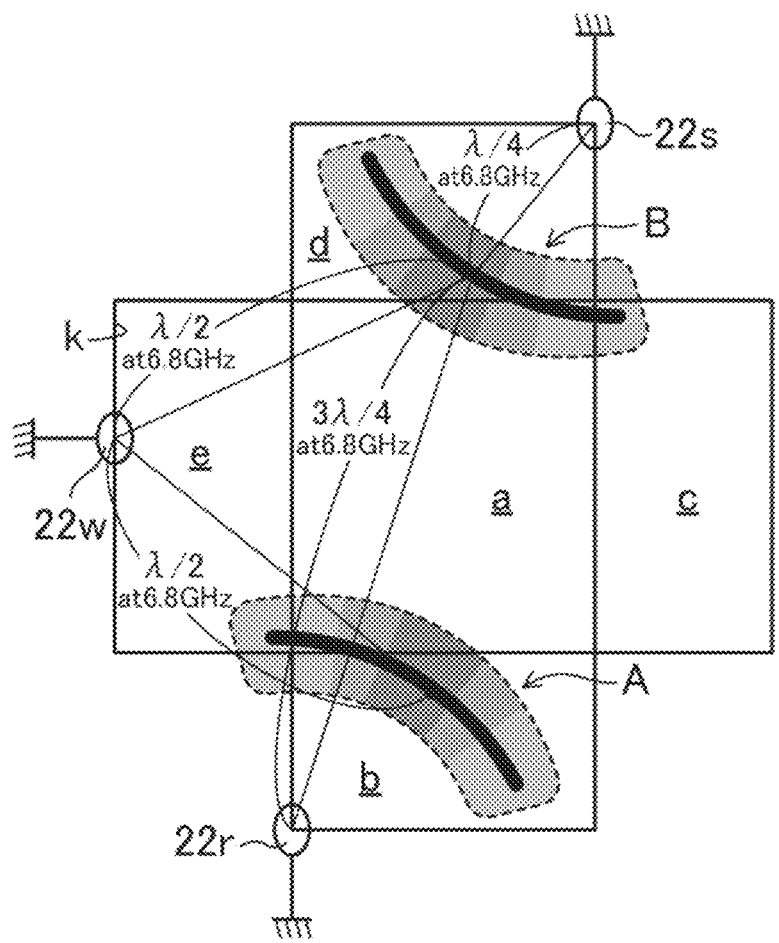
FIG. 12 shows how another high impedance range produced in the housing is changed to a lower impedance by the second grounding site in FIG. 11.

In this modification example, the configuration in FIG. 12 showing this embodiment is combined with the configuration in FIG. 15 showing the first modification example. The second grounding site 22w in FIG. 12 and the second grounding site 22x in FIG. 15 are disposed as second grounding sites (second sites) that lower the impedance of the two high impedance ranges A and B.

When the two second grounding sites 22w and 22x are both provided, it will be possible to lower the impedance of the high impedance ranges A and B over a wider range if, for example, one of the grounding sites (such as 22w) is disposed at a position that is separated by a half wavelength (λ/2) from near a position at the oscillation frequency of 6.8 GHz within the high impedance ranges A and B, and the other grounding site (such as 22x) is disposed at a position that is separated by a half wavelength (λ/2) from near a position at another oscillation frequency (such as 6.9 GHz) within the high impedance ranges A and B.

With the above embodiment and the above first and second modification examples, the second grounding sites 22w and 22x were disposed at a position that was half a wavelength (λ/2) (that is, two times λ/4) away in straight line distance in a developed view of the housing 22, but the present invention is not limited to this, and if the housing 22 is large in size in its length, width, etc., the high impedance ranges that occur in the housing can still be effectively reduced if these sites are disposed at a position that is separated by an even-numbered multiple of four or more times the $\lambda/4$ of the wavelength $\lambda$ of the oscillation signal.

Furthermore, with the above embodiment and the above first and second modification examples, a case in which the first grounding sites were the two corners 22$r$ and 22$s$ was described, as shown in the examples in FIGS. 12, 15, and 16, but the first grounding sites may be located at other corners, and the number of the first grounding sites is not limited to two, and the present invention can be similarly applied if the number is three, or four or more.

Specific Configuration of Second Grounding Site

FIGS. 17A to 17E show the specific configuration of connecting the second grounding sites 22$w$ and 22$x$ to the grounding pattern 20$c$ of the main board 20.

Figure 17A:
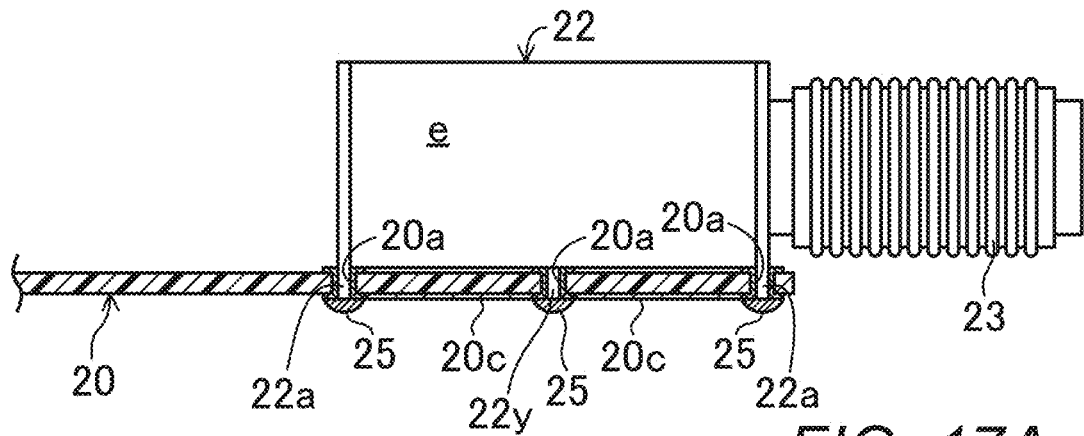
FIGS. 17A, 17B, 17C, 17D and 17E show how second grounding sites provided to the housing are connected to the main board, with FIG. 17A being when legs are provided to the housing, FIG. 17B when the housing is soldered directly to the main board, and FIG. 17C when a sheet metal spring is used, and FIG. 17D being a side view of this sheet metal spring, and FIG. 17E a cross section of this sheet metal spring.

In FIG. 17A, in the second grounding site 22$w$, a leg 22$y$ is formed on the bottom edge k of the left face e of the housing 22, just as with the first grounding site 22$r$ disposed in a corner of the housing 22, while a through-hole 20$a$ is disposed at a position on the main board 20 corresponding to the leg 22$y$, and when the housing 22 is attached to the main board 20, the leg 22$y$ on the left face e of the housing 22 is inserted into the through-hole 20$a$ and fixed with solder 25, and the leg 22$y$ of the housing 22 is connected via the through-hole 20$a$ in the main board 20 to the grounding pattern 20$c$ on the lower face of the main board 20.

Figure 17B:
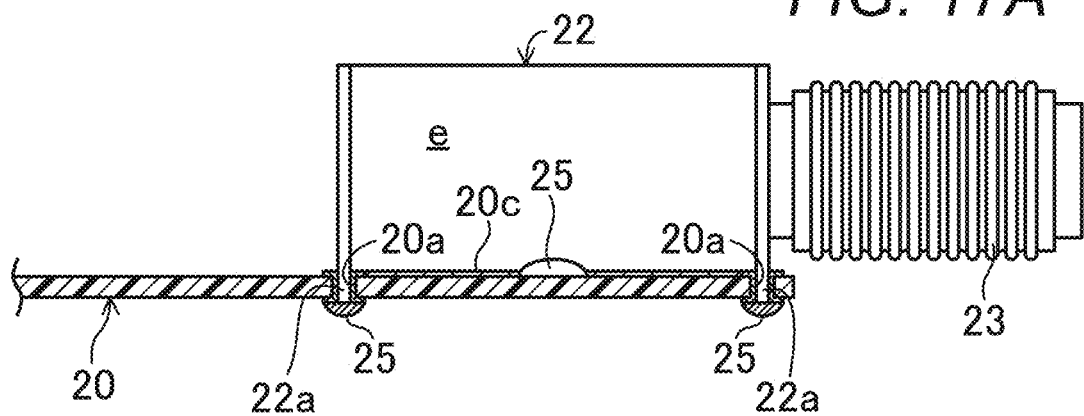

In FIG. 17B, solder 25 is applied to the position on the left face e of the housing 22 that will become the second grounding site 22$w$, and the second grounding site 22$w$ of the housing 22 is connected directly to the grounding pattern 20$c$ on the main board 20.

Figure 17C:
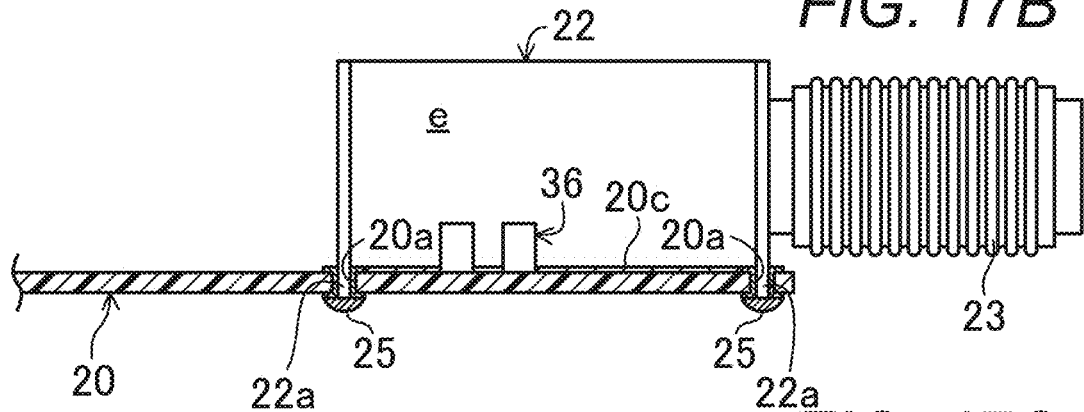
Figure 17D:
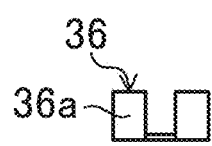
Figure 17E:
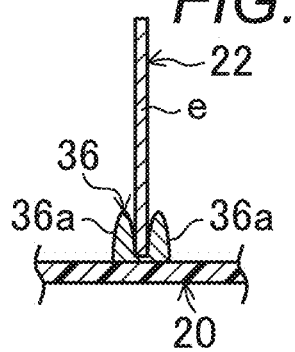

In FIG. 17C, a metal leaf spring 36 is used as a surface mounted part. This metal leaf spring 36 is substantially in the form of a squared-off U in cross section, as shown in FIG. 17D, two flat pieces 36$a$ that are disposed opposite each other as shown in FIG. 17E are pressed toward each other, that part of the left face e of the housing 22 that serves as the second grounding site 22$w$ is squeezed between and fixed by the flat pieces 36$a$ of the metal leaf spring 36, and the bottom face of this fixed metal leaf spring 36 is connected to the grounding pattern 20$c$ on the upper face of the main board 20 by reflow soldering.

Second Embodiment

Figure 18:
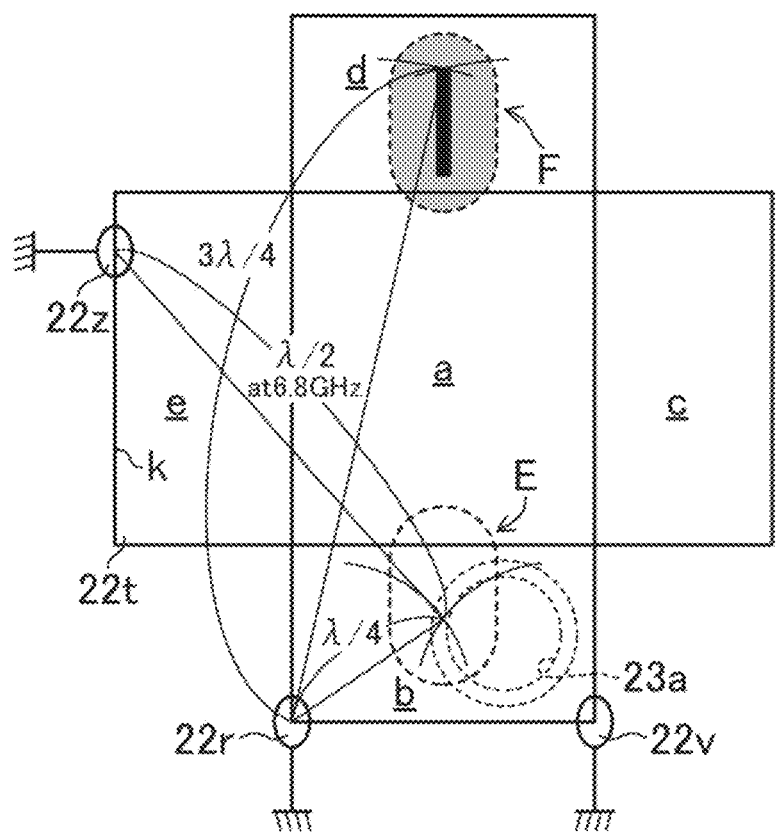
FIG. 18 shows a second embodiment of the present disclosure, and shows how a high impedance range is changed to a lower impedance by a second grounding site provided to the lower edge of the left-side face in a developed view of the housing.

FIG. 18 shows a second embodiment of the present disclosure.

In this embodiment, the impedance is lowered in a range near the F-type connector 23 in a developed view of the housing 22.

As shown in FIGS. 10A and 10B, when the left corner 22$r$ and the right corner 22$v$ of the front face b of the housing 22 are used as first grounding sites, a high impedance range (first area) E is generated in the upper middle part of the front face b. As shown in FIG. 10A, since the RF cable 24 that transmits television broadcast waves is connected to the F-type connector 23, the effect of unnecessary radiation generated near the F-type connector 23 also leads to the generation of unnecessary radiation on the RF cable 24, according to the material, structure or attachment state of the RF cable 24 (how it bends, etc.). In this drawing, the places where unnecessary radiation may occur on the RF cable 24 are indicated by circles.

As shown in FIG. 18, in this embodiment a second grounding site (second site) 22$z$ is disposed at a position on the bottom edge k of the left face e of the housing 22, which is a position that is separated, in straight line distance in a developed view of the housing 22, by a distance of half the wavelength ($\lambda/2$) at the oscillation frequency (6.8 GHz) from a high impedance point that occurs at an oscillation frequency of 6.8 GHz, out of the high impedance range E that occurs in the upper middle part of the front face b of the housing 22.

Therefore, in this embodiment, a high impedance range F that occurs in the upper middle part of the rear face d of the housing 22 does remain, but the second grounding site 22$z$ lowers the impedance over a wide range of the high impedance range E produced in the upper middle part of the front face b of the housing 22, so the unnecessary radiation from this range E can be reduced, and the unnecessary radiation that is generated in the RF cable 24 connected to the F-type connector 23 can be effectively reduced. As a result, the impedance distribution over the housing is less apt to be affected by variance in the state of the RF cable 24 (type, material, shape, etc.), and the effect is that less unnecessary radiation is caused by variance in the state of the signal cable.

Third Embodiment

Figure 19B:
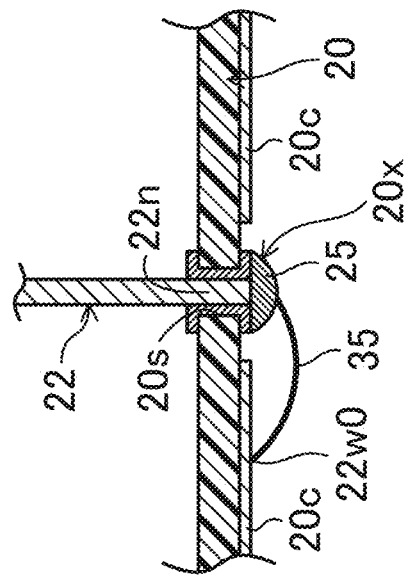
FIGS. 19A and 19B show a third embodiment of the present disclosure, with FIG. 19A being a diagram in which a second grounding site provided to the housing is disposed at a position away from the housing, and FIG. 19B a cross section of the configuration around the second grounding site.
Figure 19A:
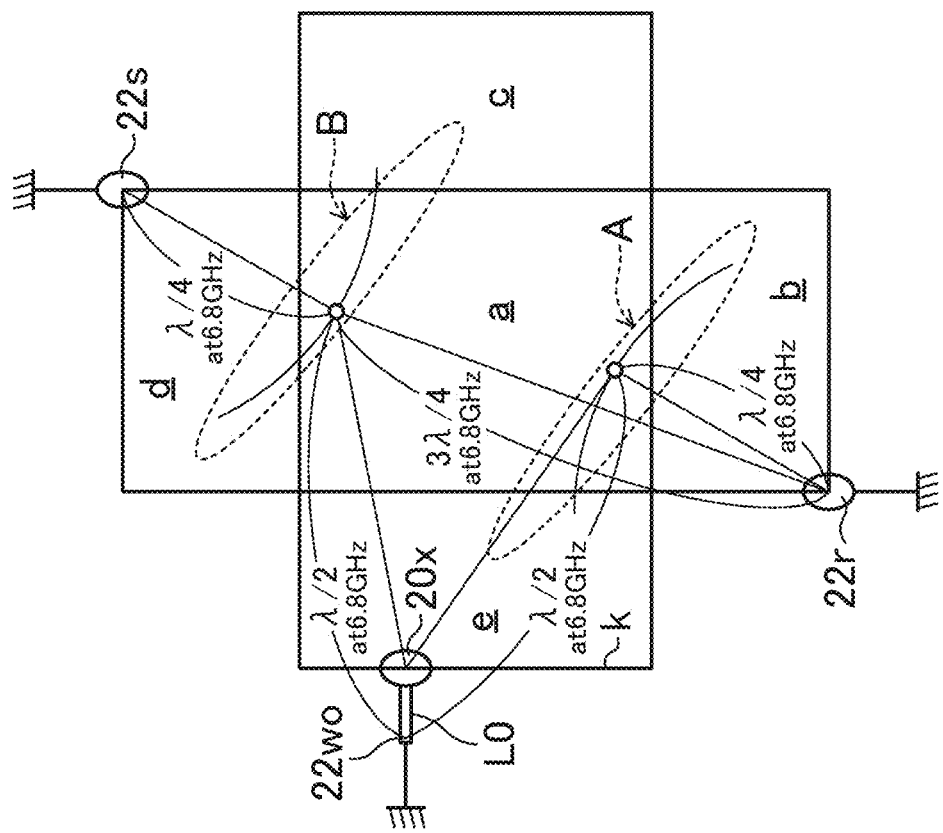

FIGS. 19A and 19B show a third embodiment of the present disclosure.

In FIG. 11, which shows the first embodiment, the second grounding site 22$w$ is disposed on the bottom edge k of the left face e of the housing 22, but here a second grounding site 22$wo$ is disposed at a position that is away from the housing 22.

More specifically, in FIG. 19A, the second grounding site (second site) 22$wo$ is disposed at the distal end of an extension line Lo, with this extension line Lo connected to the bottom edge k of the left face e of the housing 22, when the distance from the high impedance range B in a developed view of the housing 22 to the bottom edge k of the left face e of the housing 22 is less than the distance of half a wavelength ($\lambda/2$) at a specific oscillation signal (in FIG. 19A, 6.8 GHz) of the VCO/PLL circuit 3.

As shown in FIG. 19B, the extension line Lo is such that a leg 22$n$ provided to the bottom edge k of the left face e of the housing 22 is inserted into a through-hole 20$s$ in a land 20$x$ provided in an ungrounded state to the main board 20, and the leg 22$n$ is fixed with solder 25, after which one end of a metal line 35 (serving as the extension line Lo) is connected to a portion of this solder 25, and the other end of the metal line 35 is connected to the grounding pattern 20$c$ disposed on the rear face of the main board 20 (as the second grounding site 22$wo$).

Since the metal line 35 is a point-to-point construction, in FIG. 19A the configuration is such that the combined length of the metal line 35 and the distance from the high impedance range B of the housing 22 to the bottom edge k of the left face e of the housing 22 will be equal to a distance of half a wavelength ($\lambda/2$) at a specific oscillation signal (in FIG. 19A, 6.8 GHz) of the VCO/PLL circuit 3.

Therefore, in this embodiment, even if the housing is relatively small in size, the second grounding site 22$wo$ that is separated from the housing 22 will be able to reduce the impedance over a wide range of the high impedance range B of that housing 22.

Furthermore, with this configuration, as can be seen from FIG. 19A, even though a site that is separated from both of the two high impedance ranges A and B of the housing 22 by a distance of half a wavelength ($\lambda/2$) at the oscillation frequency (6.8 GHz) is on the outside of a developed view of the housing 22, the impedance can easily be lowered in both of the high impedance ranges A and B by the second grounding site 22wo that is separated from the housing 22.

Modification Examples

FIGS. 20A to 20C show modification examples of this embodiment.

In the third embodiment, the second grounding site 22wo was disposed outside the housing 22, but in this modification example, the second grounding site is disposed in an area of the main board (specific area) located under the housing 22.

In FIG. 20A, a second grounding site (second site) 22w1 is disposed toward an area of the main board located under the housing 22, with the extension line Lo between it and the bottom edge k of the left face e of the housing 22.

A specific example of this is shown in FIG. 20B. In FIG. 20B, the leg 22n provided to the bottom edge k on the left face e of the housing 22 is attached with solder 25 to a land 20x of the main board 20. Copper foil, for example, constituting the grounding pattern 20c is cut away around this land 20x of the main board 20, and the copper foil is cut away so as to form a wiring pattern (wire) 20m as the extension line Lo that faces toward an area of the main board located under the housing 22 from this land 20x. Therefore, the leg 22n of the housing 22 is connected to the grounding pattern 20c via the linear wiring pattern 20m, and the connection point between the wiring pattern 20m and the grounding pattern 20c forms the second grounding site 22w1.

The length of the wiring pattern 20m is determined as follows. In this modification example, since the wiring pattern 20m is disposed on the main board 20, the wavelength $\lambda'$ of the oscillation signal is shortened on the main board 20 by the dielectric constant er of the main board 20 to $1/(er^{1/2})$ the wavelength $\lambda$ in a vacuum. For example, if the distance from the position of the high impedance range B of the housing 22 to the bottom edge k of the left face e of the housing 22 is 90% of the wavelength $\lambda/2$ in the air (two times $\lambda/4$), then a distance of 10% of $\frac{1}{4}$ times the wavelength $\lambda'$ at the dielectric constant er should be used for the line length of the wiring pattern 20m. More specifically, if we let the dielectric constant er of the main board 20 be 4, and the oscillation frequency f of the oscillation signal be 8 GHz, then the wavelength $\lambda'$ at the dielectric constant er is as follows.

$$\lambda' = (1/(er^{1/2}))\lambda = (\frac{1}{2})\times(c/f)$$

c: speed of light=$(\frac{1}{2})\times(3\times10^8/(8\times10^9))=0.01875$
m=18.75 mm Therefore, the line length can be calculated as 18.75×($\frac{1}{4}$)×0.1=0.46875 mm 0.5 mm FIG. 20C is a cross section along the C-C line at the site of the wiring pattern 20m in FIG. 20B. If the characteristic impedance of the extension line Lo (the wiring pattern 20m) on the main board 20 is set to 75Ω to match the typical design specifications of a tuner device used for television broadcasts, and if we let the dielectric constant er of the main board 20 be 4 and the height h be 400 μm, and if we let the thickness t of the wiring pattern 20m be 35 μm, for example, then if we use an ordinary line impedance design tool to calculate the width s of the wiring pattern 20m and the cut-away width w of the copper foil (the spacing between the wiring pattern 20m and the grounding pattern 20c), the width s of the wiring pattern 20m and the cut-away width w of the copper foil are both calculated to be s=w=200 μm, and are decided as such. Naturally, the characteristic impedance of the extension line Lo on the main board 20 does not have to be set to 75Ω, and may be set anywhere between a few dozen ohms and a few hundred ohms, for example.

Therefore, in this modification example, since the second grounding site 22w1 is disposed in an area of the main board located under the housing 22, even if a microprocessor, a memory, or the like is disposed near the housing 22 on the outside, these devices will not get in the way, and the second grounding site 22w1 can be properly disposed at the accurate spacing of the length of the wiring pattern 20m from the housing 22.

In this modification example, the extension line Lo is formed by the wiring pattern 20m, and its shape is linear, but the wiring pattern 20m may instead be in the shape of an arc extending around the land 20; or in a shape that extends in an undulating form, or a through-hole formed in the main board 20 may be utilized to ground to the grounding pattern 20c on the rear face of the main board 20 and to extend the distance, etc.

Fourth Embodiment

A fourth embodiment of the present disclosure will now be described through reference to FIG. 21.

In the first embodiment shown in FIG. 11, in a developed view of the housing 22, the second grounding site (second site) 22w was newly disposed on the bottom edge k of the left face e of the housing 22, as a position that was two times $\frac{1}{4}$ the wavelength $\lambda$ ($\lambda/2$) of oscillation frequency (6.8 GHz) away in straight line distance from the point at the oscillation frequency of 6.8 GHz of higher impedance within the already high impedance range B, but the configuration may be such that instead of this second grounding site, the peripheral configuration of the first grounding site 22s provided to the housing 22 is deformed to lower the impedance of the high impedance range B.

Figure 21:
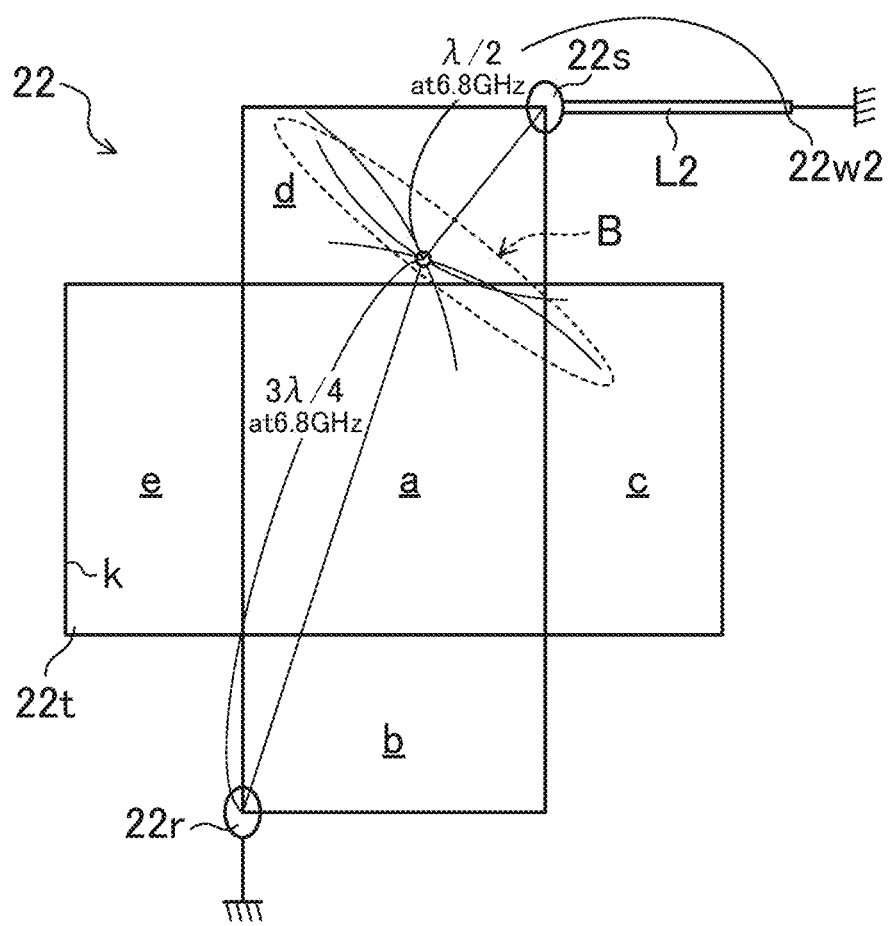
FIG. 21 shows a fourth embodiment of the present disclosure, and is a diagram in which another grounding site provided to the housing is disposed at a position away from the housing.

More specifically, in FIG. 21, taking advantage of the fact that the impedance is theoretically lower at a position that is an even-numbered multiple of $\frac{1}{4}$ the wavelength $\lambda$, of the oscillation signal away from a grounding site than a predetermined specific impedance, a configuration is employed in which one end of an extension line L2 is connected to the right corner 22s of the rear face d of the housing 22, the other end of this extension line L2 is grounded, and the distance from this grounding site 22w2 (the other end of the extension line L2) (second site), through the extension line L2 and the right corner 22s of the rear face d of the housing 22, to a point of high impedance in the high impedance range B is set to be an even-numbered multiple of (two times) $\frac{1}{4}$ the wavelength $\lambda$ (=$\lambda/2$) at the oscillation frequency (6.8 GHz) of the oscillation signal.

Therefore, with this embodiment, when extension line L2 is a point-to-point construction, there is no reduction of the wavelength tied to dielectric constant, so the line length of the extension line L2 may be the actual length found by subtracting the distance between the high impedance point and the right corner 22s of the rear face d of the housing 22 from a length that is two times $\frac{1}{4}$ the wavelength $\lambda$ (=$\lambda/2$) at the oscillation frequency (6.8 GHz) of the oscillation signal.

Modification Example of Extension Line

Figure 22A:
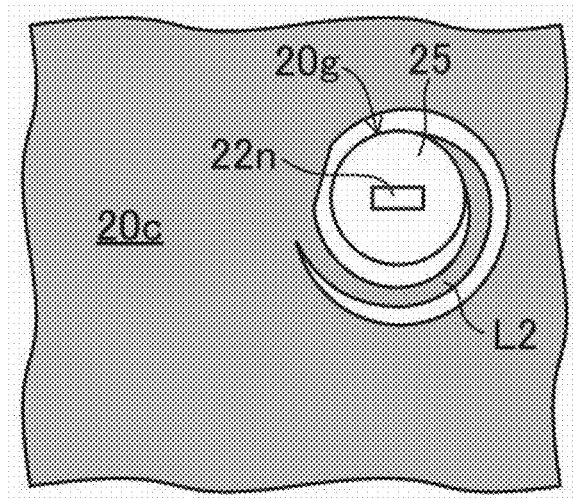
FIGS. 22A, 22B and 22C show a modification example of an extension line disposed in an area of the main board located under the housing, with FIG. 22A showing an example in which the extension line is arc-shaped, FIG. 22B an example in which an arc shape and a linear shape are combined, and FIG. 22C an example of an undulating shape.
Figure 22B:
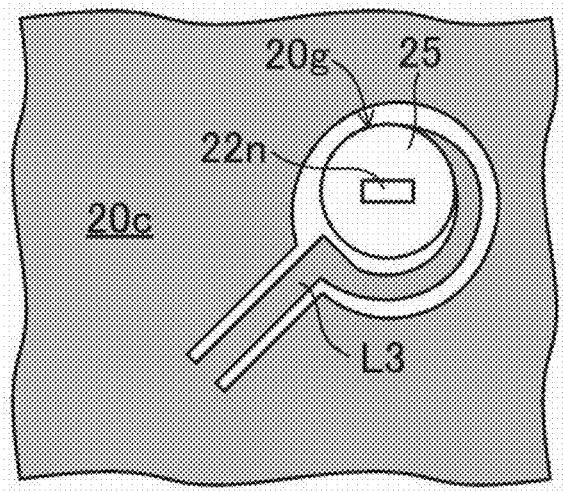
Figure 22C:
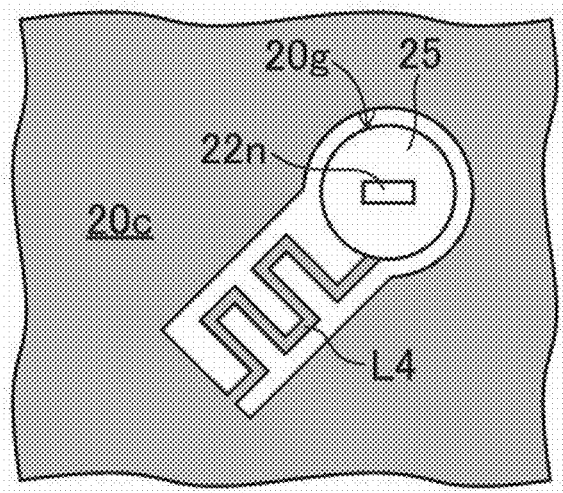

FIGS. 22A to 22C show first modification examples of the extension line L extending from a corner of the housing 22. In the above embodiment, instead of having the extension line L be linear in shape, the extension line L2 was formed in the shape of an arc extending so as to surround the outside of the land 20g in FIG. 22A. FIG. 22B shows an extension line L3 formed in a combination of an arc shape that extends surrounding the outside of the land 20g and a linear shape that extends from the distal end of the arc toward an area of the main board located under the housing 22. FIG. 22C shows an extension line IA formed in a crenelated shape that extends from the land 20g. In these modification examples, it is possible to ground to a position near the land 20g, so interference with other wiring of the tuner circuit can be avoided, and a decrease in the grounding effect caused by greatly splitting up the grounding pattern can be prevented.

FIG. 23 shows second modification examples of the extension line L. In the drawings, the line length is adjusted by utilizing a through-hole formed in the main board 20.

Figure 23A:
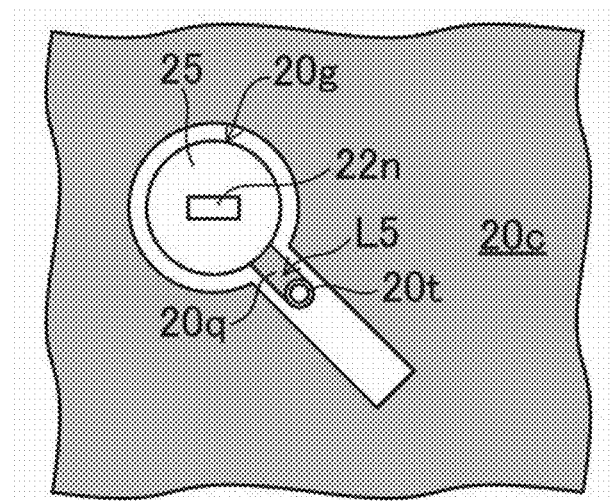
FIGS. 23A, 23B and 23C show a second modification example of this extension line, with FIG. 23A being a plan view of the connected portion between the housing and the main board, FIG. 23B a cross section, and FIG. 23C a bottom view.
Figure 23B:
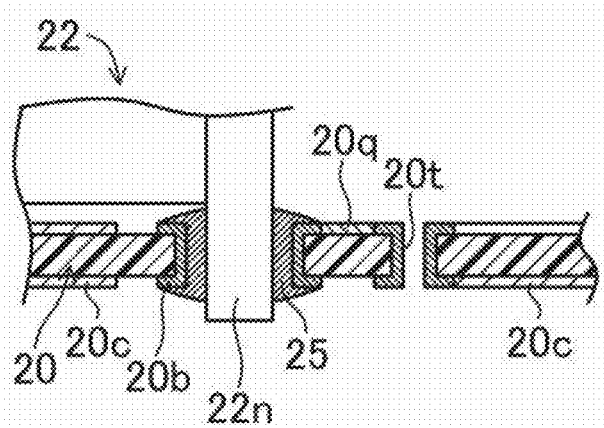
Figure 23C:
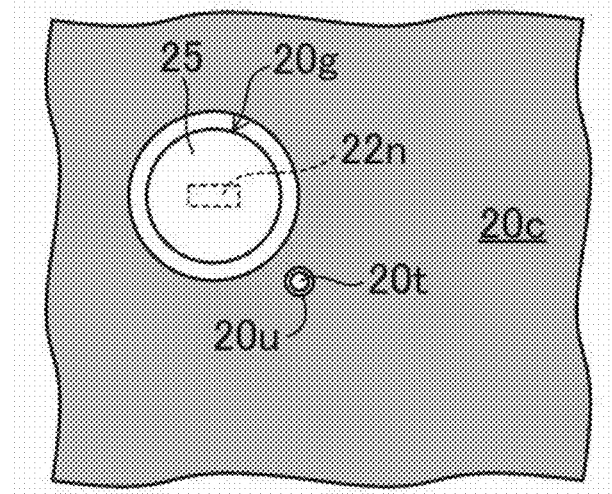

More specifically, an extension line L5 is made up of a wiring pattern 20q that extends from the ungrounded land 20g toward an area of the main board located under the housing 22 as shown in FIG. 23A, a through-hole 20t that is formed at the distal end of this wiring pattern 20q as shown in FIG. 23B, and the grounding pattern 20c that is formed on the lower face of the main board 20 and is connected to the lower end of this through-hole 20t as shown in FIGS. 23B and 23c. Therefore, in this modification example, the line length of the extension line L5 is the total length of the wiring pattern 20q plus the height of the through-hole 20t.

With the above embodiment and the first and second modification examples, since the extension lines L2 to L5 make use of wiring patterns formed on the main board 20, there is no need for other members such as metal wires, and the extension lines L2 to L5 can be simply configured.

Figure 24:
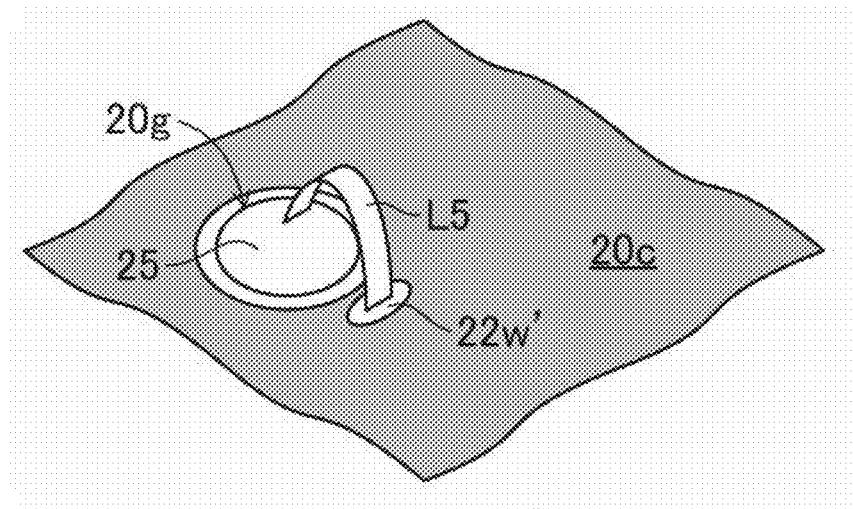
FIG. 24 shows a third modification example of this extension line, and is an oblique view in which the extension line consists of a metal wire.

FIG. 24 shows a third modification example of the extension line L. In FIG. 24, a metal wire L5 is used, one end thereof is attached to the land 20g with solder 25, and the other end is connected to the grounding pattern 20c of the main board 20, with this connection point serving as a grounding site 22w'.

Figure 25:
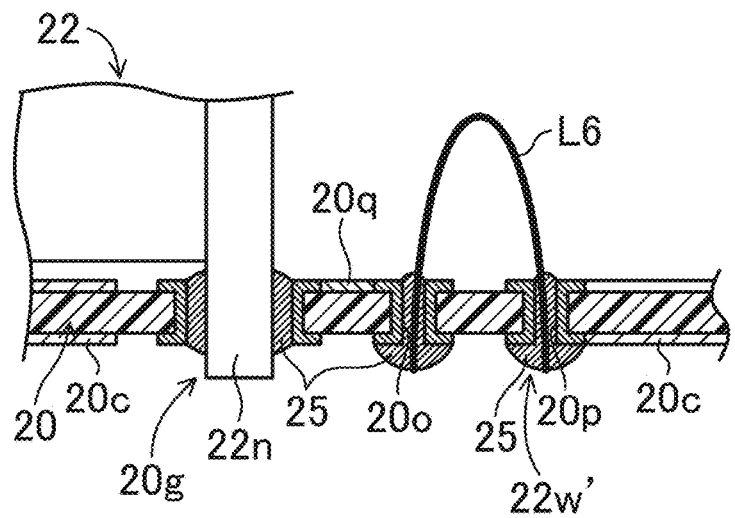
FIG. 25 shows a fourth modification example of this extension line, and is a cross section of the connected portion between the housing and the main board when the extension line consists of a wire-shaped conductor and a wiring pattern.

FIG. 25 shows a fourth modification example of the extension line L. In FIG. 25, a metal wire or other such wire-shaped conductor L6 is used as the extension line L. More specifically, the wiring pattern 20q connected to the land 20g located at a corner of the housing 22 is formed on the upper face of the main board 20, a through-hole 20o that is connected to the this wiring pattern 20q and another through-hole 20p disposed to the side of the through-hole 20o are provided, the ends of the wire-shaped conductor L6, which has been bent in an inverted U shape, are inserted into these two through-holes 20o and 20p and attached with solder 25, and the lower end of the through-hole 20p is connected to the grounding pattern 20c formed on the lower face of the main board 20.

Therefore, in this fourth modification example, the distance between the corner of the housing 22 (land 20g) and the grounding site 22w' can be adjusted merely by adjusting the length of the wire-shaped conductor L6 and the wiring pattern 20q.

Figure 26:
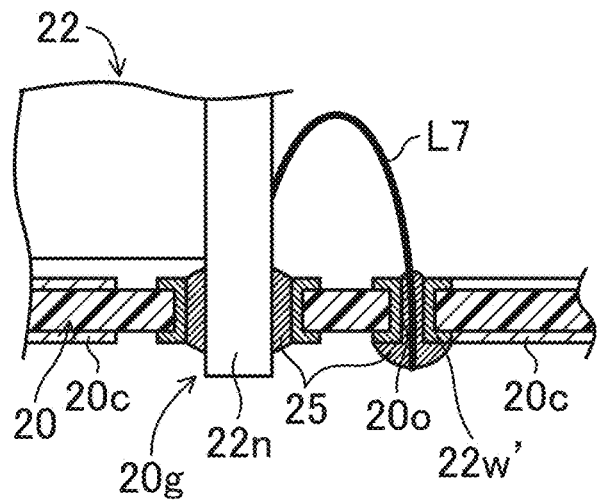
FIG. 26 shows a fifth modification example of this extension line, and is a cross section of the connected portion between the housing and the main board when the extension line consists of a flat spring-shaped conductor.

FIG. 26 shows a fifth modification example of the extension line L. In FIG. 26, a through-hole 20o is formed to the side of the land 20g located at a corner of the housing 22, one end of a leaf spring-shaped conductor L7 is inserted into this through-hole 20o and the one end of the conductor L7 is attached to the through-hole 20o with solder 25 while the other end contacts with the side face of the housing 22, and the lower end of the through-hole 20o is connected to the grounding pattern 20c formed on the lower face of the main board 20.

Therefore, in this modification example, the distance between the corner of the housing 22 (land 20g) and the grounding site 22w' can be adjusted merely by adjusting the length of the leaf spring-shaped conductor L7.

In all of the modification examples of the extension line L described above, the length of the extension line L can be freely increased or decreased, so the distance from the high impedance point P of the housing 22 to the grounding site 22w can be accurately set to an even-numbered multiple of ¼ the wavelength λ, regardless of the oscillation frequency range of the oscillation signal of the VCO/PLL circuit 3.

Fifth Modification Example

A fifth modification example of the present disclosure will now be described through reference to FIGS. 27A and 27B.

In the fourth embodiment (FIG. 21), grounding was done at the grounding site 22w2 from the right corner 22s of the rear face d and through the extension line L2 in a developed view of the housing 22, but in this embodiment, the grounding site 22w2 is an open site, rather than being grounded, and the length of the extension line L2 is changed.

Figure 27B:
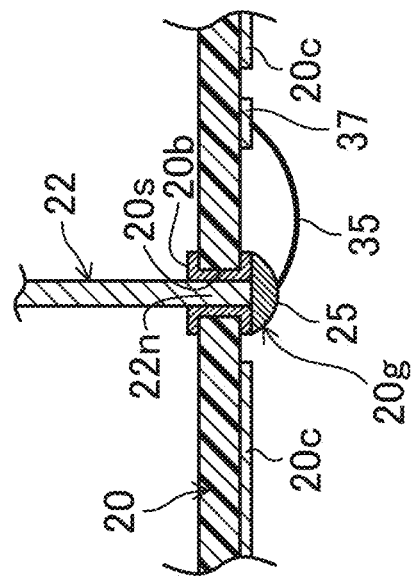
FIGS. 27A and 27B show a fifth embodiment of the present disclosure, with FIG. 27A being a diagram in which an open site provided to the housing is disposed at a position away from the housing, and FIG. 27B showing the configuration around the open site.
Figure 27A:
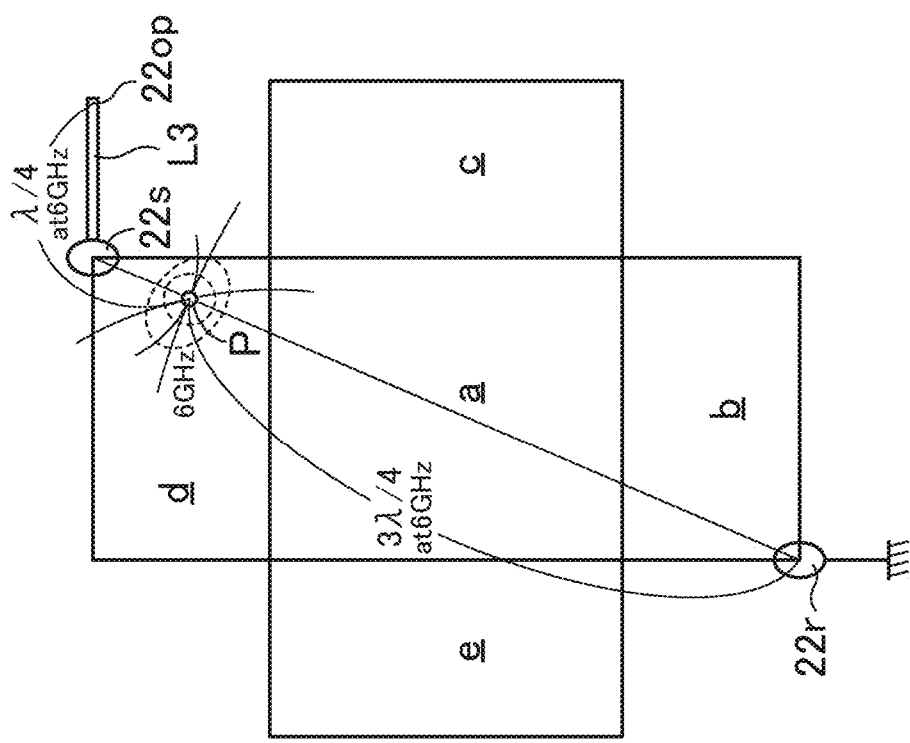

More specifically, in this embodiment, in the developed view of the housing 22 in FIG. 27A, one end of the extension line L3 is connected to the right corner 22s of the rear face d, and the other end of this extension line L3 is open, so that the other end of the extension line L3 serves as an open site (second site) 22op of the housing 22.

In a developed view of the housing 22, the point P is the point nearest the right corner 22s of the rear face d among points of a distance that is three times ¼ the wavelength λ at the lowest frequency (in the drawing, 6 GHz) in the variable frequency range of the oscillation signal of the VCO/PLL circuit 3 from the left corner 22r of the front face b (points within the high impedance range B shown in FIG. 6B), and line length of the extension line L3 is set so that the total distance obtained by adding the distance from this point P to the land 20g at the right corner 22s of the rear face d of the housing 22 and the distance from this land 20g to the open site 22op (that is the line length of the extension line L3) will correspond to a value (λ/4) that is an odd-numbered multiple of (one times) ¼ the wavelength λ at the lowest frequency (6 GHz) in the variable frequency range of the oscillation signal.

As already discussed, with a housing 22 in which the oscillation frequency of the oscillator is high and the impedance is distributed element manner, by using the grounding site of the left corner 22r of the front face b as a reference impedance, the impedance is higher than a predetermined specific impedance at the point P that is an odd-numbered multiple (three times) of λ/4 away from this grounding site in straight line distance in a developed view, but with this embodiment, since the impedance at the point P can be lowered to be less than a specific impedance, which is a site at a distance that is an odd-numbered multiple (one times) of ¼ the wavelength λ at the lowest frequency (6 GHz) of the oscillation signal away from the open site 22op of the housing 22 (the other end of the extension line L3), the impedance can be actively lowered in the range around the high impedance point P.

If the extension line L3 is a point-to-point construction, there will be no reduction in wavelength tied to dielectric constant. Therefore, the actual line length of the extension line L3 may be used in calculating the distance to the high impedance point P.

The configuration in which the other end of the extension line L3 is open can be the configuration shown in FIG. 27B, for example. The configuration in FIG. 27B, as can be seen from a comparison of the configuration in FIG. 19B, is such that the other end of the metal line 35 constituting the extension line L3 is connected to an ungrounded pattern (first conductor) 37, which is an open pattern that is not connected to the grounding pattern 20c disposed on the rear face of the main board 20, on the rear face of the main board 20, and the other end of the metal line 35 is open.

A configuration in which the other end of the extension line L3 is open can also be applied to the already discussed configurations in FIG. 20B, FIGS. 22A to 22C, FIGS. 23A to 23C, and FIGS. 24, 25, and 26. Here again, just as discussed above, an ungrounded pattern may be provided that is not connected to the grounding pattern 20c disposed on the rear or front face of the main board 20, and the other end of the extension line L may be connected to this ungrounded pattern. This is not shown in the drawings.

Therefore, in this embodiment, the impedance at the point P that is the high impedance range can be actively lowered by opening the other end of the extension line L3, so the occurrence of unnecessary radiation can be eliminated even more.

Sixth Embodiment

Features of this Embodiment

This embodiment makes use of a configuration in which unnecessary radiation can be easily, effectively, and reliably reduced even when any of the various dimensions of the housing 22 cannot be made less than the half wavelength ($\lambda/2$) at the highest oscillation frequency (8 GHz), as discussed above. This will be described in detail below.

Specification of Candidates of Grounding Sites

First of all, candidates of grounding sites are specified arbitrarily. These grounding sites will be described by using an example of when the number of grounding sites shown in FIG. 4A is small, that is, when two grounding sites are specified, which are the left-front corner and the right-rear corner in FIG. 4A. These specified sites may be other corners, or there may be three sites, four sites, etc., as in FIGS. 4B and 4C.

Figure 28B:
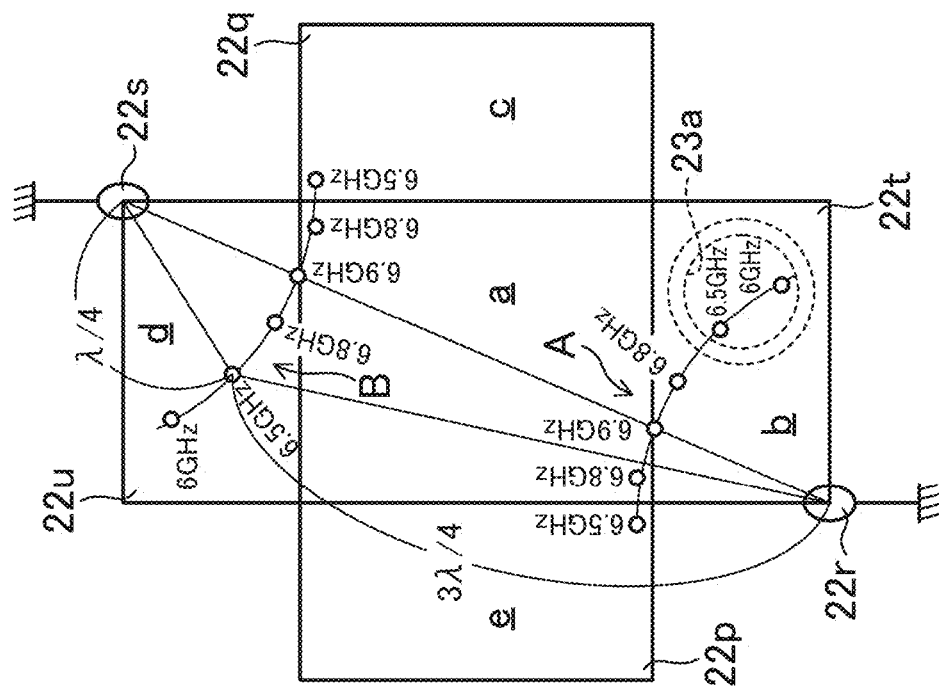
FIGS. 28A and 28B show the range of high impedance that occurs in the housing when this housing is grounded at two sites, with FIG. 28A showing the range in plan view, and FIG. 28B the range in a developed view of the housing.
Figure 28A:
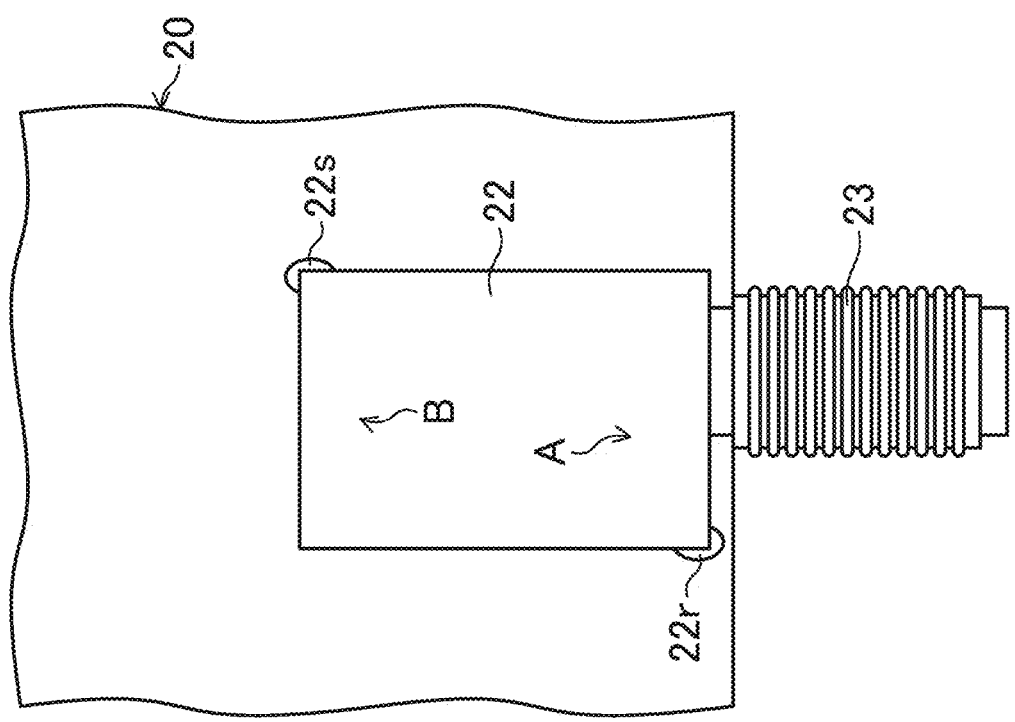

FIGS. 28A and 28B show the range where the impedance is higher in the housing 22, when the grounding sites are at the left-front corner and the right-rear corner of the housing 22, as mentioned above.

The housing 22 is formed in a tetragonal shape by working a single piece of sheet metal. FIG. 7 is a developed view of the housing 22, and the four-sided housing 22 is produced by bending the four side faces b to e with respect to the top face a in the developed view of the housing 22. Legs 22h, 22i, 22j, and 22k that extend downward for grounding to the main board 20 are formed at the both lower corners of the front face b, in which an attachment hole 23a for the F-type connector 23 is formed, and the rear face d, and four-sided holes 22l, 22m, 22n, and 22o are formed at positions above these legs 22h to 22k, respectively. Protrusions 22c, 22e, 22f, and 22g that fit into the holes 22l to 22o formed in the front face b and the rear face d are formed at both lower corners of the two side faces c and e that touch the front face b and the rear face d when folded. The housing 22 is then connected, in a state in which the single piece of sheet metal has been bent and its assembly completed, to the grounding pattern 20c of the main board 20.

The main board 20, meanwhile, is configured as follows. FIG. 8A shows the main board 20, on which the housing 22 is disposed, as seen from the rear face. The main board 20 shown in FIG. 8A has lands 20e to 20h formed at positions corresponding to the four corners of the housing 22. The lands 20e and 20g corresponding to the two corners 22r and 22s of the housing 22 serving as the grounding sites are connected to the grounding pattern 20c disposed on the rear face of the main board 20, and the other two lands 20f and 20h are not connected to the grounding pattern 20c. In FIG. 8A, 20d is a land for connecting the F-type connector 23 to a signal pattern (not shown) on the main board 20.

As shown in FIGS. 8B and 8C, the four lands 20e to 20h of the main board 20 have through-holes 20s formed at positions corresponding to the four corners of the housing 22. At the lands 20e and 20g corresponding to the two corners 22r and 22s serving as the grounding sites of the housing 22, as shown in FIG. 8B, the through-holes 20s are connected to the grounding pattern 20c disposed on the front face and/or rear face of the main board 20, and at the lands 20f and 20h corresponding to the other two corners 22t and 22u of the housing 22 that are not grounded, as shown in FIG. 8C, the through-holes 20s are not connected to the grounding pattern 20c.

As shown in FIG. 8A, of the legs 22h to 22k on the front face b and the rear face d of the housing 22, the leg 22h in the left corner 22r of the front face b and the leg 22k in the right corner 22s of the rear face d that are to be grounded are inserted into the through-holes 20s in the main board 20, and in this state the through-holes 20s and the legs 22h and 22k are attached with the solder 25, thus connecting these legs 22h and 22k to the grounding pattern 20c of the main board 20.

Meanwhile, at the two corners 22t and 22u of the housing 22 that are not grounded, just as with the corners 22r and 22s that are grounded, the legs 22i and 22j are inserted into the through-holes 20s of the main board 20, and in this state the through-holes 20s and the legs 22i and 22j are attached with the solder 25, thus fixing the two corners 22t and 22u of the housing 22 that are not grounded, to the lands 20f and 20h of the main board 20, but not connecting them to the grounding pattern 20c.

With the above configuration, in this embodiment, because of the configuration of the housing 22 shown in FIG. 7, in a state in which a single piece of sheet metal has been bent into the hollow, four-sided housing 22, the lower corner 22p of the left face e and the upper corner 22q of the right face c will have a low degree of grounding through mechanical engagement between the protrusions 22c and 22f and the holes 22l and 22o in FIG. 7, so as shown in FIG. 8A, when the front face lower-left corner 22r and the rear face lower-right corner 22s of the housing 22 are grounded, in the developed view of the housing 22 shown in FIGS. 28A and 28B, the left corner 22r of the front face b and the right corner 22s of the rear face d will be the grounding potentials, and the grounding effect at the two corners 22p and 22q with the above-mentioned low degree of grounding can be ignored.

Establishing High Impedance Range in Housing

As discussed above, the highest frequency of the oscillation signal at the VCO/PLL circuit 3 is 8 GHz, and when the wavelength $\lambda$ shortens to about 40 mm, if the size of the housing 22 exceeds the half wavelength ($\lambda/2$), then impedance will be a distributed element in the housing 22, which serves as the propagation path for the oscillation signal. With this distributed element circuit, a grounding site serves as the reference impedance, and a site that is an odd-numbered multiple of $\lambda/4$ away from this grounding site will be an open end, resulting in high impedance. When a plurality of grounding sites are provided, overlapping parts of sites that are an odd-numbered multiple of $\lambda/4$ away from these grounding sites will have the highest impedance.

More specifically, in the developed view of the housing 22 shown in FIG. 28B, as discussed above, there are two ground potentials, namely, the left corner 22r of the front face b and the right corner 22s of the rear face d, so the highest impedance is at a site that is an odd-numbered multiple of λ/4 away from both of these grounding sites 22r and 22s. In FIG. 28B, there are drawn a high impedance range A in which a high impedance portion that is λ/4 away from the left corner 22r of the front face b overlaps a high impedance portion that is three times λ/4 away from the right corner 22s of the rear face d, and a range B in which a high impedance portion that is λ/4 away from the right corner 22s of the rear face d overlaps a high impedance portion that is three times λ/4 away from the left corner 22r of the front face b. When the left corner 22r of the front face b and the right corner 22s of the rear face d thus serve as ground potentials in a developed view of the housing 22, the high impedance ranges A and B occur in the lower-left corner and the upper-right corner of the top face a, and the front face b and the rear face d. In the above-mentioned high impedance ranges A and B, the points indicated by circles show a high impedance point that is λ/4 away from the left corner 22r of the front face b and is three times λ/4 away from the right corner 22s of the rear face d, and a high impedance point that is λ/4 away from the right corner 22s of the rear face d and is three times λ/4 away from the left corner 22r of the front face b, when the frequency of the oscillation signal of the VCO/PLL circuit 3 is 6 GHz, 6.5 GHz, 6.8 GHz, and 6.9 GHz.

Therefore, in the developed view of FIG. 28B, a large amount of unnecessary radiation occurs in the above-mentioned two high impedance ranges A and B.

Figure 29:
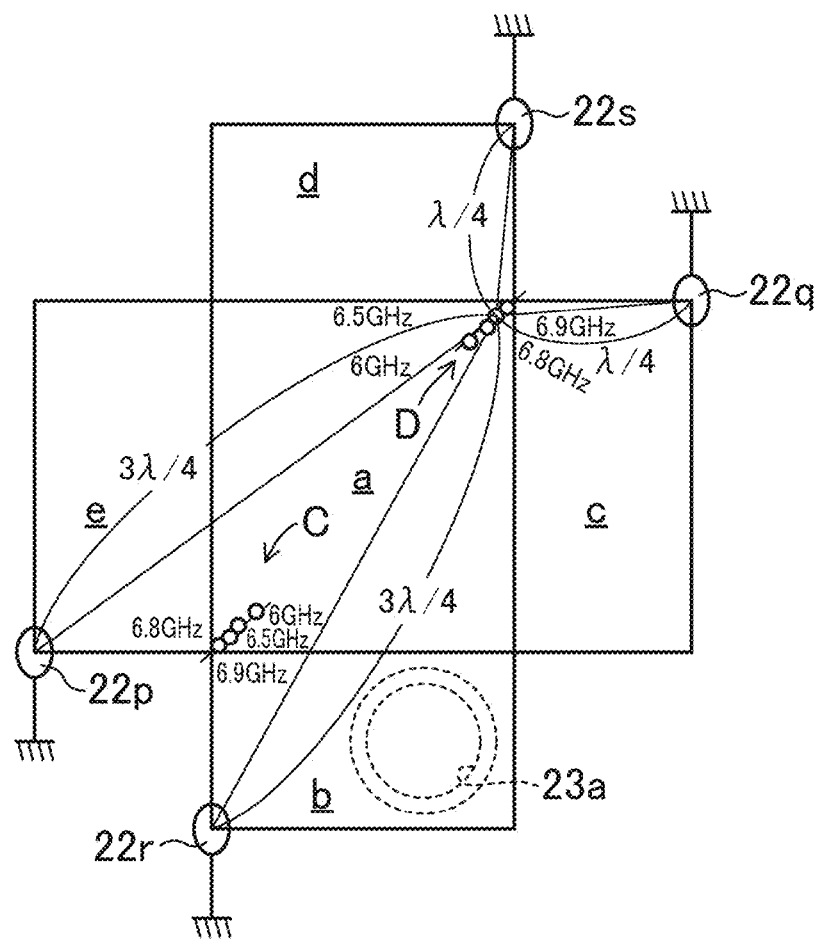
FIG. 29 shows a high impedance range in a developed state of the housing, when the housing has been grounded on the main board at two sites, namely, the left-front corner and the right-rear corner.

FIGS. 28A and 28B show the high impedance ranges A and B that occur when the sheet metal shown in FIG. 7 is bent into the housing 22, but if the degree of grounding is increased by securely joining the places where the front face b and the rear face d touch the right face c and the left face e by soldering, etc., after bending the sheet metal shown in FIG. 7, for example, then as shown in FIG. 29, the lower corner 22p of the left face e and the left corner 22r of the front face b will have the same potential, and the upper corner 22q of the right face c and the right corner 22s of the rear face d will have the same potential, these will serve as the ground potentials, and there will be four grounding sites in a developed view of the housing 22. In this case, the high impedance ranges C and D occur in the lower-left corner and the upper-right corner of the top face a, and a large amount of unnecessary radiation is generated from these ranges C and D.

Figure 30:
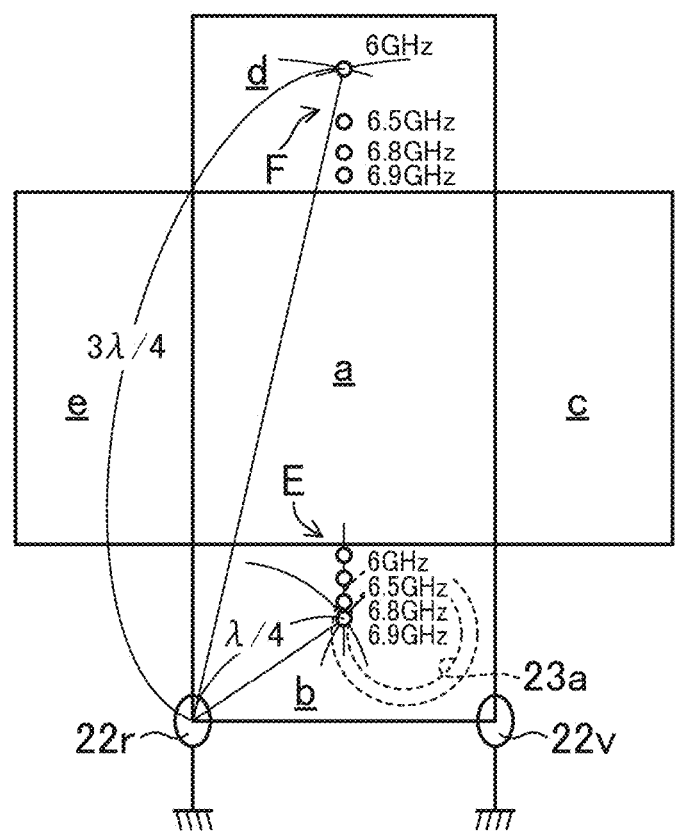
FIG. 30 shows a high impedance range in a developed state of the housing, when the housing has been grounded on the main board at two sites, namely, the left-front corner and the right-front corner.

FIG. 30 shows the state when the housing 22 is produced using the sheet metal shown in FIG. 7, and the left corner 22r and the right corner 22v of the front face b (two sites) have been grounded. In these drawings, the high impedance ranges E and F occur in the middle upper part of the front face b and the middle upper part of the rear face d, and a large amount of unnecessary radiation is generated from these ranges E and F. With this grounding, the surface area of the high impedance ranges is smaller than with the grounding shown in FIGS. 28A and 28B or the grounding shown in FIG. 29, but some still occurs.

Reducing High Impedance Range of Housing

As discussed above, high impedance ranges occur in the housing 22, and the location and surface area of these high impedance ranges vary with the grounding sites of the housing 22. In this embodiment, a configuration is employed that reliably reduces the size of these high impedance ranges. This will be described in specific terms below.

FIG. 31A shows a configuration in which the high impedance ranges that occur in the housing are reduced in size by modifying the configuration of grounding the left corner 22r of the front face b and the right corner 22s of the rear face d to the grounding pattern 20c of the main board 20 in the developed view of the housing 22 in FIG. 28B, that is, in the grounded state shown in FIG. 28B.

In this drawing, the high impedance range B (see FIGS. 28A and 28B) that occurred in the developed view of the housing 22 is reduced in size. As previously discussed, with a housing 22 in which the oscillation frequency of the oscillator is high and impedance is a distributed element, when a grounding site is used as the reference impedance, at a position that is an odd-numbered multiple of ¼ away from this grounding site, the impedance is higher than a predetermined impedance. Therefore, in the developed view of the housing 22 shown in FIG. 28B, the range over which an area that is three times λ/4 away from the left corner 22r of the front face b in straight line distance overlaps an area that is one times λ/4 away from the right corner 22s of the rear face d becomes the high impedance range B.

In this embodiment, as can be seen from FIG. 31A, a configuration is employed in which the left corner (first specific first site (first site)) 22r of the front face b is grounded, one end of the extension line L is connected to the right corner 22g of the rear face d, the other end (second specific first site (second site)) of this extension line L is used as the grounding site 22w, and the housing 22 is connected to the grounding pattern 20c of the main board 20.

FIG. 31B shows a specific example of a configuration in which the right corner 22g of the rear face d is grounded to the grounding pattern 20c of the main board 20 via the extension line L.

In FIG. 31B, a leg 22n provided to the right corner of the rear face d of the housing 22 is inserted into a through-hole 20s in the ungrounded land 20g provided to the main board 20, and the leg is attached with solder 25, after which one end of a metal line 35 (the extension line L) is connected to a portion of this solder 25, and the other end of this metal line 35 is connected to the grounding pattern 20c disposed on the rear face of the main board 20.

In this embodiment, in the developed view of the housing 22 in FIG. 31A, if we let P be the point nearest the right corner 22g of the rear face d out of the points at a distance that is three times ¼ the wavelength λ at the highest frequency (6 GHz in the drawing) in the variable frequency range of the oscillation signal of the VCO/PLL circuit 3 from the left corner (first specific first site (first site)) 22r of the front face b (the points within the high impedance range B shown in FIG. 28B), the line length of the extension line L is set so that the combined distance of the distance from this point P to the land 20g of the right corner of the rear face d of the housing 22 and the distance from this land 20g to the grounding site 22w (that is, the line length of the extension line L) will correspond to one times ¼ the wavelength λ at the lowest frequency (6 GHz) in the variable frequency range of the oscillation signal. That is, the line length of the extension line L is set so that an area that is three times ¼ the wavelength λ in the variable frequency range of the oscillation signal of the VCO/PLL circuit 3 from the left corner (first specific first site (first site)) 22r of the front face b of the housing 22 (this area (first specific first area (first area)) is indicated by the thick solid line in FIG. 31A), and an area that is one times ¼ the wavelength λ in the variable frequency range from the grounding site (second specific first site (second site)) 22w (this area (second specific first area (second area)) is indicated by the thick broken line in FIG. 31A) overlap at the point P (one point).

The extension line L in this embodiment is a point-to-point construction, so wavelength contraction tied to dielectric constant does not occur. Therefore, the actual line length of the extension line L should be used in calculating the distance to the high impedance point P.

Therefore, with this embodiment, a high impedance range produced in the housing 22 will only be at the high impedance point P that occurs at the lowest frequency (6 GHz) at which the wavelength λ of the oscillation signal is the longest, so the high impedance range that is produced will be narrowest. Thus, with this embodiment, unnecessary radiation produced from the housing 22 can be effectively reduced.

Also, an example was given in this embodiment in which the high impedance range was contracted to just a single point (the high impedance point P), but the present invention is not limited to this, and can of course be similarly applied when the line length of the extension line L is set shorter than the above-mentioned line length and the range is reduced to be smaller than the conventional high impedance range B shown in FIGS. 28A and 28B even if the high impedance range is broader than the above example.

Generalized Model of Reducing High Impedance Range

Next, using a generalized model to reduce the size of the conventional high impedance range B discussed above will be described.

Figure 32B:
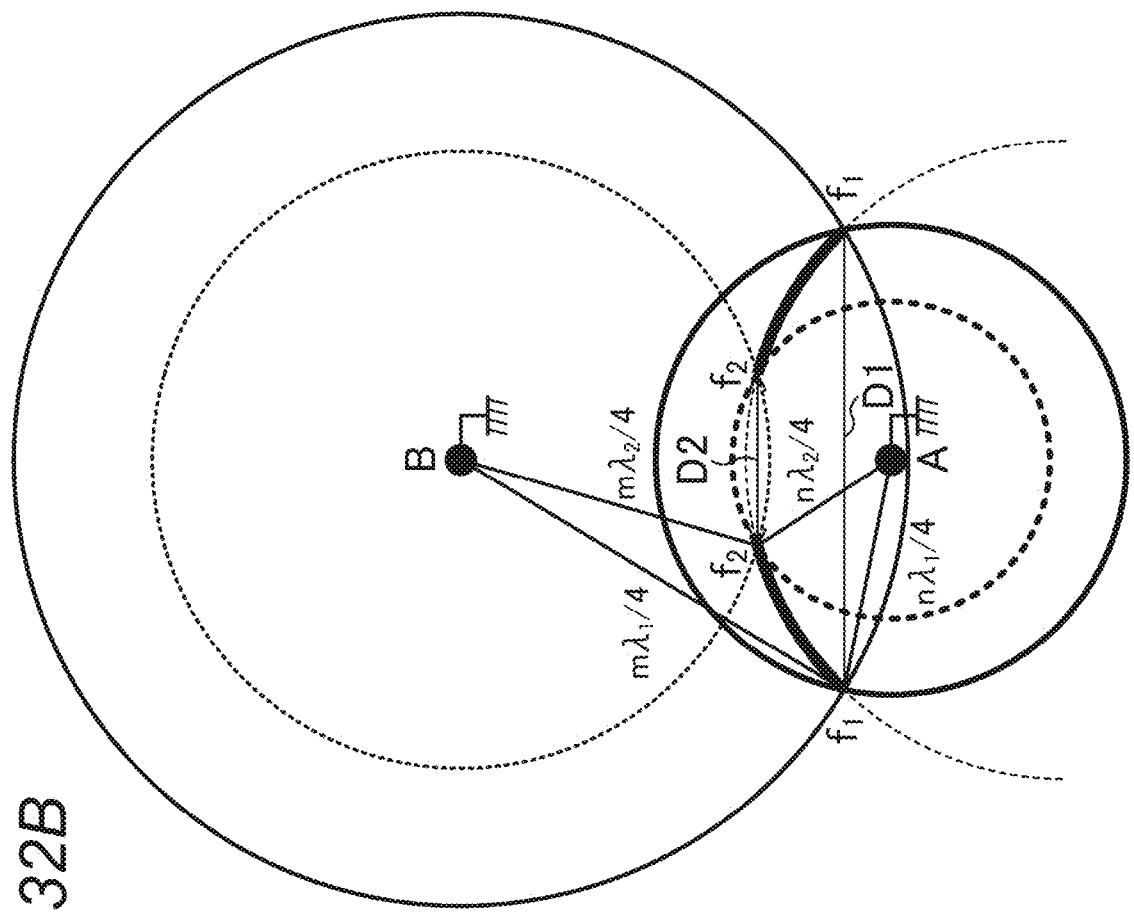
FIG. 32B shows the high impedance range that occurs when the oscillation frequency is in a range of f1≤f≤f2 on the path of this high impedance site C.
Figure 32A:
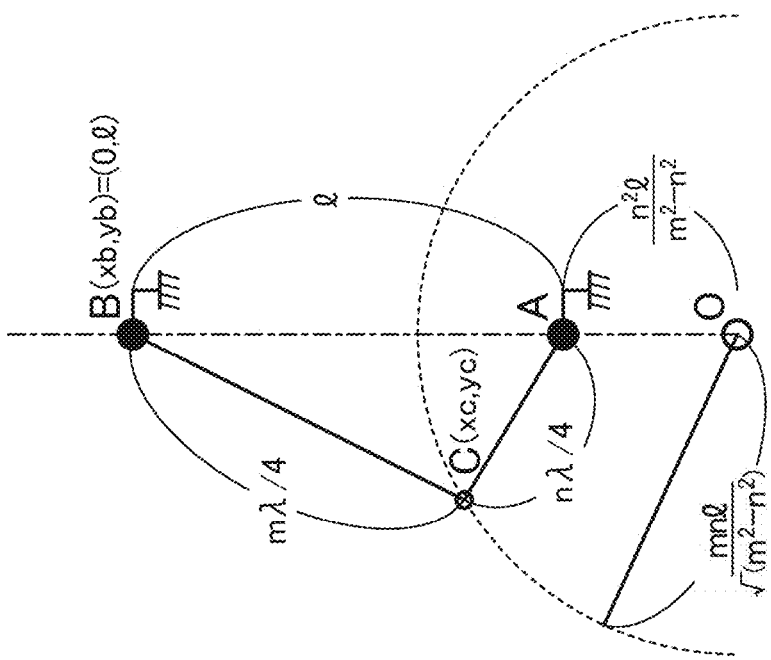
FIG. 32A shows the path of a high impedance site C produced by two grounding sites.

In FIG. 32A, points A and B are grounding sites, and are disposed at a distance 1 away from each other. Point C is separated from points A and B by nλ/4 and mλ/4, respectively. As discussed above, if the constants n and m are odd numbers, point C represents a high impedance site.

If we let the coordinates of points A, B and C be $(x_a, y_a)=(0,0)$, $(x_b, y_b)=(0,1)$, and $(x_c, y_c)$, we obtain the following equations.

$$n\lambda/4 = \sqrt{(x_c^2+y_c^2)}, m\lambda/4 = \sqrt{\{x_c^2+(1-y_c)^2\}}$$

$$\therefore m^2(x_c^2+y_c^2) = n^2\{x_c^2+(1-y_c)^2\}$$

when m=n, $y_c=\frac{1}{2}$ when m>n, $x_c^2 + \{y_c + n^2 1/(m^2-n^2)\}^2 = (nm1)^2/(m^2-n^2)$ Thus, when the wavelength λ is varied, the path of the points C becomes the center line of AB when m=n, and when m>n, the path scribes an arc with a center of $(0, n^2 1/(m^2-n^2))$ and a radius of $nm1/\sqrt{(m^2-n^2)}$.

Also, if we let the oscillation frequency be f1≤f≤f2, the wavelength λ=c/f falls within a range of λ2≤λ≤λ1 (the range drawn with a thick line in FIG. 32B in the case of an arc), and the high impedance range related to unnecessary radiation is the range of λ2≤λ≤λ1 on an arc or the above-mentioned center line AB (the range drawn with a thick line in FIG. 32B in the case of an arc).

If the high impedance range related to unnecessary radiation shown in FIG. 32B can be narrowed as much as possible, then the range of influence of the unnecessary radiation can be reduced. Also, if the high impedance range related to unnecessary radiation has been kept narrow, another impedance reduction means can be applied to this narrow high impedance range to completely eliminate unnecessary radiation.

Here, since impedance can usually be kept low within a range of a distance of λ/20 from the grounding site, it is common for a plurality of grounding sites provided to a housing or substrate, particularly one with no limitations on cost or shape, to be designed at a spacing of λ/10 between them, and for the intermediate position between these grounding sites to be at a distance of exactly λ/20 from the grounding sites.

Because of this, with the present disclosure, if the spacing between two areas of high impedance can be kept within a width range of λ/10 (specific threshold), it will be possible for the overall area of high impedance to be limited to a narrow range. This will be described in detail through reference to FIG. 32B. In FIG. 32B, when the oscillation frequency f of the VCO/PLL circuit 3 is the lowest frequency f1, for example, an area (first specific first area (first area)) on a circle with a radius of (¼) nλ1 and centered on a grounding point A (first specific first site (first site)) (this area is indicated with the thick solid line in FIG. 32B), and an area (second specific first area (second area)) on a circle with a radius of (¼) mλ1 and centered on a another grounding point B (second specific first site (second site)) (this area is indicated with the medium solid line in FIG. 32B) overlap at two points, and it is preferable if the distance D1 between these two points falls within a range of 1/10 the width λ1 (specific threshold). Similarly, when the oscillation frequency f of the VCO/PLL circuit 3 is the highest frequency f2, an area (first specific first area (first area)) on a circle with a radius of (¼) nλ2 and centered on a grounding point A (first specific first site (first site)) (this area is indicated with the thick broken line in FIG. 32B), and an area (second specific first area (second area)) on a circle with a radius of (¼) mλ2 and centered on the another grounding point B (second specific first site (second site)) (this area is indicated with the medium broken line in FIG. 32B) overlap at two points, and the distance D2 between these two points is shorter than the distance D1 between the two points at the above-mentioned lowest frequency f1 (D2<D1). The variation in the distribution of a high impedance range that can be generated by a frequency related to unnecessary radiation, and the distance between two grounding sites A and B, will now be described through reference to FIGS. 33A to 33F.

Variation in Distribution of High Impedance Range

FIG. 33A shows the case when the spacing between two points of high impedance at the highest frequency f2 related to unnecessary radiation is greater than 1/10 the wavelength λ2 at that frequency. Here, two high impedance ranges each include the total frequency range, and are the widest state. Also, the two high impedance ranges are distributed so that they are spaced apart at a spacing that is greater than 1/10 the wavelength λ2, so even if another impedance reduction means is employed, including the method discussed below, it will be difficult to lower the impedance in both of the high impedance ranges at the same time.

In FIG. 33B, the spacing between two points of high impedance at the highest frequency f2 related to unnecessary radiation is no more than 1/10 the wavelength λ2 at that frequency. Consequently, despite the fact that the two high impedance ranges each include the total frequency range, if we let D be the midpoint of a line that connects two points of high impedance at the highest frequency f2, for example, and lower the impedance at the position of this point D by using an impedance reduction means, it is possible for the impedance to be sufficiently lowered within a range that is a distance of λ/20 from point D within the two high impedance ranges. Furthermore, if the spacing between two points of high impedance is further narrowed, this will increase the frequency range that becomes a range of no more than the distance λ/20 from point D, so it will increase the frequency range of further lowered impedance within the two high impedance ranges. In the case in FIG. 33B, since the spacing between the two areas of high impedance is no more than ¹⁄₁₀ the wavelength λ2, the entire range of high impedance can be limited to a narrow range, which is bounded by the broken line in FIG. 33B. Therefore, another impedance reduction means can be used to lower the impedance in a high impedance range of an overall narrow area, so design is easier than when the impedance is lowered in a high impedance range that is a wider range.

In FIG. 33C, points of high impedance at the highest frequency f2 related to unnecessary radiation overlap at a single point. Here, the frequency at which the spacing of two points of high impedance coincides with ¹⁄₁₀ the wavelength λ at that frequency is represented as f3 in the drawing. Here, f1<f3<f2, D is the midpoint of a line connecting two points of high impedance at the frequency f3, and another impedance reduction means (including the method discussed below) is used concurrently to lower the impedance at this point D, so that the impedance can be sufficiently lowered within the range of the frequencies f3 to f2 in the two high impedance ranges. In FIG. 33C, as shown bounded by a broken line, the entire range of high impedance can be limited to a narrower range than in the case in FIG. 33B, so it is even easier to come up with a design that lowers the impedance of the high impedance range in this narrow area.

In FIG. 33D, points of high impedance at a frequency f4 that is lower than the highest frequency f2 related to unnecessary radiation overlap at a single point. Here, the frequency at which the spacing between two points of high impedance coincides with ¹⁄₁₀ the wavelength at that frequency is represented as f5 (a frequency lower than the frequency f3 in FIG. 33C (f5<f3)). Here, f1<f5<f4<f2, and even when the impedance is not lowered at point D, there are no points of high impedance at a frequency higher than the frequency f4, and if we let D be the midpoint of a line connecting two points of high impedance at the frequency f5, and another impedance reduction means (including the method discussed below) is used concurrently to lower the impedance at this point D, it is possible to sufficiently lower the impedance in the range of the frequencies f5 to f4.

In FIG. 33E, the spacing between two points of high impedance at the lowest frequency f1 related to unnecessary radiation is no more than ¹⁄₁₀ the wavelength λ1 at that frequency. In this case, f1<f4<f2, and even if the impedance is not lowered at point D, there are no points of high impedance at a frequency higher than the frequency f4, and if we let D be the midpoint of a line connecting two points of high impedance at the lowest frequency f1, and another impedance reduction means (including the method discussed below) is used concurrently to lower the impedance, it is possible to sufficiently lower the impedance over the entire frequency range f1 to f2.

In FIG. 33F, only one point (point D) of high impedance remains at the lowest frequency f1 related to unnecessary radiation, and impedance can be completely lowered over the entire frequency range of f1 to f2 by concurrently using another impedance reduction means (including the method discussed below) and to lower the impedance at this point D.

As discussed above, to narrow a high impedance range, it is necessary at least for the spacing between two points of high impedance at the highest frequency f2 related to unnecessary radiation to be ¹⁄₁₀ the wavelength at that frequency (FIGS. 33B to 33F), and if possible, it is preferable for the spacing between two points of high impedance at the lowest frequency f1 to be no more than ¹⁄₁₀ the wavelength at that frequency (FIGS. 33E and 33F) so that impedance can be lowered for the entire oscillation frequency range.

Seventh Embodiment

FIGS. 34A to 34D show a seventh embodiment of the present disclosure. In the sixth embodiment above, the grounding site 22w of the corner (land) 20g was disposed outside the housing 22, but in this embodiment, the grounding site is disposed in an area of the main board 20 in which the housing 22 is disposed (hereinafter referred to as a "specific area").

Figure 34B:
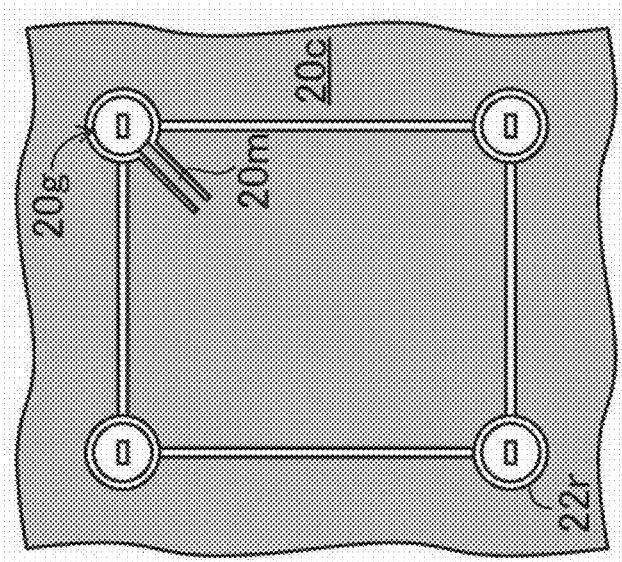
FIGS. 34A, 34B, 34C and 34D show a seventh embodiment of the present disclosure, with FIG. 34A showing how the left corner of the front face is grounded, the right corner of the rear face is grounded at a distance with an extension line disposed in an area of the main board located under the housing, and the high impedance range that occurs in the housing is narrowed to a single point, FIG. 34B showing the grounding pattern around the position on the main board where the housing is disposed, FIG. 34C showing the specific configuration of the extension line disposed in an area of the main board located under the housing, and FIG. 34D being a D-D cross section of the line in FIG. 34C.
Figure 34C:
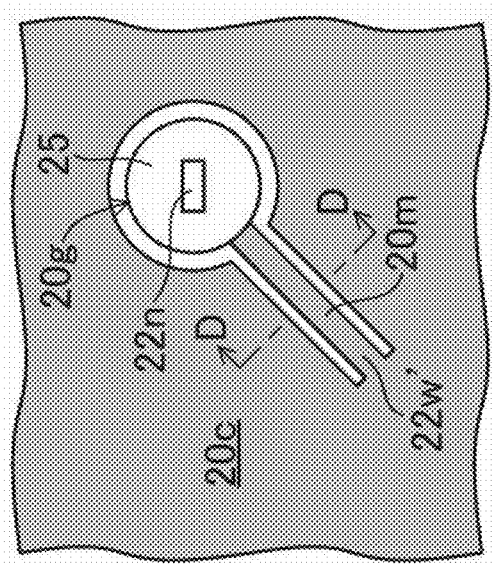
Figure 34A:
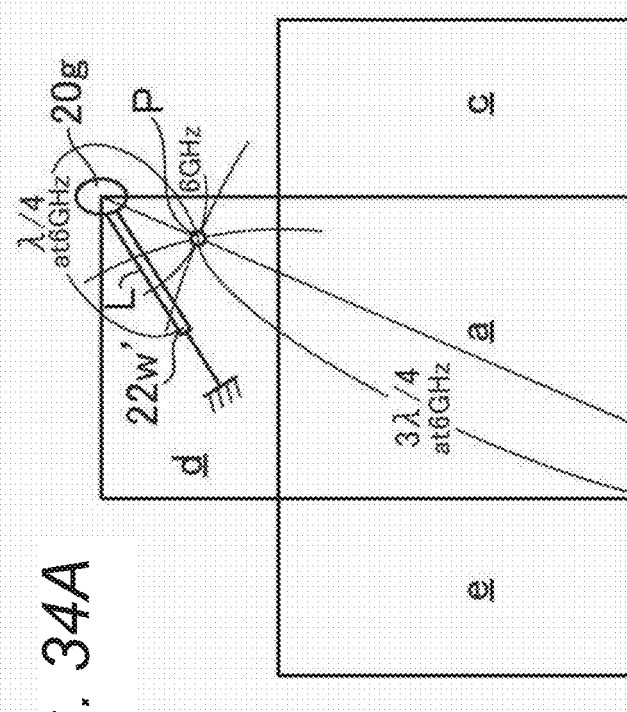

In FIG. 34A, an extension line L extends from the land 20g of the corner of the rear face d of the housing 22 toward a specific area of the main board 20 disposed under the housing 22, and the end of this extension line L is grounded as a grounding site 22w'.

A specific example of this is shown in FIGS. 34B and 34C. In FIGS. 34B and 34C, the leg 22n provided to the right corner of the rear face d of the housing 22 is attached with solder 25 to the land 20g of the main board 20. Copper foil, for example, that forms the grounding pattern 20c is cut away around the land 20g of the main board 20, and the copper foil is also cut away so as to form a wiring pattern 20m as the extension line L from this land 20g toward a specific area of the main board 20 under the housing 22. Therefore, the leg 22n of the housing 22 is connected to the grounding pattern 20c via the wiring pattern 20m, and the connection point between the wiring pattern 20m and the grounding pattern 20c forms the grounding site 22w'.

The length of the wiring pattern 20m is determined as follows. In this embodiment, since the wiring pattern 20m is disposed on the main board 20, the wavelength λ' of the oscillation signal is shortened on the main board 20 by the dielectric constant er of the main board 20 to $1/(er^{1/2})$ the wavelength λ in a vacuum. For example, if the distance from the position of the high impedance point P of the housing 22 to the right corner 22s of the rear face d of the housing 22 is 90% of ¼ times the wavelength λ, then a distance of 10% of ¼ times the wavelength λ' at the dielectric constant er should be used for the line length of the wiring pattern 20m. More specifically, if we let the dielectric constant er of the main board 20 be 4, and the oscillation frequency f of the oscillation signal be 6 GHz, then the wavelength λ' at the dielectric constant er is as follows.

$$\lambda' = (1/(er^{1/2}))\lambda = (\frac{1}{2}) \times (c/f)$$

c: speed of light=(½)×(3×10⁸/(6×10⁹))=0.025 m=25.00 mm

Therefore, the line length can be calculated as 25.00×(¼)×0.1=0.625 mm≈0.6 mm

Figure 34D:
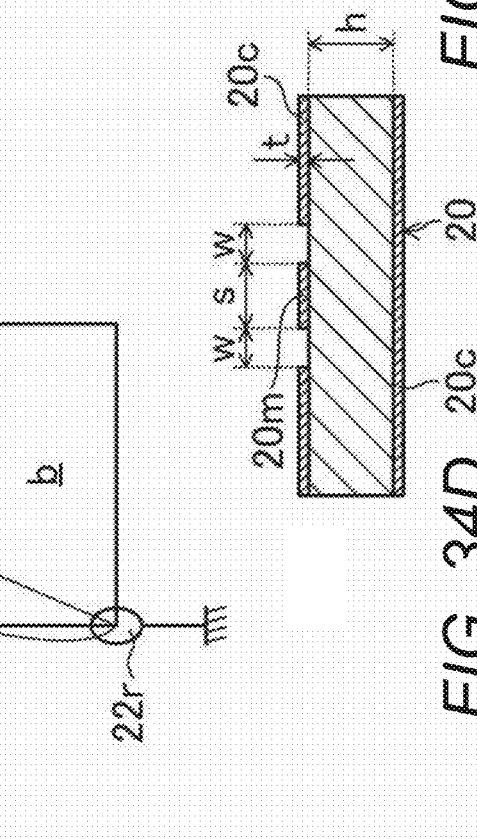

FIG. 34D is a cross section along the D-D line at the site of the wiring pattern 20m in FIG. 34C. If the characteristic impedance of the extension line L (the wiring pattern 20m) on the main board 20 is set to 75Ω to match the typical design specifications of a tuner device used for television broadcasts, and if we let the dielectric constant er of the main board 20 be 4 and the height h be 400 μm, and if we let the thickness t of the wiring pattern 20m be 35 μm, for example, then if we use an ordinary line impedance design tool to calculate the width s of the wiring pattern 20m and the cut-away width w of the copper foil (the spacing between the wiring pattern 20m and the grounding pattern 20c), the width s of the wiring pattern 20m and the cut-away width w of the copper foil are both calculated to be s=w=200 μm, and are decided as such. Naturally, the characteristic impedance of the extension line L on the main board 20 does not have to be set to 75Ω, and may be set anywhere between a few dozen ohms and a few hundred ohms, for example.

Therefore, in this embodiment, since the second grounding site 22w' is disposed in a specific area of the main board under the housing 22, even if a microprocessor, a memory, or the like is disposed near the housing 22 on the outside, these devices will not get in the way, and the second grounding site 22w' can be properly disposed at the accurate spacing of the length of the wiring pattern 20m from the housing 22.

Modification Example of Extension Line

Figure 35A:
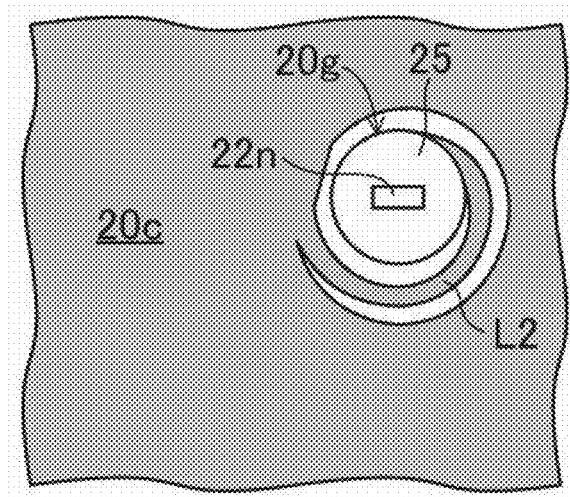
FIGS. 35A, 35B and 35C show a modification example of the line disposed in an area of the main board located under the housing, with FIG. 35A showing an example of when the line is arc shaped, FIG. 35B an example of a combination of an arc shape and a linear shape, and FIG. 35C an example of a crenelated shape.
Figure 35B:
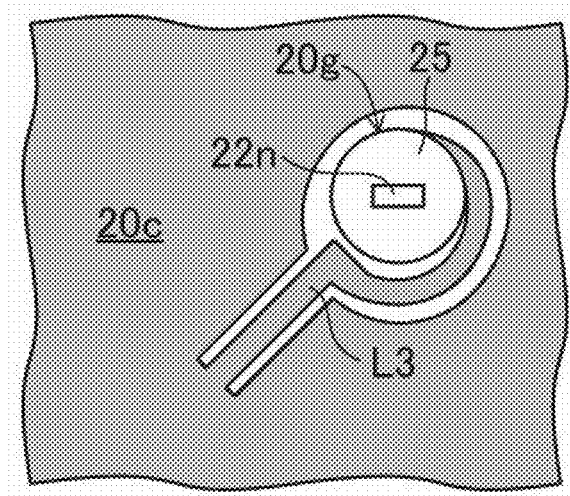
Figure 35C:
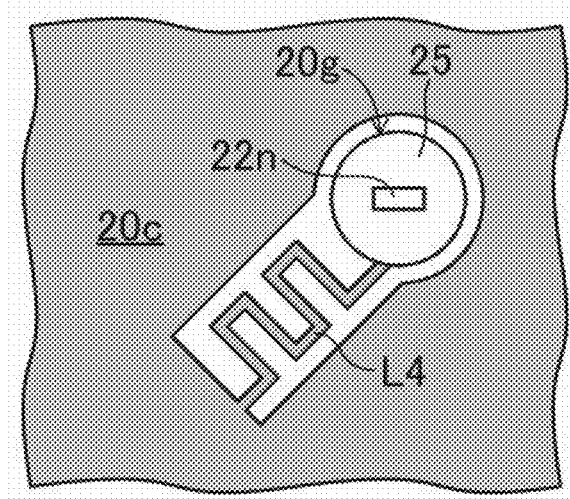

FIGS. 35A to 35C show first modification examples of the extension line L extending from a corner of the housing 22. In the above embodiment, instead of having the extension line L be linear in shape, the extension line L2 was formed in the shape of an arc extending so as to surround the outside of the land 20g in FIG. 35A. FIG. 35B shows an extension line L3 formed in a combination of an arc shape that extends surrounding the outside of the land 20g and a linear shape that extends from the distal end of the arc toward a specific area of the main board 20 under the housing 22. FIG. 35C shows an extension line L4 formed in a crenelated shape that extends from the land 20g. In these modification examples, it is possible to ground to a position near the land 20g, so interference with other wiring of the tuner circuit can be avoided, and a decrease in the grounding effect caused by greatly splitting up the grounding pattern can be prevented.

Figure 36A:
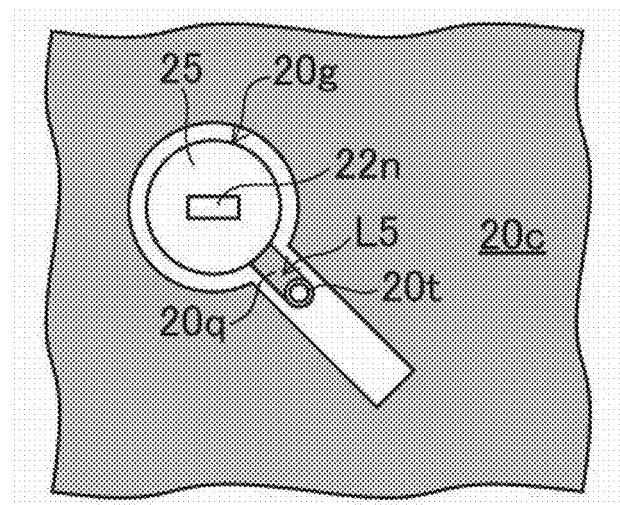
FIGS. 36A, 36B and 36C show a second modification example of this line, with FIG. 36A being a plan view of the connected portion between the housing and the main board, FIG. 36B a cross section, and FIG. 36C a bottom view.
Figure 36B:
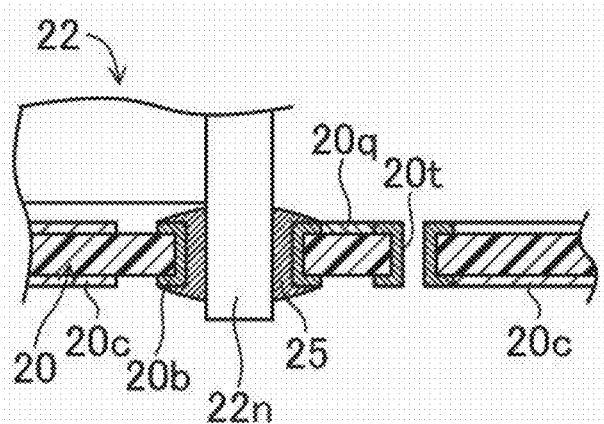
Figure 36C:
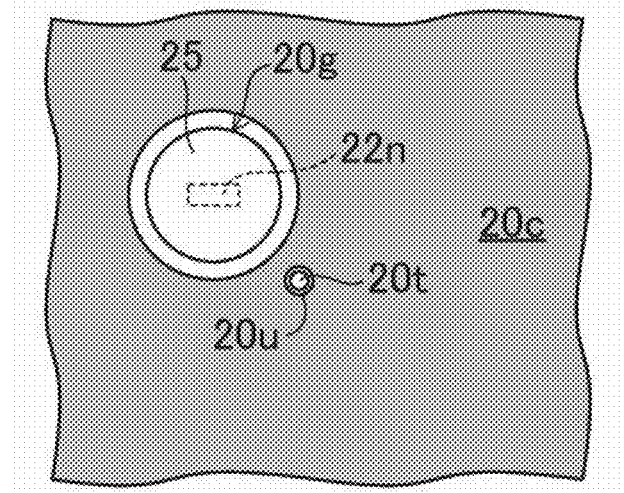

FIGS. 36A to 36C show second modification examples of the extension line L. In the drawings, the line length is adjusted by utilizing a through-hole formed in the main board 20.

More specifically, an extension line L5 is made up of a wiring pattern 20q that extends from the ungrounded land 20g toward a specific area of the main board 20 under the housing 22 as shown in FIG. 36A, a through-hole 20t that is formed at the distal end of this wiring pattern 20q as shown in FIG. 36B, and the grounding pattern 20c that is formed on the lower face of the main board 20 and is connected to the lower end of this through-hole 20t as shown in FIGS. 36B and 36C. Therefore, in this modification example, the line length of the extension line L5 is the total length of the wiring pattern 20q plus the height of the through-hole 20t.

With the above embodiment and the first and second modification examples, since the extension lines L2 to L5 make use of wiring patterns formed on the main board 20, there is no need for other members such as metal wires, and the extension lines L to L5 can be simply configured.

Figure 37:
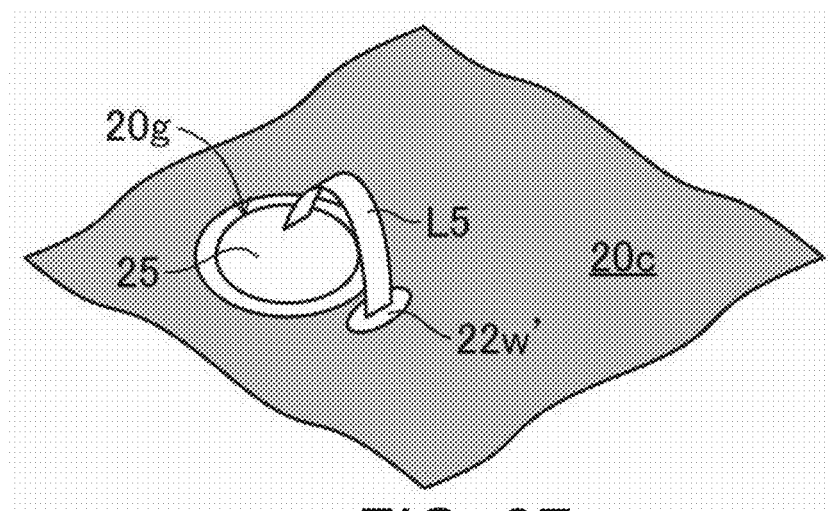
FIG. 37 shows a third modification example of this line, and is an oblique view of when the line is made of metal.

FIG. 37 shows a third modification example of the extension line L. In FIG. 37, a metal wire L5 is used, one end thereof is attached to the land 20g with solder 25, and the other end is connected to the grounding pattern 20c of the main board 20, with this connection point serving as a grounding site 22w'.

Figure 38:
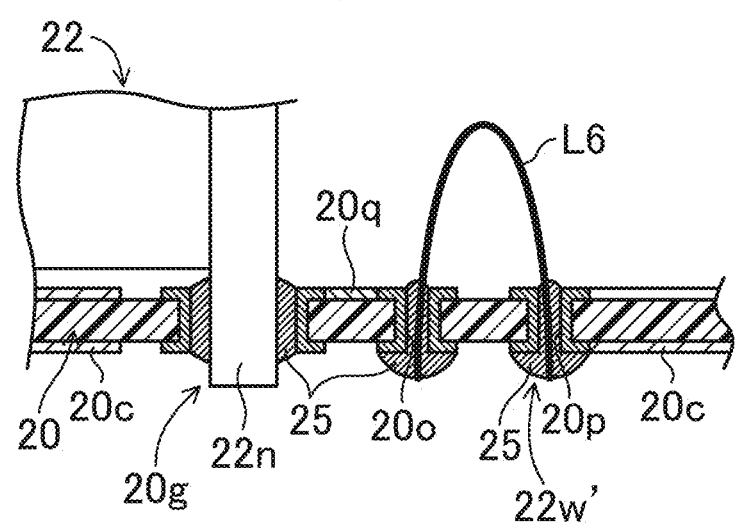
FIG. 38 shows a fourth modification example of this line, and is a cross section of the connected portion between the housing and the main board when the line consists of a wire-shaped conductor and a wiring pattern.

FIG. 38 shows a fourth modification example of the extension line L. In FIG. 38, a metal wire or other such wire-shaped conductor L6 is used as the extension line L. More specifically, the wiring pattern 20q connected to the land 20g located at a corner of the housing 22 is formed on the upper face of the main board 20, a through-hole 20o that is connected to the this wiring pattern 20q and another through-hole 20p disposed to the side of the through-hole 20o are provided, the ends of the wire-shaped conductor L6, which has been bent in an inverted U shape, are inserted into these two through-holes 20o and 20p and attached with solder 25, and the lower end of the through-hole 20p is connected to the grounding pattern 20c formed on the lower face of the main board 20.

Therefore, in this fourth modification example, the distance between the corner of the housing 22 (land 20g) and the grounding site 22w' can be adjusted merely by adjusting the length of the wire-shaped conductor L6 and the wiring pattern 20q.

Figure 39:
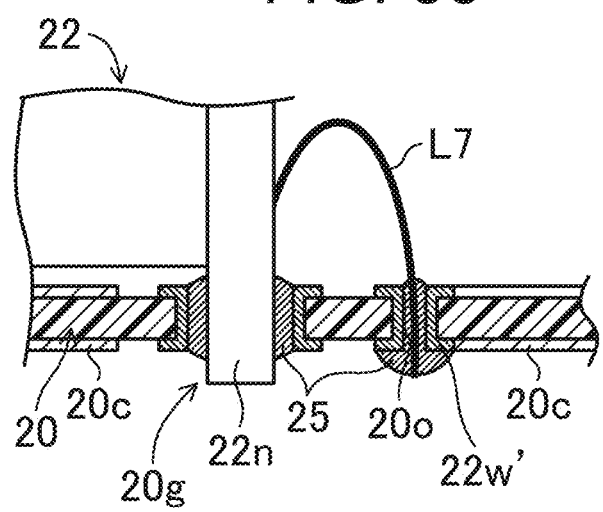
FIG. 39 shows a fifth modification example of this line, and is a cross section of the connected portion between the housing and the main board when the line consists of a conductor in the form of a leaf spring.

FIG. 39 shows a fifth modification example of the extension line L. In FIG. 39, a through-hole 20o is formed to the side of the land 20g located at a corner of the housing 22, one end of a leaf spring-shaped conductor L7 is inserted into this through-hole 20o and the one end of the conductor L7 is attached to the through-hole 20o with solder 25 while the other end contacts with the side face of the housing 22, and the lower end of the through-hole 20o is connected to the grounding pattern 20c formed on the lower face of the main board 20.

Therefore, in this modification example, the distance between the corner of the housing 22 (land 20g) and the grounding site 22w' can be adjusted merely by adjusting the length of the leaf spring-shaped conductor L7.

In all of the modification examples of the extension line L described above, the length of the extension line L can be freely increased or decreased, so the distance from the high impedance point P of the housing 22 to the grounding site 22w can be accurately set to an odd-numbered multiple of ¼ the wavelength λ, regardless of the oscillation frequency range of the oscillation signal of the VCO/PLL circuit 3.

Eighth Embodiment

An eighth embodiment of the present disclosure will now be described through reference to FIG. 40.

As shown in FIGS. 31A and 31B, in the sixth embodiment above the high impedance point P was generated in the housing 22, but with this embodiment, the impedance is lowered at the high impedance point P.

Figure 40:
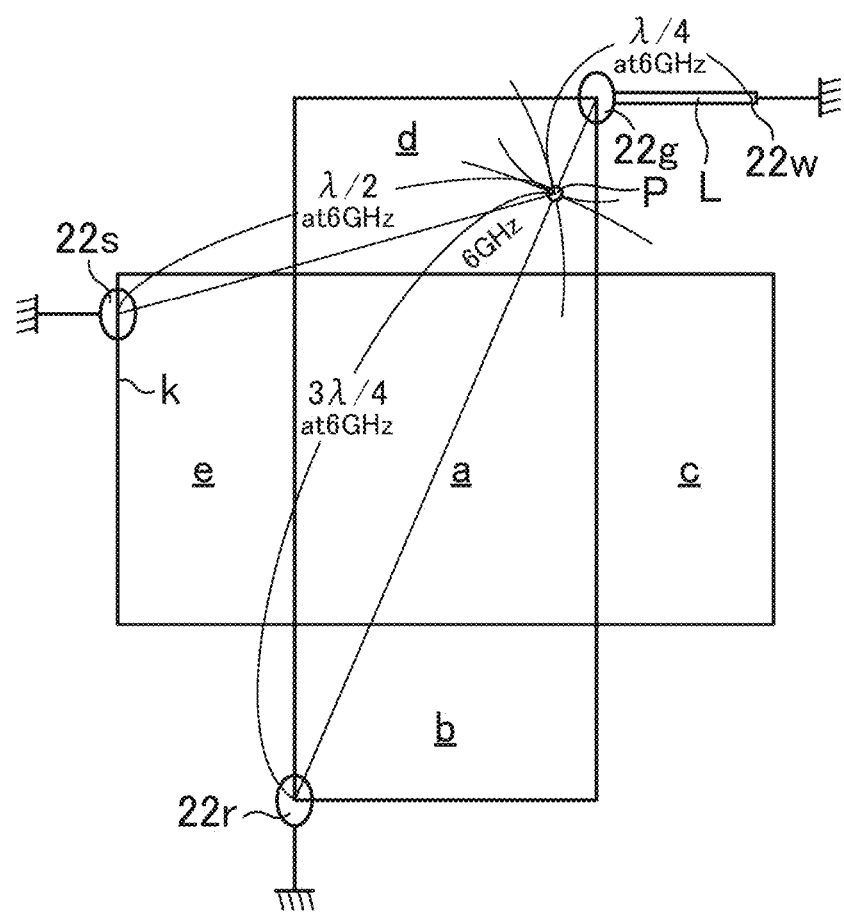
FIG. 40 shows an eighth embodiment of the present disclosure, and shows a configuration in which the impedance is lowered at a high impedance point that occurs in the housing.

In this embodiment, in FIG. 40, in addition to the configuration in FIGS. 31A and 31B above, another grounding site (second site (third site)) 22s is disposed on the bottom edge k of the left face e in a developed view of the housing 22. As discussed above, with the housing 22, in which the oscillation frequency of the oscillator is high and the impedance is a distributed element, the impedance is higher than a predetermined specific impedance in an area that is an odd-numbered multiple of λ/4 away using the grounding site as the reference impedance, but in an area (second area (third area)) that is an even-numbered multiple of ¼ the wavelength λ of the oscillation signal away, the impedance is lower than this specific impedance (specific threshold). Therefore, in FIG. 40, in a developed view of the housing 22, the grounding site 22s is disposed at a position that is a linear distance of ½ times (two times ¼) the wavelength λ of the lowest oscillation frequency (6 GHz) in a developed view of the housing 22 away from the high impedance point P (the point at this oscillation frequency of 6 GHz).

Therefore, in this embodiment, the impedance at the high impedance point P generated in a developed view of the housing 22 can be lowered by the grounding site 22s. As a result, the unnecessary radiation from the high impedance point P produced by the two grounding sites (first specific first site (first site) and second specific first site (second site)) 22r and 22w can be effectively reduced by the above-mentioned other grounding site (second site (third site)) 22s.

Also, just as with the above embodiment, this embodiment is effective when the high impedance range spreads out somewhat.

Specifically, in FIGS. 33B to 33F, at the lowest oscillation frequency at which the spacing between two points of high impedance is at or under ⅒ the wavelength at that frequency, a grounding site is provided at a position that is a linear distance of an even-numbered multiple of ¼ the wavelength λ at that frequency away from the midpoint (point D) of a line connecting two points of high impedance, which allows impedance to be effectively lowered in the high impedance range.

Modification Example

Figure 41:
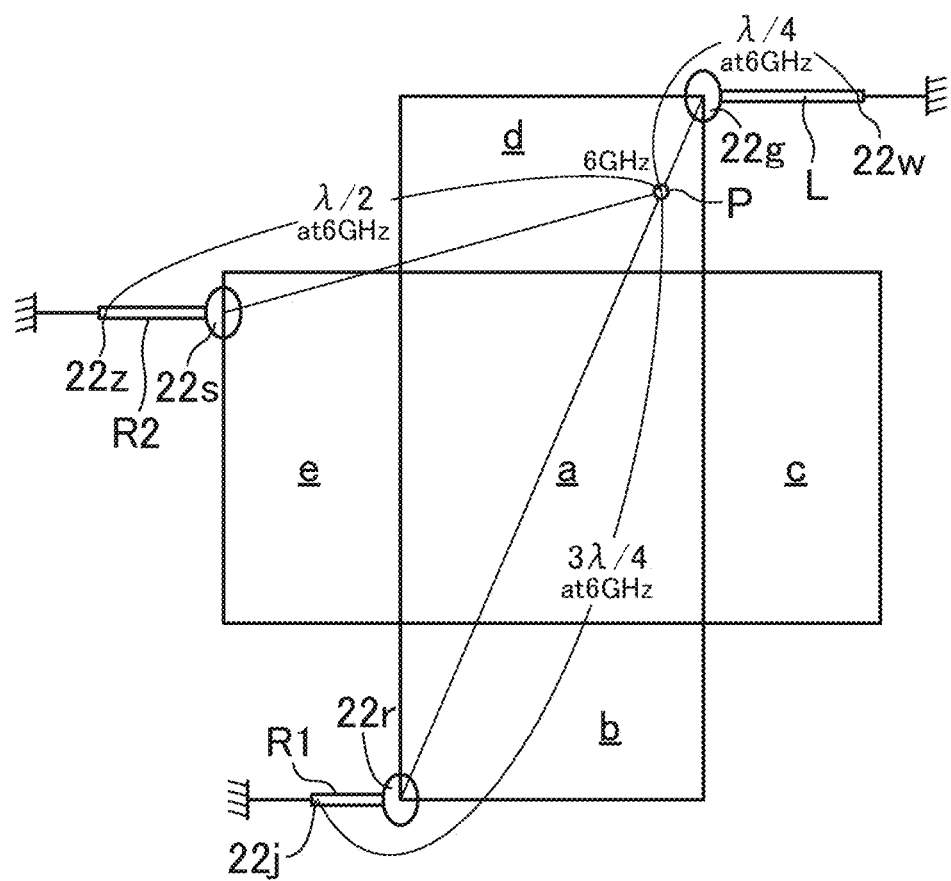
FIG. 41 shows a modification example of this eighth embodiment, and shows an example in which grounding sites of the housing to the main board are all disposed at positions that are away from the housing.

FIG. 41 shows a modification example of this embodiment.

In this eighth embodiment, in addition to using the grounding site 22w to ground a position that is separated from the right corner of the rear face d of the housing 22 by the extension line L, in this modification example, the left corner 22r of the front face b and the land 22s provided to the bottom edge k of the left face e are also grounded by grounding sites 22j and 22z via extension lines R1 and R2, respectively.

In this modification example, even if the lowest frequency of the oscillation signal of the VCO/PLL circuit 3 is lower than 6 GHz, or if the size of the housing 22 is relatively small, etc., since the distances by which the three grounding sites 22j, 22w, and 22z are separated from the housing 22 can be freely adjusted, the impedance can be lowered at the high impedance point P more reliably and easily.

Ninth Embodiment

Figure 42:
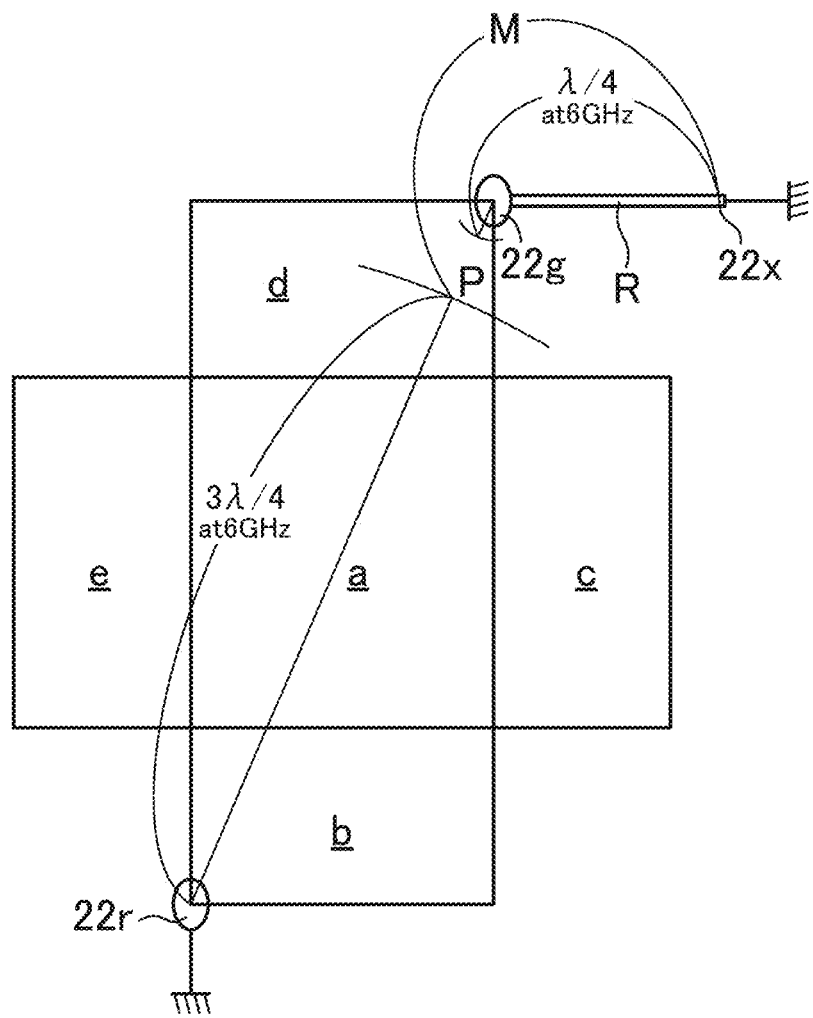
FIG. 42 shows a ninth embodiment of the present disclosure, and shows a configuration in which the high impedance points that occur in the housing are eliminated.

A ninth embodiment of the present disclosure will now be described through reference to FIG. 42.

In the sixth embodiment above, a grounding site was disposed at a position of the housing 22 where only the high impedance point P was generated, but in this embodiment, a grounding site is further disposed at a position where the high impedance range is eliminated.

Specifically, in FIGS. 31A and 31B of the sixth embodiment, a position P at a distance of three times ¼ the wavelength λ at the lowest frequency (6 GHz) of the oscillation signal of the VCO/PLL circuit 3 away from the left corner 22r of the front face b of the housing 22 overlapped a position P at a distance of one times ¼ the wavelength λ at the lowest frequency (6 GHz) away from the grounding site 22w separated by the extension line L from the land 20g of the rear face d, and the impedance was high at this overlapping point P, but in this embodiment, an extension line R is disposed in which the line length of the extension line L is longer than in FIGS. 31A and 31B, and this configuration eliminates the generation of the high impedance point P.

With the above configuration, in this embodiment, the other end of the extension line R with a longer extension line is used as a grounding site 22x, and the distance M from this grounding site 22x to the high impedance point P can be a distance that exceeds one times ¼ the wavelength λ at the lowest frequency (6 GHz), so the generation of the high impedance point P can be eliminated, and no unnecessary radiation will occur anywhere in the housing 22.

Furthermore, when the distance M is an even-numbered multiple of ¼ the wavelength λ (such as ½), the impedance can be directly lowered at the high impedance point P.

Tenth Embodiment

Figure 43:
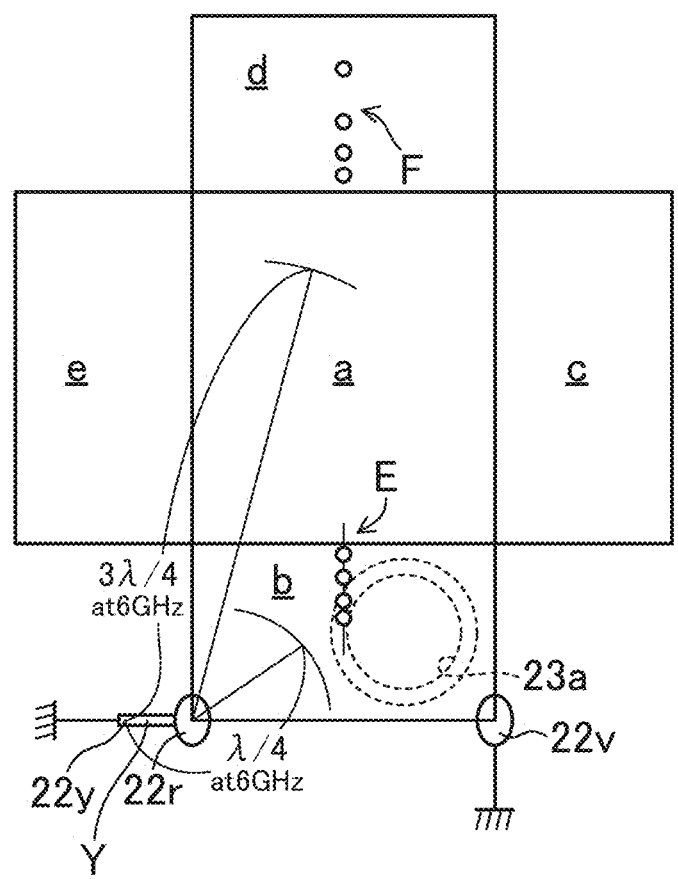
FIG. 43 shows a tenth embodiment of the present disclosure, and shows a configuration that does not result in a high impedance range around a connector.

FIG. 43 shows a tenth embodiment of the present disclosure.

As shown in FIG. 43, in this embodiment, the grounding site 22y is at a position that is separated by an extension line Y from the left corner 22r of the front face b of the housing 22, and the right corner 22v of the front face b is a grounding site.

With the above configuration, in this embodiment overlapping sites can be eliminated at distances of one and three times ¼ the wavelength λ of the oscillation signal of the VCO/PLL circuit 3 away from the grounding sites 22y and 22v.

Therefore, as shown in FIG. 30, the high impedance ranges E and F can be eliminated in the upper middle part of the rear face d or the upper middle part of the front face b of the housing that occur when the corners 22r and 22v are both grounding sites, which makes it possible to eliminate the generation of unnecessary radiation.

Furthermore, in the front face b of the housing 22, a television broadcast signal cable 24 is connected to the F-type connector 23 attached to an attachment hole 23a, and the high impedance range E occurs in the upper middle part of the front face b of the housing in FIG. 30 near this signal cable 24, but in this embodiment, since the generation of the high impedance range E is eliminated, the impedance distribution over the housing is less apt to be affected by variance in the state of the signal cable 24 (type, material, shape, etc.), and the effect is that it is less likely that unnecessary radiation will be caused by variance in the state of the signal cable.

Furthermore, in this embodiment, the high impedance range E that occurs near the F-type connector 23 was eliminated, but the present invention is not limited to this. For instance, even if a high impedance range occurs in the housing 22, the site where the high impedance range is generated should be at least a specific distance away from the F-type connector 23, to the extent that the unnecessary radiation produced from this high impedance range has either no effect or extremely little effect. Furthermore, when the distance from the grounding site 22y to the F-type connector 23 is an even-numbered multiple of ¼ the wavelength λ (such as ½), the impedance can be directly lowered near the F-type connector 23.

In the ninth and tenth embodiments above, only one of two corners was grounded via the extension line R or Y, but all of the grounded corners may, of course, be grounded via an extension line.

Eleventh Embodiment

An eleventh embodiment of the present disclosure will now be described through reference to FIGS. 44A and 44B.

In the sixth embodiment above (FIGS. 31A and 31B), in a developed view of the housing 22, grounding was done at the grounding site 22w via the extension line L from the right corner 22g of the rear face d, but in this embodiment, this grounding site 22w is not grounded, and is instead an open site, and the length of the extension line L is also changed.

Figure 44A:
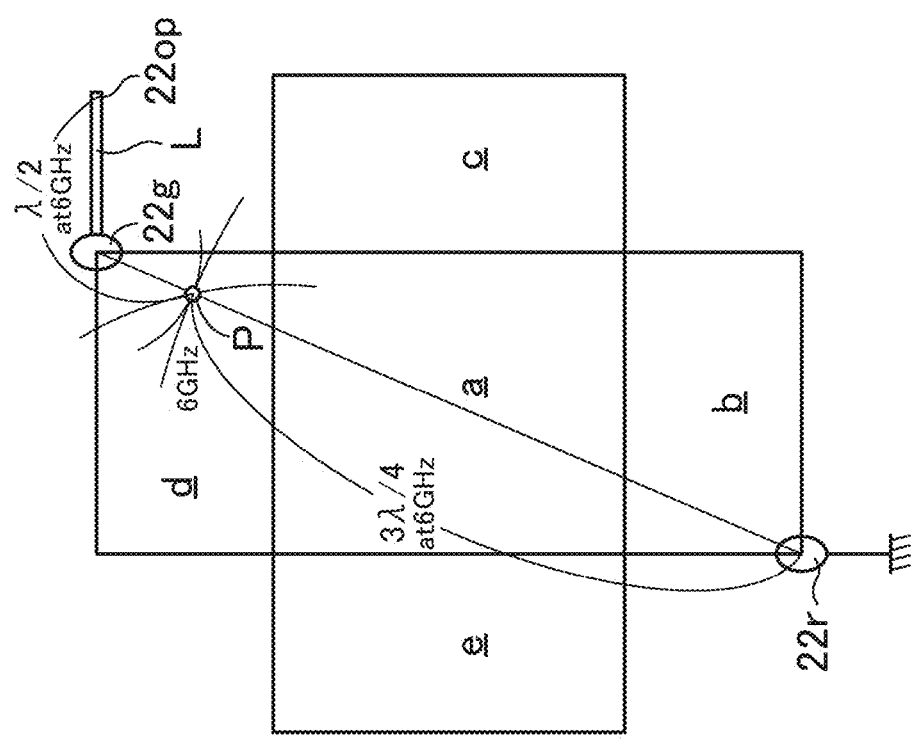
FIGS. 44A and 44B show an eleventh embodiment of the present disclosure, with FIG. 44A being a diagram in which an open site provided to the housing is disposed at a position that is away from the housing, and FIG. 44B showing the configuration around the open site.

More specifically, in this embodiment, in the developed view of the housing 22 in FIG. 44A, one end of the extension line is connected to the right corner 22g of the rear face d, the other end of this extension line L (a position other than a ground component of the housing 22) is opened, and this other end of the extension line L serves as the open site 22op of the housing 22.

In a developed view of the housing 22, the point P is the point nearest the right corner 22g of the rear face d among points of a distance that is three times ¼ the wavelength λ at the lowest frequency (in the drawing, 6 GHz) in the variable frequency range of the oscillation signal of the VCO/PLL circuit 3 from the left corner 22*r* of the front face b (points within the high impedance range B shown in FIG. 28B), and line length of the extension line L is set so that the total distance obtained by adding the distance from this point P to the land 20*g* at the right corner of the rear face d of the housing 22 and the distance from this land 20*g* to the open site 22*op* (that is the line length of the extension line L) will correspond to a value ($\lambda$/2) that is an even-numbered multiple of (two times) ¼ the wavelength $\lambda$ at the lowest frequency (6 GHz) in the variable frequency range of the oscillation signal.

Therefore, in this embodiment, with a housing 22, using the grounding site of the left corner 22*r* of the front face b as a reference impedance, since the point P is the only area that is an odd-numbered multiple (three times) of $\lambda$/4 away from this grounding site in straight line distance in a developed view from this grounding site and at a distance that is an even-numbered multiple (two times) of ¼ the wavelength $\lambda$ at the lowest frequency (6 GHz) of the oscillation signal away from the open site 22*op* of the housing 22 (the other end of the extension line L), the high impedance range generated becomes the narrowest. Thus, in this embodiment, the unnecessary radiation from the housing 22 can be effectively lowered.

If the extension line L is a point-to-point construction, there will be no reduction in wavelength tied to dielectric constant. Therefore, the actual line length of the extension line L may be used in calculating the distance to the high impedance point P.

Figure 44B:
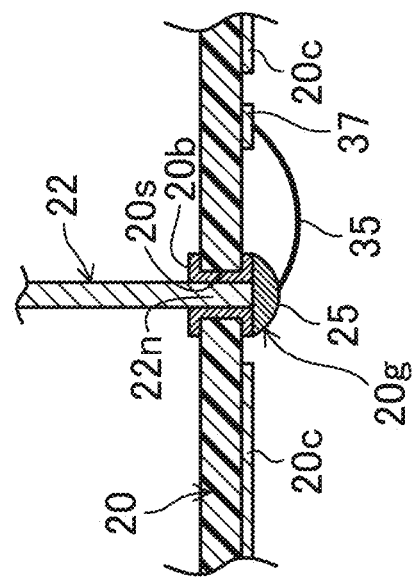

The configuration in which the other end of the extension line L is open can be the configuration shown in FIG. 44B, for example. The configuration in FIG. 44B, as can be seen from a comparison of the configuration in FIG. 31B, is such that the other end of the metal line 35 constituting the extension line L is connected to an ungrounded pattern 37, which is not connected to the grounding pattern 20*c* disposed on the rear face of the main board 20, on the rear face of the main board 20, and the other end of the metal line 35 is open.

A configuration in which the other end of the extension line L is open can also be applied to the already discussed configurations in FIG. 34B, FIGS. 35A to 35C, FIGS. 36A to 36C, and FIGS. 37, 38, and 39. Here again, just as discussed above, an ungrounded pattern may be provided that is not connected to the grounding pattern 20*c* disposed on the rear or front face of the main board 20, and the other end of the extension line L may be connected to this ungrounded pattern. This is not shown in the drawings.

Therefore, in this embodiment, the impedance is actively lowered at the point P that becomes a high impedance range by opening the other end of the extension line L, so the generation of unnecessary radiation can be eliminated even more.

Modification Example

Thus, when the distance from the high impedance point P to the open site 22*op* is an even-numbered multiple of ¼ the wavelength $\lambda$ (such as ½), the high impedance range of the housing 22 can be limited to the point P, but the method discussed in the ninth embodiment can also be applied in this embodiment.

Specifically, when the distance from the high impedance point P to the open site 22*op* is an even-numbered multiple of ¼ the wavelength $\lambda$ (such as ½), the high impedance point P can also be prevented from being generated. Furthermore, when the distance from the high impedance point P to the open site 22*op* is further extended to an odd-numbered multiple of ¼ the wavelength $\lambda$ (such as ¾), the impedance can be directly lowered at the high impedance point P.

Also, in FIGS. 40 and 41 of the eighth embodiment, instead of providing a grounding site at a distance that is an odd-numbered multiple of ¼ the wavelength $\lambda$ (such as ¼) from the high impedance point, the same effect can be obtained by providing an open site at a distance that is an even-numbered multiple of ¼ the wavelength $\lambda$ (such as ½) from the high impedance point. Also, in FIG. 41, the impedance was lowered at the high impedance point P by providing the grounding site 22*z* at a distance that is an even-numbered multiple of ¼ the wavelength $\lambda$ (such as ½) from the high impedance point P via the extension line R2, but the same effect can instead be obtained by providing an open site at a distance that is an odd-numbered multiple of ¼ the wavelength $\lambda$ (such as ¾) from the high impedance point P via an extension line.

In Developed View of the Housing 22

When Connection Between Side Faces is Weak

Figure 45:
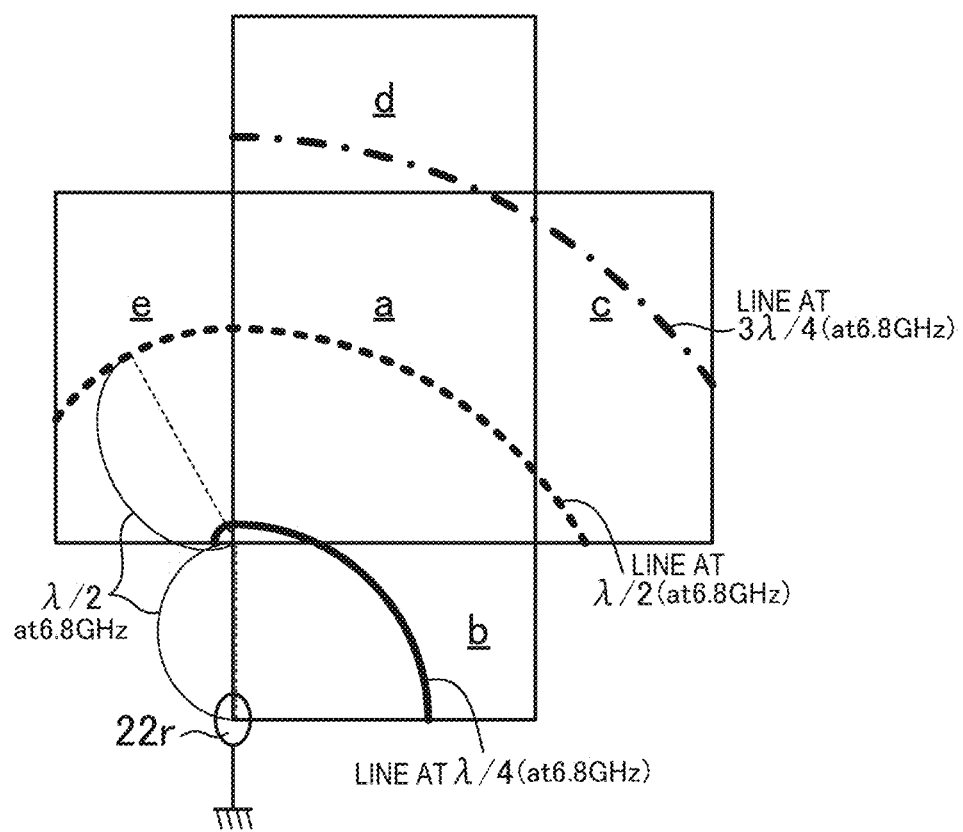
FIG. 45 illustrates the consideration of only signal propagation centered on the top face of the housing when there is a weak electrical connection between the side faces of a housing that houses a tuner IC.

In the developed view of the housing 22 shown in FIG. 7, during assembly, there is no signal propagation between the side faces b-c, c-d, d-e, or e-b because of the weak connection between the adjacent side faces b, c, d, and e. Accordingly, signal propagation need be considered only between the four side faces b, c, d, and e and the top face a, so a developed view of the housing 22 need only be a development centered on the top face a as shown in FIG. 45. Therefore, in the developed view of the housing 22 in FIG. 45, when the left corner 22*r* of the front face b is grounded, the oscillation signal propagates from the left corner 22*r* of the front face b into the front face b, and then propagates through the tangent b-a between the front face b and the top face a to the top face a. The line connecting points that are at the propagation distance $\lambda$/4 in signal propagation from the top face a to the side faces c, d, and e other than the front face b is depicted as a solid line, the line connecting the points at the propagation distance $\lambda$/2 is depicted as a broken line, and the line connecting the points at the propagation distance 3$\lambda$/4 is depicted as a one-dot chain line.

When Connection Between Side Faces is Strong

On the other hand, as shown in FIG. 46A, when parts that touch adjacent side faces (connected portions) are joined securely by soldering, for example, so that there is a strong connection between the adjacent side faces, then signal propagation between the side faces b-c, c-d, d-e, and e-b also needs to be taken into account, in addition to signal propagation between the side faces b, c, d, and e and the top face a. Accordingly, not only signal propagation in a developed view centered on the top face a as in FIG. 45, but also signal propagation between side faces when other side faces are developed around the side faces b, c, d, and e also must be accounted for.

For instance, in FIG. 46B are added the left face (e' face) developed from the rear face d, and the front face (b' face) developed from the right face c. Also, the grounding site at the left face e corresponding to the grounding site 22*r* in the left corner of the front face b is labeled 22*r*', while the corresponding grounding sites for the two newly developed side faces b' and e' are labeled 22*r*'' and 22*r*'''.

In FIG. 46B, just as in FIG. 45, in addition to the line connecting points at a propagation distance of $\lambda$/4, the line connecting points at a propagation distance of $\lambda$/2, and the line connecting points at a propagation distance of 3$\lambda$/4 in a propagation path of left corner 22*r*→within front face b→b-a tangent→within top face a→side faces c, d, and e, the line connecting points at a propagation distance of λ/4, the line connecting points at a propagation distance of λ/2, and the line connecting points at a propagation distance of 3λ/4 are each shown in the propagation path of left corner 22r'→within left face e→e-a tangent→within top face a→side faces b, c, and d, the propagation path of left corner 22r"→within newly developed side face b'→b'-c tangent→within left face c→c-a tangent→within top face a, side faces d and e, and the propagation path of left corner 22r'"→within newly developed side face e'→e'-d tangent→within rear face d→d-a tangent→within top face a→side faces b and c. Furthermore, at portions where these lines overlap, the connecting lines selected so that the shortest distances from the left corners 22r, 22r', 22r", and 22r'" will be λ/4, λ/2, and 3λ/4 are respectively shown as solid lines, broken lines, and one-dot chain lines. These lines ultimately show propagation distances of λ/4, λ/2, and 3λ/4 from the left corner 22r.

Thus, when the connections between the side faces of the housing 22 are strong, the developed view has to be supplemented by taking into account all of the paths of strong electrical connections.

Other Embodiments

In the above description, the oscillation frequency range of the oscillation signal of the VCO/PLL circuit 3 was between 6 and 8 GHz, which is used for television broadcast reception, but the present invention is not limited to this, and another frequency range may be used instead.

Also, the circuit configuration of the tuner IC 10 was given as a specific example in FIG. 1, but this configuration may of course be modified, or another configuration may be added.

Furthermore, in the above description, a tuner device for television broadcast reception was used as an example of this tuner device, but the present invention can of course be similarly applied to a tuner device for recording and reproduction, etc.

As described above, the present disclosure is useful when applied to a tuner device such as one used for receiving television broadcasts or for recording and reproduction, because even if a range of high impedance is generated in a housing due to grounding when a housing that covers an oscillator disposed on a substrate is grounded to the substrate, since another grounding site or an open site that lowers the impedance in this high impedance range is disposed on the housing, unnecessary radiation from the housing can be effectively reduced.

As described above, with the present disclosure, when a housing that covers an oscillator disposed on a substrate is grounded by being connected to the substrate, the grounding site of the housing to the substrate is used as a reference impedance, and the grounding site is disposed at a position where the overlapping range of the portion of the housing of higher impedance than a specific impedance is narrowed or eliminated, so unnecessary radiation from the housing can be effectively reduced, which makes this invention useful for application to a tuner device used for television broadcast reception, recording and reproduction, etc.

With the present disclosure, a display device can be provided in which an oscillator is disposed on a substrate, and with which less unnecessary radiation is emitted from the conductive housing connected to the ground component of a substrate. Specifically, with the display device in accordance with the present disclosure, the housing 22 is connected to the first sites 22r and 22s of the ground component of the substrate, and to the second site 22w that is different from the first sites 22r and 22s. The first sites 22r and 22s and the second site 22W are such that the first area B of the housing 22 at which the impedance is higher than the first threshold due to the first site 22r and 22s is disposed at a position overlapping at least part of the second area of the housing 22 at which the impedance is lower than the second threshold due to the second site. Therefore, the first area B of the housing at which the impedance is higher is smaller, so the unnecessary radiation emitted from the housing is reduced.

Also, with the present disclosure, a display device can be provided in which an oscillator is disposed on a substrate, and with which unnecessary radiation that is generated from a conductive housing connected to the ground component of the substrate is reduced. Specifically, the housing is connected to the first specific first site (first site) and the second specific first site (second site) of the ground component. The first specific first site (first site) and the second specific first site (second site) are disposed at positions where the distance between two overlapping points in the first specific first area (first area) of the housing in which the impedance is higher than the first threshold due to the first specific first site (first site) and the second specific first area (second area) of the housing in which the impedance is higher than the first threshold due to the second specific first site (second site), is at or under the specific threshold (such as ⅒ the wavelength corresponding to the oscillation frequency of the oscillation signal of the oscillator).

[1] In view of the state of the known technology and in accordance with an aspect of the present invention, the display device of the present disclosure includes a signal processor, a display component, a substrate, and a conductive housing. The signal processor includes an oscillator that is configured to output oscillation signal. The signal processor is configured to process signal whose frequency is higher than a specific threshold. The display component is configured to display video. The substrate has a ground component. The signal processor is disposed on the substrate. The conductive housing is connected to a first site of the ground component and to a second site that is different from the first site. The first site and the second site are disposed at positions where a first area of the housing in which an impedance is higher than a first threshold due to the first site overlap at least part of a second area of the housing in which an impedance is lower than a second threshold due to the second site.

In view of the state of the known technology and in accordance with another aspect of the present invention, the display device of the present disclosure includes a signal processor, a display component, a substrate, and a conductive housing. The signal processor includes an oscillator that is configured to output oscillation signal. The signal processor is configured to process signal whose frequency is higher than a specific threshold. The display component is configured to display video. The substrate has a ground component and a first conductor. The signal processor is disposed on the substrate. The conductive housing is connected to a first site of the ground component and to a second site of the first conductor. The first site and the second site are disposed at positions where a first area of the housing in which an impedance is higher than a first threshold due to the first site overlap at least part of a second area of the housing in which an impedance is lower than a second threshold due to the second site.

With these display devices mentioned above, when the housing is connected to the first site of a ground component disposed at a corner of the housing, for example, all or part of the first area of the housing at which the impedance is higher due to the first site overlaps the second area of the housing at which the impedance is lower due to the second site, so there is less unnecessary radiation in the first area of the housing where the impedance is higher. Therefore, even if the length, width, or other dimensions of the housing exceed half the wavelength λ of the highest oscillation frequency of the oscillator (λ/2), all or part of the first area of the housing where the impedance is higher can be lowered in impedance by the second site, and unnecessary radiation can be effectively reduced.

Furthermore, there is no need to dispose numerous grounding sites evenly on the side of the interior of the housing as in the past, and the housing can be manufactured with a simple configuration and inexpensively.

[2] In accordance with a preferred embodiment according to any one of the display devices mentioned above, the first area is an area in the housing that is an odd-numbered multiple of ¼ wavelength of the oscillation signal away from the first site.

With this display device, the impedance is higher in the first area that is an odd-numbered multiple of ¼ the wavelength of the oscillation signal away from the first site, but since the second area of lower impedance overlaps within this range, the first area can be reduced in size, and unnecessary radiation can be effectively reduced.

[3] In accordance with a preferred embodiment according to any one of the display devices mentioned above, the second site is located at the ground component. The second area is a position in the housing that is an even-numbered multiple of ¼ the wavelength of the oscillation signal away from the second site.

With this display device, since the second area connected to the ground component is at a position in the housing that is an even-numbered multiple of ¼ the wavelength of the oscillation signal away from the second site, the impedance can be effectively lowered in this second area. Therefore, the first area where the impedance is higher can be effectively reduced in size, and unnecessary radiation can be effectively reduced.

[4] In accordance with a preferred embodiment according to any one of the display devices mentioned above, the second site is located outside the ground component, and the second area is in a position in the housing that is an odd-numbered multiple of ¼ wavelength of the oscillation signal away from the second site.

In accordance with a preferred embodiment according to any one of the display devices mentioned above, the second area is in a position in the housing that is an odd-numbered multiple of ¼ wavelength of the oscillation signal away from the second site.

With this display device, since the second area of the housing that is connected to the first conductor is in a position of the housing that is an odd-numbered multiple of ¼ the wavelength of the oscillation signal away from the second site, the impedance of this second area can be effectively reduced. Therefore, the first area of the housing where the impedance is higher can be effectively reduced in size, and unnecessary radiation can be effectively reduced.

[5] In accordance with a preferred embodiment according to any one of the display devices mentioned above, the housing is connected to a third site that is different form the first site of the ground component and the second site. The housing has a third area in which an impedance is higher than the first threshold due to the third site. The first area and the third area overlap at two points, and a distance X between the two points satisfies the following condition:

$0 < X \leq \lambda/10$, where λ represents a wavelength of the oscillation signal. The two points are located within a circle with a radius of λ/20, centered at a point in the second area of the housing With this display device, since the distance X between the two points where the first area and the third area overlap satisfies the condition of $0 < X \leq \lambda/10$, as long as all or part of the area between these two points is used as a second area where the impedance is lower, then the first area and the third area will both have lower impedance due to a single second site.

[6] In accordance with a preferred embodiment according to any one of the display devices mentioned above, the housing has a rectangular upper part and side parts that extend from edges of the upper part and are perpendicular to the upper part. The first site is disposed on a side part extending from a short edge of the upper part. The second site is disposed on a side part extending from a long edge of the upper part.

[7] In accordance with a preferred embodiment according to any one of the display devices mentioned above, the first area and the second area each include a plurality of areas.

[8] In accordance with a preferred embodiment according to any one of the display devices mentioned above, the first site and the second site each include a plurality of sites. The number of sites of the second site is equal to or less than the number of sites of the first sites.

[9] In accordance with a preferred embodiment according to any one of the display devices mentioned above, the first site includes at least two sites. The second site includes one second area overlapping at least two first areas.

With these display devices (according to items [8] and [9]), since the number of sites of the second site is limited to the same as or less than the number of sites of the first site, there is no need to evenly dispose numerous conductor posts that connect the housing and the ground of the substrate as in the past, and the housing can be manufactured with a simple configuration and inexpensively.

[10] In accordance with a preferred embodiment according to any one of the display devices mentioned above, the second site is disposed at a specific position on the substrate that is separated from the housing by an extension line connected to the housing.

With this display device, since the second site can be disposed at some position that is separated from the housing by an extension line extending from the housing, this affords greater latitude in the position of the second site that lowers the impedance of the high impedance range produced by the first site.

[11] In accordance with a preferred embodiment according to any one of the display devices mentioned above, the housing is disposed in a specific area of the substrate. The second site is disposed in the specific area.

[12] In accordance with a preferred embodiment according to any one of the display devices mentioned above, the extension line is a wire disposed on the substrate.

With these display devices (according to items [11] and [12]), since the extension line is disposed in a specific area of the substrate located below the housing, even if other constituent parts of the tuner device, such as a digital processing circuit or an audio circuit, is disposed near and to the side of the housing on the substrate, these devices will not get in the way, and the high impedance range can be easily lowered.

[13] In accordance with a preferred embodiment according to any one of the display devices mentioned above, the first area or the second area includes an area according to a range of variation of a wavelength of the oscillation signal.

With this display device, even if the first area of higher impedance changes according to a wavelength change accompanying a change in the frequency of the oscillation signal of the oscillator, the second area where the impedance is low will also change, including the range of change thereof, so no matter at what oscillation frequency the oscillator oscillates, unnecessary radiation will always be effectively reduced everywhere on the housing.

[14] In accordance with a preferred embodiment according to any one of the display devices mentioned above, the display device further includes a connector to which a signal cable is connected and that is provided to the housing. The first area is located near the connector.

With this display device, with a housing in which a television broadcast signal cable is connected to the connector, for example, even if the range near the connector is a first area of high impedance due to the first site, since the second site will lower the impedance of all or part of the first area in the second area, the impedance distribution over the housing will tend not to be affected by variance in the state (type, material, shape, etc.) of the signal cable, and it will be less likely that unnecessary radiation is produced by variance in the state of the signal cable.

In accordance with a preferred embodiment according to any one of the display devices mentioned above, the range of the oscillation frequency of the oscillation signal is at least 2 GHz.

With this display device, unnecessary radiation can be effectively reduced in a display device comprising a tuner device used for television broadcast reception.

In accordance with a preferred embodiment according to any one of the display devices mentioned above, the signal processor is a wireless communication component that sends and receives information signals or a tuner that receives broadcast signals.

[15] In accordance with a preferred embodiment according to any one of the display devices mentioned above, the first site includes a first specific first site and a second specific first site. The first area includes a first specific first area in which an impedance is higher than the first threshold due to the first specific first site and a second specific first area in which an impedance is higher than the first threshold due to the second specific first site. The first specific first area and the second specific first area overlap at two overlapping points. The first specific first site and the second specific first site are disposed at positions where a distance between the two overlapping points of the first specific first area and the second specific first area is at or under a specific threshold.

In accordance with a preferred embodiment according to any one of the display devices mentioned above, the second site is located at the ground component. The second area is located in an area of the housing that is an odd-numbered multiple of ¼ wavelength of the oscillation signal away from the second site.

In accordance with a preferred embodiment according to any one of the display devices mentioned above, the second site is located outside the ground component. The second area is located in an area of the housing that is an even-numbered multiple of ¼ wavelength of the oscillation signal away from the second site.

As described above, with the display device of the present disclosure, even if a range of high impedance occurs in a housing due to the grounding site, since a second site that forcibly changes this range to a lower impedance is disposed on the substrate, unnecessary radiation that is produced from the housing can be effectively reduced, and the number of grounding sites to the ground potential part of the substrate can be limited to a far smaller number than in the past, making it possible to manufacture the housing easily and inexpensively.

Also, to achieve the stated object, with the present disclosure, since unnecessary radiation is inevitably generated at parts of the housing where the impedance is high (using a grounding site of the housing as a reference impedance), so unnecessary radiation is reduced by a configuration in which these parts of the housing where the impedance is high are eliminated as much as possible.

[16] In view of the state of the known technology and in accordance with another aspect of the present invention, the display device of the present disclosure includes a signal processor, a display component, a substrate, and a conductive housing. The signal processor includes an oscillator that is configured to output oscillation signal. The signal processor is configured to process signal whose frequency is higher than a specific threshold. The display component is configured to display video. The substrate has a ground component. The signal processor is disposed on the substrate. The conductive housing is connected to a first site of the ground component and to a second site that is different from the first site. The first site and the second site are disposed at positions where a distance between two overlapping points in a first area of the housing in which an impedance is higher than a first threshold due to the first site and a second area of the housing in which an impedance is higher than the first threshold due to the second site, is at or under a specific threshold.

With this display device, since the first site and second site that are provided to the housing for making a ground connection are disposed at positions where the distance between two overlapping points in a first area and a second area in which the impedance is higher due to these two grounding sites, is at or under a specific threshold, the range of the first area and second area of high impedance can be kept overall within a narrow range of the housing area. Therefore, when the impedance is lowered in this narrow range of high impedance area, the impedance may be lowered in only this narrow range of area, which makes design easier.

[17] In accordance with a preferred embodiment according to the display device mentioned above, the first area is located in an area of the housing that is an odd-numbered multiple of ¼ wavelength of the oscillation signal away from the first site.

[18] In accordance with a preferred embodiment according to any one of the display devices mentioned above, the second site is located at the ground component. The second area is located in an area of the housing that is an odd-numbered multiple of ¼ wavelength of the oscillation signal away from the second site.

[19] In accordance with a preferred embodiment according to any one of the display devices mentioned above, the second site is located outside the ground component. The second area is located in an area of the housing that is an even-numbered multiple of ¼ wavelength of the oscillation signal away from the second site.

With these display devices (according to items [17] to [19]), the first area and the second area are areas of higher impedance than other areas of the housing, but it is possible to limit these areas.

[20] In accordance with a preferred embodiment according to any one of the display devices mentioned above, the specific threshold is λ/10 where λ represents the wavelength of the oscillation signal.

With this display device, since the first site and the second site of the housing are disposed so that the distance between two overlapping points in the first area and the second area will be no more than λ/10 of the wavelength λ of the oscillation signal, it is possible to effectively limit all or part of the first area and second area.

In accordance with a preferred embodiment according to any one of the display devices mentioned above, the wavelength of the oscillation signal is the wavelength with the lowest frequency in the frequency variable range of the oscillator.

With this display device, even with the two high impedance areas located the farthest away from the first site and the second site, since the distance between two overlapping points in these two high impedance areas is at or under a specific threshold, these high impedance areas can be reliably limited.

In accordance with a preferred embodiment according to any one of the display devices mentioned above, the display device further includes an extension line that connects the housing and the first site. The first site is disposed at a position that is some distance from the housing.

In accordance with a preferred embodiment according to any one of the display devices mentioned above, the display device further includes an extension line that connects the housing and the second site. The second site is disposed at a position that is some distance from the housing.

With these display devices, since the first site and the second site are disposed at positions that are some distance from the housing, the distance between two overlapping points in the first area and the second area of the housing in which the impedance is high due to these first and second sites can be easily kept at or under a specific threshold.

In accordance with a preferred embodiment according to any one of the display devices mentioned above, the housing is disposed in a specific area of the substrate, and the second site is disposed in a specific area of the substrate.

With this display device, even when the second site is disposed at a position that is away from the housing, since the second site is disposed in a specific area of the substrate where the housing is disposed, even when other constituent parts of a tuner device, such as a digital processing circuit or an audio circuit, are disposed near and to the side of the housing on the substrate, these constituent parts will not get in the way, and the grounding site can be disposed at a position that is away from the housing.

In accordance with a preferred embodiment according to any one of the display devices mentioned above, the display device further includes a connector that is provided to the housing and is connected to a signal cable. The first area and the second area are located at sites that are at least a specific distance away from the connector.

With this display device, even if a television broadcast signal cable is connected to the connector, for example, since a first area and a second area of high impedance are located away from the connector, the impedance distribution over the housing will be less likely to be affected by variance in the state (type, material, shape, etc.) of the signal cable, and the occurrence of unnecessary radiation due to variance in the state of the signal cable can be suppressed.

In accordance with a preferred embodiment according to any one of the display devices mentioned above, the substrate has a third site. The third site is disposed so that a third area of the housing in which the impedance is lower than a specific threshold due to said third site overlaps the first area and/or the second area.

With this display device, since a third site is disposed on the substrate so that a third area of low impedance will overlap the first area and/or the second area of high impedance in the housing, unnecessary radiation from the first area or the second area can be effectively reduced.

In accordance with a preferred embodiment according to any one of the display devices mentioned above, the third site is connected to the ground component. The third area is located in an area of the housing that is an even-numbered multiple of ¼ the wavelength of the oscillation signal away from the third site.

With this display device, since the third site is connected to the ground component and the third area is located in an area that is an even-numbered multiple of ¼ the wavelength of the oscillation signal away from the third site, the first area or the second area in which the impedance is high can be reliably reduced to a low impedance by the third site, and the generation of unnecessary radiation from the first area or the second area can be effectively reduced.

In accordance with a preferred embodiment according to any one of the display devices mentioned above, the third site is not connected to the ground component. The third area is located in an area of the housing that is an odd-numbered multiple of ¼ the wavelength of the oscillation signal away from the third site.

With this display device, since the third site is not connected to the ground component and the third area is located in an area that is an odd-numbered multiple of ¼ the wavelength of the oscillation signal away from the third site, the first area or the second area in which the impedance is high can be reliably reduced to a low impedance by the third site, and the generation of unnecessary radiation from the first area or the second area can be effectively reduced.

In accordance with a preferred embodiment according to any one of the display devices mentioned above, the display device further includes an extension line that connects the housing and the third site. The third site is disposed at a position that is some distance from the housing.

With this display device, since the third site is disposed at a position that is some distance from the housing, this third site can reliably lower the impedance in the first area or the second area in which the impedance is high in the housing.

In accordance with a preferred embodiment according to any one of the display devices mentioned above, the housing is disposed in a specific area of the substrate. The third site is disposed in a specific area of the substrate.

With this display device, even though the third site is located at a position that is away from the housing, since the third site is disposed in a specific area of the substrate in which the housing is disposed, even when other constituent parts of a tuner device, such as a digital processing circuit or an audio circuit, are disposed near and to the side of the housing on the substrate, these constituent parts will not get in the way, and the grounding site can be disposed at a position that is away from the housing.

In accordance with a preferred embodiment according to any one of the display devices mentioned above, the range of the oscillation frequency of the oscillation signal is at least 2 GHz.

With this display device, unnecessary radiation can be effectively reduced in a tuner device used to receipt television broadcasts, including the VCO frequency range used for television broadcast reception.

In accordance with a preferred embodiment according to any one of the display devices mentioned above, the signal processor is a wireless communication component that sends and receives information signals, or a tuner that receives broadcast signals. As described above, with the tuner device of the present disclosure, the distance between two overlapping points in two areas of high impedance on a conductor path over which oscillation signals propagate through a housing is limited to be at or under a specific threshold, so the range in which unnecessary radiation occurs in the housing can be narrowed or eliminated, and unnecessary radiation can be effectively reduced.

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts unless otherwise stated.

The term "attached" or "attaching", as used herein, encompasses configurations in which an element is directly secured to another element by affixing the element directly to the other element; configurations in which the element is indirectly secured to the other element by affixing the element to the intermediate member(s) which in turn are affixed to the other element; and configurations in which one element is integral with another element, i.e. one element is essentially part of the other element. This definition also applies to words of similar meaning, for example, "joined", "connected", "coupled", "mounted", "bonded", "fixed" and their derivatives. Finally, terms of degree such as "substantially", "about" and "approximately" as used herein mean an amount of deviation of the modified term such that the end result is not significantly changed.

While only selected embodiments have been chosen to illustrate the present invention, it will be apparent to those skilled in the art from this disclosure that various changes and modifications can be made herein without departing from the scope of the invention as defined in the appended claims. For example, unless specifically stated otherwise, the size, shape, location or orientation of the various components can be changed as needed and/or desired so long as the changes do not substantially affect their intended function. Unless specifically stated otherwise, components that are shown directly connected or contacting each other can have intermediate structures disposed between them so long as the changes do not substantially affect their intended function. The functions of one element can be performed by two, and vice versa unless specifically stated otherwise. The structures and functions of one embodiment can be adopted in another embodiment. It is not necessary for all advantages to be present in a particular embodiment at the same time. Every feature which is unique from the prior art, alone or in combination with other features, also should be considered a separate description of further inventions by the applicant, including the structural and/or functional concepts embodied by such feature(s). Thus, the foregoing descriptions of the embodiments according to the present invention are provided for illustration only, and not for the purpose of limiting the invention as defined by the appended claims and their equivalents.

What is claimed is:

1. A display device comprising:
   a signal processor including an oscillator that outputs oscillation signal, the signal processor processing signal whose frequency is higher than a specific threshold;
   a display component that displays video;
   a substrate having a ground component, the signal processor being disposed on the substrate; and
   a conductive housing connected to a first site of the ground component and to a second site that is different from the first site,
   the first site and the second site being disposed at positions where a first area of the housing that is an odd-numbered multiple of ¼ wavelength of the oscillation signal away from the first site overlaps at least part of a second area of the housing that is a multiple of ¼ wavelength of the oscillation signal away from the second site.

2. The display device according to claim 1, wherein
   the second site is located at the ground component, and
   the second area is in a position in the housing that is an even-numbered multiple of ¼ wavelength of the oscillation signal away from the second site.

3. The display device according to claim 1, wherein
   the second site is located outside the ground component, and
   the second area is in a position in the housing that is an odd-numbered multiple of ¼ wavelength of the oscillation signal away from the second site.

4. The display device according to claim 1, wherein
   the housing is connected to a third site that is different form the first site of the ground component and the second site,
   the housing has a third area that overlaps with the first area at two points, with a distance X between the two points satisfying the following condition:

$0 < X \leq \lambda/10$ where $\lambda$ represents a wavelength of the oscillation signal, and
   the two points are located within a circle with a radius of $\lambda/20$, centered at a point in the second area of the housing.

5. The display device according to claim 1, wherein
   the housing has a rectangular upper part and side parts that extend from edges of the upper part and are perpendicular to the upper part,
   the first site is disposed on a side part extending from a short edge of the upper part, and
   the second site is disposed on a side part extending from a long edge of the upper part.

6. The display device according to claim 1, wherein
   the first area and the second area each include a plurality of areas.

7. The display device according to claim 1, wherein
   the first site and the second site each include a plurality of sites, and
   the number of sites of the second site is equal to or less than the number of sites of the first sites.

8. The display device according to claim 1, wherein
   the second site is disposed at a specific position on the substrate that is separated from the housing by an extension line connected to the housing.

9. The display device according to claim 8, wherein
   the housing is disposed in a specific area of the substrate, and
   the second site is disposed in the specific area.

10. The display device according to claim 9, wherein the extension line is a wire disposed on the substrate.

11. The display device according to claim 1, wherein the first area or the second area includes an area according to a range of variation of a wavelength of the oscillation signal.

12. The display device according to claim 1, further comprising
a connector to which a signal cable is connected and that is provided to the housing,
the first area being located near the connector.

13. The display device according to claim 1, wherein
the first site includes a first specific first site and a second specific first site,
the first area includes a first specific first area and a second specific first area that overlap at two overlapping points, and
the first specific first site and the second specific first site are disposed at positions where a distance between the two overlapping points of the first specific first area and the second specific first area is at or under a specific threshold.

14. The display device according to claim 1, wherein the oscillation signal has an oscillation frequency of 6 to 8 GHz.

15. A display device comprising:
a signal processor including an oscillator that outputs oscillation signal, the signal processor processing signal whose frequency is higher than a specific threshold;
a display component that displays video;
a substrate having a ground component, the signal processor being disposed on the substrate; and
a conductive housing connected to a first site of the ground component and to a second site that is different from the first site,
the first site and the second site being disposed at positions where a distance between two overlapping points in a first area of the housing that is an odd-numbered multiple of ¼ wavelength of the oscillation signal away from the first site and a second area of the housing that is a multiple of ¼ the wavelength of the oscillation signal away from the second site, is at or under a specific threshold.

16. The display device according to claim 15, wherein
the second site is located at the ground component, and
the second area is located in an area of the housing that is an odd-numbered multiple of ¼ the wavelength of the oscillation signal away from the second site.

17. The display device according to claim 15, wherein
the second site is located outside the ground component, and
the second area is located in an area of the housing that is an even-numbered multiple of ¼ the wavelength of the oscillation signal away from the second site.

18. The display device according to claim 15, wherein the specific threshold is $\lambda/10$ where $\lambda$ represents the wavelength of the oscillation signal.

19. The display device according to claim 15, wherein the oscillation signal has an oscillation frequency of 6 to 8 GHz.

* * * * *